(12) United States Patent
Sun et al.

(10) Patent No.: US 12,190,804 B2
(45) Date of Patent: Jan. 7, 2025

(54) DISPLAY SUBSTRATE AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Kaipeng Sun, Beijing (CN); Binyan Wang, Beijing (CN); Feng Wei, Beijing (CN); Meng Li, Beijing (CN); Tianyi Cheng, Beijing (CN); Lina Wang, Beijing (CN); Cong Liu, Beijing (CN); Shiqian Dai, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/789,935

(22) PCT Filed: Jun. 10, 2021

(86) PCT No.: PCT/CN2021/099283
§ 371 (c)(1),
(2) Date: Jun. 29, 2022

(87) PCT Pub. No.: WO2022/257057
PCT Pub. Date: Dec. 15, 2022

(65) Prior Publication Data
US 2024/0135873 A1    Apr. 25, 2024
US 2024/0233634 A9    Jul. 11, 2024

(51) Int. Cl.
*G09G 3/3233*    (2016.01)
*G09G 3/32*    (2016.01)

(52) U.S. Cl.
CPC ............. *G09G 3/3233* (2013.01); *G09G 3/32* (2013.01); *G09G 2300/0842* (2013.01); *G09G 2310/061* (2013.01); *G09G 2330/021* (2013.01)

(58) Field of Classification Search
CPC .................. G09G 3/3233; G09G 3/32; G09G 2300/0842; G09G 2310/061; G09G 2330/021
See application file for complete search history.

(56) References Cited

U.S. PATENT DOCUMENTS

2019/0326381 A1    10/2019   Hou
2021/0384289 A1*   12/2021   Li ........................ H10K 59/121
(Continued)

FOREIGN PATENT DOCUMENTS

CN    106707646 A    5/2017
CN    110531559 A    12/2019
(Continued)

OTHER PUBLICATIONS

International Search Report in PCT/CN2021/099283 dated Mar. 10, 2022 with English translation.
(Continued)

*Primary Examiner* — Lixi C Simpson
(74) *Attorney, Agent, or Firm* — Collard & Roe, P.C.

(57) ABSTRACT

A display substrate and a display device are provided. The display substrate includes a base substrate and a plurality of reset signal lines. The base substrate includes a display region which includes sub-pixels arranged in array, each sub-pixels includes a pixel driving circuit and a light-emitting element. The plurality of reset signal lines extends in a first direction and include a plurality of first reset signal lines for providing a first reset signal and a plurality of second reset signal lines for providing a second reset signal, (Continued)

and one of the plurality of first reset signal lines and one of the plurality of second reset signal lines are respectively connected to pixel driving circuits of a plurality of sub-pixels located in a same row. A layer where the plurality of first reset signal lines are located is different from layers where the plurality of second reset signal lines are located.

19 Claims, 34 Drawing Sheets

(56) References Cited

U.S. PATENT DOCUMENTS

| 2022/0180816 | A1* | 6/2022 | Yuan | G09G 3/3275 |
|---|---|---|---|---|
| 2023/0038017 | A1 | 2/2023 | Wei et al. | |
| 2023/0237963 | A1 | 7/2023 | Liu et al. | |

FOREIGN PATENT DOCUMENTS

| CN | 111210731 | A | 5/2020 |
|---|---|---|---|
| CN | 111276097 | A | 6/2020 |
| CN | 111276099 | A | 6/2020 |
| CN | 112435622 | A | 3/2021 |
| EP | 4 006 983 | A1 | 6/2022 |
| WO | 2021/016946 | A1 | 2/2021 |
| WO | 2021/102791 | A1 | 6/2021 |

OTHER PUBLICATIONS

Written Opinion in PCT in PCT/CN2021/099283 dated Mar. 10, 2022 in Chinese.
Extended European Search in European Application No. 21944567.3 dated Nov. 23, 2023.

\* cited by examiner

DISPLAY SUBSTRATE AND DISPLAY DEVICE

CROSS REFERENCE TO RELATED APPLICATIONS

This application is the National Stage of PCT/CN2021/099283 filed on Jun. 10, 2021, the disclosure of which is incorporated by reference.

TECHNICAL FIELD

At least one embodiment of the present disclosure relates to a display substrate and a display device.

BACKGROUND

The display industry develops rapidly in recent years, but the market still has more and more requirements on the display products, such as the requirements of reducing power consumption. For example, in the hot display panel market, in order to improve the usage time of the battery, on the one hand, the battery capacity is increased, and on the other hand, the unnecessary power consumption of the display panel is reduced, so reducing the power consumption of the display panel has become a focus of attention at present.

SUMMARY

At least one embodiment of the present disclosure provides a display substrate, the display substrate comprises a base substrate and a plurality of reset signal lines. The base substrate comprises a display region, the display region comprises a plurality of sub-pixels arranged in array, each of the plurality of sub-pixels comprises a pixel driving circuit and a light-emitting element, and the pixel driving circuit is configured to drive the light-emitting element to emit light; the plurality of reset signal lines extend in a first direction, the plurality of reset signal lines comprise a plurality of first reset signal lines for providing a first reset signal and a plurality of second reset signal lines for providing a second reset signal, and one of the plurality of first reset signal lines and one of the plurality of second reset signal lines are respectively connected to pixel driving circuits of a plurality of sub-pixels located in a same row. A layer where the plurality of first reset signal lines are located is different from layers where the plurality of second reset signal lines are located.

For example, in the display substrate provided by at least one embodiment of the disclosure, the plurality of sub-pixels are arranged in N rows; one of the plurality of second reset signal lines is electrically connected to pixel driving circuits of sub-pixels in an (M−1)th row, and one of the plurality of first reset signal lines is electrically connected to pixel driving circuits of sub-pixels in an (M)th row; and an orthographic projection of a second reset signal line, that is electrically connected to the pixel driving circuits of the sub-pixels in the (M−1)th row, on the base substrate at least partially overlaps with an orthographic projection of a first reset signal line, that is electrically connected to the pixel driving circuits of the sub-pixels in the (M)th row, on the base substrate, wherein 1<M≤N, and M and N are positive integers greater than or equal to 2.

For example, in the display substrate provided by at least one embodiment of the disclosure, in a region where one sub-pixel of the sub-pixels in the (M−1)th row is located, an area of an overlapping region of the orthographic projection of the second reset signal line, that is electrically connected to the pixel driving circuits of the sub-pixels in the (M−1)th row, on the base substrate and the orthographic projection of the first reset signal line, that is electrically connected to the pixel driving circuits of the sub-pixels in the (M)th row, on the base substrate is greater than 50% of an area of the orthographic projection of the second reset signal line on the base substrate, or greater than 50% of an area of the orthographic projection of the first reset signal line on the base substrate.

For example, the display substrate provided by at least one embodiment of the disclosure further comprises a plurality of first power supply voltage lines; each of the plurality of first power supply voltage lines extends in a second direction different from the first direction, and is electrically connected to pixel driving circuits of a plurality of sub-pixels in a same column and provides a first power supply voltage; and along the second direction, the first power supply voltage line comprises a bent portion between orthographic projections of two adjacent first reset signal lines on the base substrate.

For example, in the display substrate provided by at least one embodiment of the disclosure, a partial line segment of the first power supply voltage line is routed along the first direction, and a line width of the partial line segment is smaller than a line width of at least a portion of the first power supply voltage line that is routed along the second direction.

For example, in the display substrate provided by at least one embodiment of the disclosure, the pixel driving circuit comprises a driving sub-circuit, a data writing sub-circuit, a storage sub-circuit, a first reset sub-circuit and a second reset sub-circuit; the driving sub-circuit is electrically connected to a first node, a second node and a third node, and is configured to be controlled in response to a level of the first node; the data writing sub-circuit is electrically connected to the second node, and is configured to receive a first scanning signal, and write a data signal into the driving sub-circuit in response to the first scanning signal; the storage sub-circuit is electrically connected to the first node, and is configured to store the data signal; the first reset sub-circuit is electrically connected to the first node, and is configured to apply a first reset voltage to the first node in response to a first reset control signal; the second reset sub-circuit is electrically connected to a fourth node, and is configured to apply a second reset voltage to the fourth node in response to a second reset control signal; and the driving sub-circuit comprises a first transistor, and the data writing sub-circuit comprises a second transistor.

For example, in the display substrate provided by at least one embodiment of the disclosure, the pixel driving circuit further comprises a compensation sub-circuit, a first light-emitting control sub-circuit, and a second light-emitting control sub-circuit; the compensation sub-circuit is electrically connected to the first node and the third node, and is configured to receive a second scanning signal, and perform threshold compensation on the driving sub-circuit in response to the second scanning signal; the first light-emitting control sub-circuit is electrically connected to the second node, and is configured to apply the first power supply voltage to the driving sub-circuit in response to a light-emitting control signal; the second light-emitting control sub-circuit is electrically connected to the third node and the fourth node, and is configured to enable a driving signal to be applied to the light-emitting element in response to the light-emitting control signal; and the compensation sub-circuit comprises a third transistor, the storage sub-circuit comprises a storage capacitor, the first light-emitting control sub-circuit comprises a fourth transistor, the second light-emitting control sub-circuit comprises a fifth transistor, the first reset sub-circuit comprises a sixth transistor, and the second reset sub-circuit comprises a seventh transistor.

For example, the display substrate provided by at least one embodiment of the disclosure further comprises a first semiconductor layer, a first insulating layer, a first metal layer, a second insulating layer and a second metal layer on the base substrate; the first insulating layer is located between the first semiconductor layer and the first metal layer, and the second insulating layer is located between the first metal layer and the second metal layer; and the first semiconductor layer comprises active layers of the first transistor, the second transistor, the fourth transistor, the fifth transistor, and the seventh transistor, and the first metal layer comprises gate electrodes of the first transistor, the second transistor, the fourth transistor, the fifth transistor, and the seventh transistor.

For example, the display substrate provided by at least one embodiment of the disclosure further comprises a third insulating layer and a third metal layer; the third insulating layer is located between the third metal layer and the second metal layer; a first electrode plate and a second electrode plate of the storage capacitor are respectively located in at least two of the first metal layer, the second metal layer and the third metal layer; and the first reset signal line is located in the second metal layer and the second reset signal line is located in the third metal layer; or, the first reset signal line is located in the first metal layer and the second reset signal line is located in the third metal layer; or, the first reset signal line is located in the first metal layer and the second reset signal line is located in the second metal layer.

For example, the display substrate provided by at least one embodiment of the disclosure further comprises a fourth insulating layer and a fourth metal layer; the fourth insulating layer is located between the third metal layer and the fourth metal layer, and the first power supply voltage line is located in the fourth metal layer.

For example, the display substrate provided by at least one embodiment of the disclosure further comprises a second semiconductor layer and a fifth insulating layer; the second semiconductor layer is located between the third insulating layer and the third metal layer, and the fifth insulating layer is located between the second semiconductor layer and the third metal layer; and the first metal layer comprises the first electrode plate of the storage capacitor, the second metal layer comprises the second electrode plate of the storage capacitor, a first gate electrode of the third transistor, and a first gate electrode of the sixth transistor, the second semiconductor layer comprises active layers of the third transistor and the sixth transistor, and the third metal layer comprises a second gate electrode of the third transistor and a second gate electrode of the sixth transistor.

For example, in the display substrate provided by at least one embodiment of the disclosure, an orthographic projection of the first gate electrode of the third transistor on the base substrate at least partially overlaps with an orthographic projection of the second gate electrode of the third transistor on the base substrate; and an orthographic projection of the first gate electrode of the sixth transistor on the base substrate at least partially overlaps with an orthographic projection of the second gate electrode of the sixth transistor on the base substrate.

For example, in the display substrate provided by at least one embodiment of the disclosure, the bent portion of the first power supply voltage line comprises a first portion and a second portion respectively extending along the second direction, and a third portion extending along the first direction, the third portion connects the first portion and the second portion; an orthographic projection of the first portion on the base substrate overlaps with orthographic projections of the first gate electrode of the third transistor, the second gate electrode of the third transistor, the first gate electrode of the sixth transistor and the second gate electrode of the sixth transistor on the base substrate; and the second portion is electrically connected to a first electrode of the fourth transistor.

For example, in the display substrate provided by at least one embodiment of the disclosure, the orthographic projection of the first portion on the base substrate and the orthographic projection of the first gate electrode of the third transistor on the base substrate comprise a first overlapping region, and the orthographic projection of the first portion on the base substrate and the orthographic projection of the first gate electrode of the sixth transistor on the base substrate comprise a second overlapping region; and a centerline of the first overlapping region extending along the second direction does not coincide with a centerline of the second overlapping region extending along the second direction.

For example, in the display substrate provided by at least one embodiment of the disclosure, a line width of the first portion is larger than both a line width of the second portion and a line width of the third portion.

For example, the display substrate provided by at least one embodiment of the disclosure further comprises a plurality of data lines extending along the second direction; each of the plurality of data lines is electrically connected to pixel driving circuits of a plurality of sub-pixels located in a same column, and is configured to provide a data signal; and a distance between the orthographic projection of the first portion on the base substrate and an orthographic projection of one of the plurality of data lines on the base substrate along the first direction is greater than a distance between an orthographic projection of the second portion on the base substrate and the orthographic projection of the one of the plurality of data lines on the base substrate along the first direction.

For example, the display substrate provided by at least one embodiment of the disclosure further comprises a fifth metal layer and a sixth insulating layer; the fifth metal layer is located between the fourth metal layer and the third metal layer, the sixth insulating layer is located between the fourth metal layer and the fifth metal layer; the pixel driving circuit further comprises a first connection electrode located in the fifth metal layer; and the first connection electrode connects the first reset signal line electrically connected to the pixel driving circuits of the sub-pixels in the (M)th row to the pixel driving circuits of the sub-pixels in the (M)th row.

For example, in the display substrate provided by at least one embodiment of the disclosure, at least a portion of the first connection electrode extends along the first direction; a first end of the first connection electrode is connected to the first reset signal line through a via hole penetrating the third insulating layer, the fourth insulating layer and the fifth insulating layer; and a second end of the first connection electrode is connected to a first electrode of the sixth transistor of the pixel driving circuit of the sub-pixel in the (M)th row through a via hole penetrating the fourth insulating layer and the fifth insulating layer.

For example, in the display substrate provided by at least one embodiment of the disclosure, the pixel driving circuit further comprises a second connection electrode located in the fifth metal layer; a first end of the second connection electrode is connected to the second reset signal line through a via hole penetrating the fourth insulating layer, and a second end of the second connection electrode is connected to a first electrode of the seventh transistor of the pixel driving circuit of the sub-pixel in the (M−1)th row through a via hole penetrating the first insulation layer, the second insulating layer, the third insulating layer, the fourth insulating layer and the fifth insulating layer.

For example, the display substrate provided by at least one embodiment of the disclosure further comprises a first reset control signal line extending along the first direction; the first reset control signal line is configured to provide the first reset control signal to pixel driving circuits of a plurality of sub-pixels in a row corresponding to the first reset control signal line; and the first reset control signal line comprises a first sub-line located in the second metal layer and a second sub-line located in the third metal layer, and an orthographic projection of the first sub-line on the base substrate at least partially overlaps with an orthographic projection of the second sub-line on the base substrate.

For example, the display substrate provided by at least one embodiment of the disclosure further comprises a second reset control signal line located in the first metal layer; the second reset control signal line extends along the first direction, and is configured to provide the second reset control signal to pixel driving circuits of a plurality of sub-pixels in a row corresponding to the second reset control signal line; and a portion of the second reset control signal line overlapping with the first semiconductor layer in a direction perpendicular to the base substrate serves as a gate electrode of the seventh transistor.

For example, the display substrate provided by at least one embodiment of the disclosure further comprises a plurality of first scanning signal lines located in the first metal layer; each of the plurality of first scanning signal lines extends along the first direction, and is configured to provide the first scanning signal to pixel driving circuits of a plurality of sub-pixels in a row corresponding thereto; and a portion of the first scanning signal line overlapping with the first semiconductor layer in a direction perpendicular to the base substrate serves as a gate electrode of the second transistor.

For example, the display substrate provided by at least one embodiment of the disclosure further comprises a plurality of second scanning signal lines; each of the plurality of second scanning signal lines extends along the first direction, and is configured to provide the second scanning signal to pixel driving circuits of a plurality of sub-pixels in a row corresponding thereto; along the second direction, in each of the pixel driving circuits, an orthographic projection of one of the plurality of second scanning signal lines on the base substrate is located between an orthographic projection of the storage capacitor on the base substrate and an orthographic projection of one of the plurality of first scanning signal lines on the base substrate; the display substrate further comprises a first convex portion located in the first metal layer and a first electrode portion located in the second metal layer, the first convex portion is connected to the first scanning signal line, the first convex portion and the first scanning signal line are integral with each other; an orthographic projection of the first electrode portion on the base substrate is located between the data line and the first power supply voltage line along the first direction, and is located between the first reset control signal line and the second scanning signal line along the second direction; and the orthographic projection of the first electrode portion on the base substrate at least partially overlaps with an orthographic projection of the first convex portion and/or an orthographic projection of the first scanning signal line on the base substrate.

For example, in the display substrate provided by at least one embodiment of the disclosure, the pixel driving circuit further comprises a third connection electrode located in the fifth metal layer; and an orthographic projection of the third connection electrode on the base substrate partially overlaps with orthographic projections of the first scanning signal line, the second scanning signal line and the second semiconductor layer on the base substrate.

For example, in the display substrate provided by at least one embodiment of the disclosure, the first metal layer further comprises a plurality of light-emitting control lines extending along the first direction, each of the plurality of light-emitting control lines is configured to provide the light-emitting control signal to pixel driving circuits of a plurality of sub-pixels in a row corresponding thereto; and a portion of one of the plurality of light-emitting control lines overlapping with the first semiconductor layer in a direction perpendicular to the base substrate serves as a gate electrode of the fourth transistor and a gate electrode of the fifth transistor.

For example, in the display substrate provided by at least one embodiment of the disclosure, in the region where one sub-pixel of the sub-pixels in the (M−1)th row is located, an area of an overlapping region of the orthographic projection of the second reset signal line, that is electrically connected to the pixel driving circuits of the sub-pixels in the (M−1)th row, on the base substrate and an orthographic projection of the second reset control signal line, that is electrically connected to the pixel driving circuits of the sub-pixels in the (M−1)th row, on the base substrate is less than 50% of an area of the orthographic projection of the second reset signal line on the base substrate; or, in the region where one sub-pixel of the sub-pixels in the (M−1)th row is located, an area of an overlapping region of the orthographic projection of the first reset signal line, that is electrically connected to the pixel driving circuits of the sub-pixels in the (M)th row, on the base substrate and the orthographic projection of the second reset control signal line, that is electrically connected to the pixel driving circuits of the sub-pixels in the (M−1)th row, on the base substrate is less than 50% of an area of the orthographic projection of the first reset signal line on the base substrate.

At least one embodiment of the disclosure provides a display device, and the display device comprises the display substrate as described above.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not limitative of the present disclosure.

DETAILED DESCRIPTION

Figure 1:
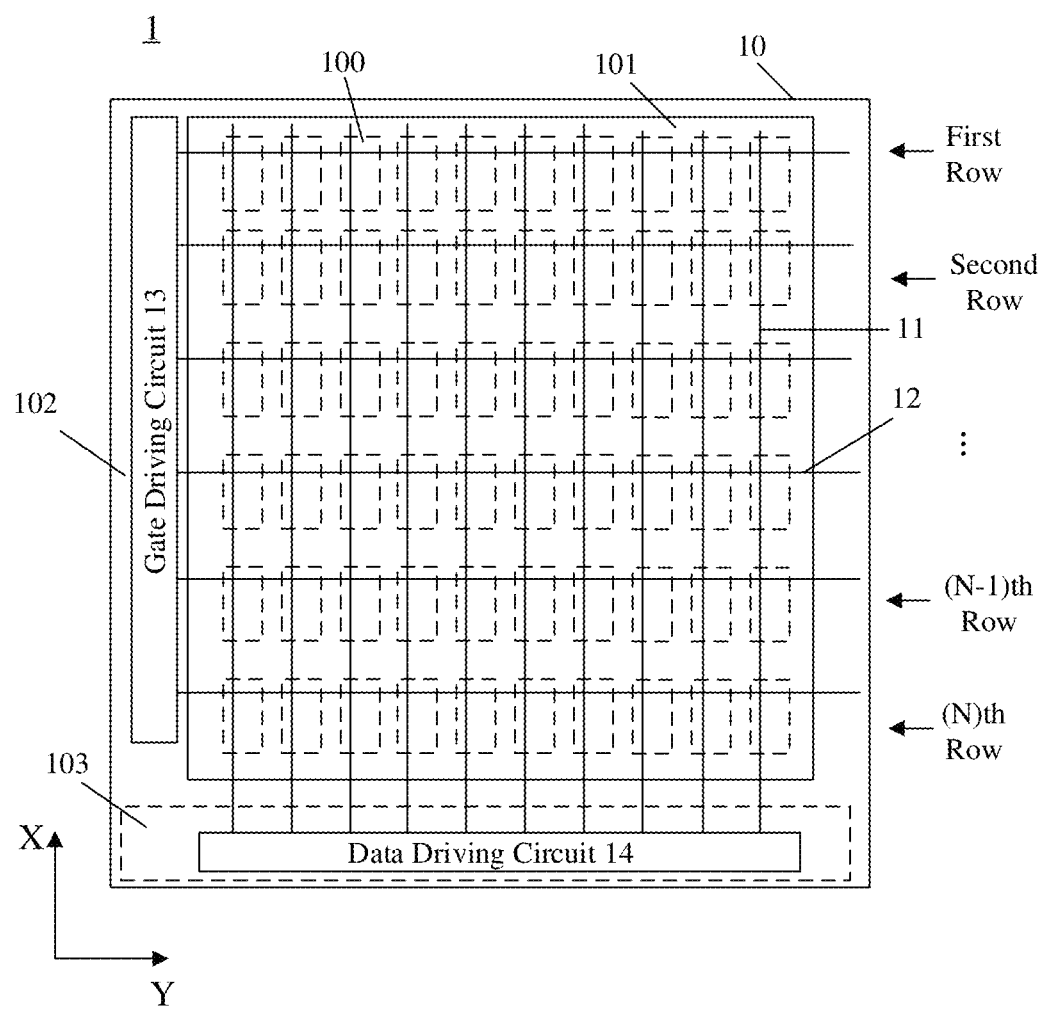
FIG. 1 is a schematic view of a display substrate provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Likewise, the terms such as "a," "an," or "the" do not indicate a limitation of quantity, but rather indicate the presence of at least one. The terms "comprise," "comprising," "include," "including," etc., are intended to specify that the elements or the objects stated before these terms encompass the elements or the objects and equivalents thereof listed after these terms, but do not preclude the other elements or objects. For the convenience of description, in some drawings, "top," "bottom," "front" and "rear" are used. In the embodiments of the present disclosure, the vertical direction is the direction from top to bottom, and the vertical direction is the direction of gravity. The horizontal direction is the direction perpendicular to the vertical direction, and the horizontal direction is from right to left or is from front to rear.

LTPO (Low Temperature Polycrystalline Oxide) is a technology that is capable of reducing the power consumption of the display panel but has not been widely used in the display industry at present. With the development of the market, LTPO is bound to have a very broad application market in the next few years. At present, it is necessary to combine new technologies, such as LTPO, to further reduce the power consumption of the display panel. Furthermore, while reducing the power consumption of the display panel, it is also necessary to ensure the high-resolution characteristics of the display panel.

At least one embodiment of the present disclosure provides a display substrate, and the display substrate includes a base substrate and a plurality of reset signal lines. The base substrate includes a display region, the display region includes a plurality of sub-pixels arranged in an array, each of the plurality of sub-pixels includes a pixel driving circuit and a light-emitting element, and the pixel driving circuit is configured to drive the light-emitting element to emit light. The plurality of reset signal lines extend in a first direction, the plurality of reset signal lines include a plurality of first reset signal lines for providing a first reset signal and a plurality of second reset signal lines for providing a second reset signal, one of the plurality of first reset signal lines and one of the plurality of second reset signal lines are respectively connected to pixel driving circuits of a plurality of sub-pixels located in a same row, and a layer where the plurality of first reset signal lines are located is different from a layer where the plurality of second reset signal lines are located.

At least one embodiment of the present disclosure further provides a display device including the display substrate mentioned above.

In the display substrate and the display device provided by the embodiments of the present disclosure, one of the plurality of first reset signal lines and one of the plurality of second reset signal lines are respectively connected to the pixel driving circuits of the plurality of sub-pixels located in the same row, and the layer where the plurality of first reset signal lines are located is different from the layer where the plurality of second reset signal lines are located, which is beneficial to improve the display quality of the display substrate and reduce the wiring layout space of the pixel driving circuit of the display substrate.

The embodiments of the present disclosure and examples thereof are described in detail below with reference to the accompanying drawings.

Figure 2:
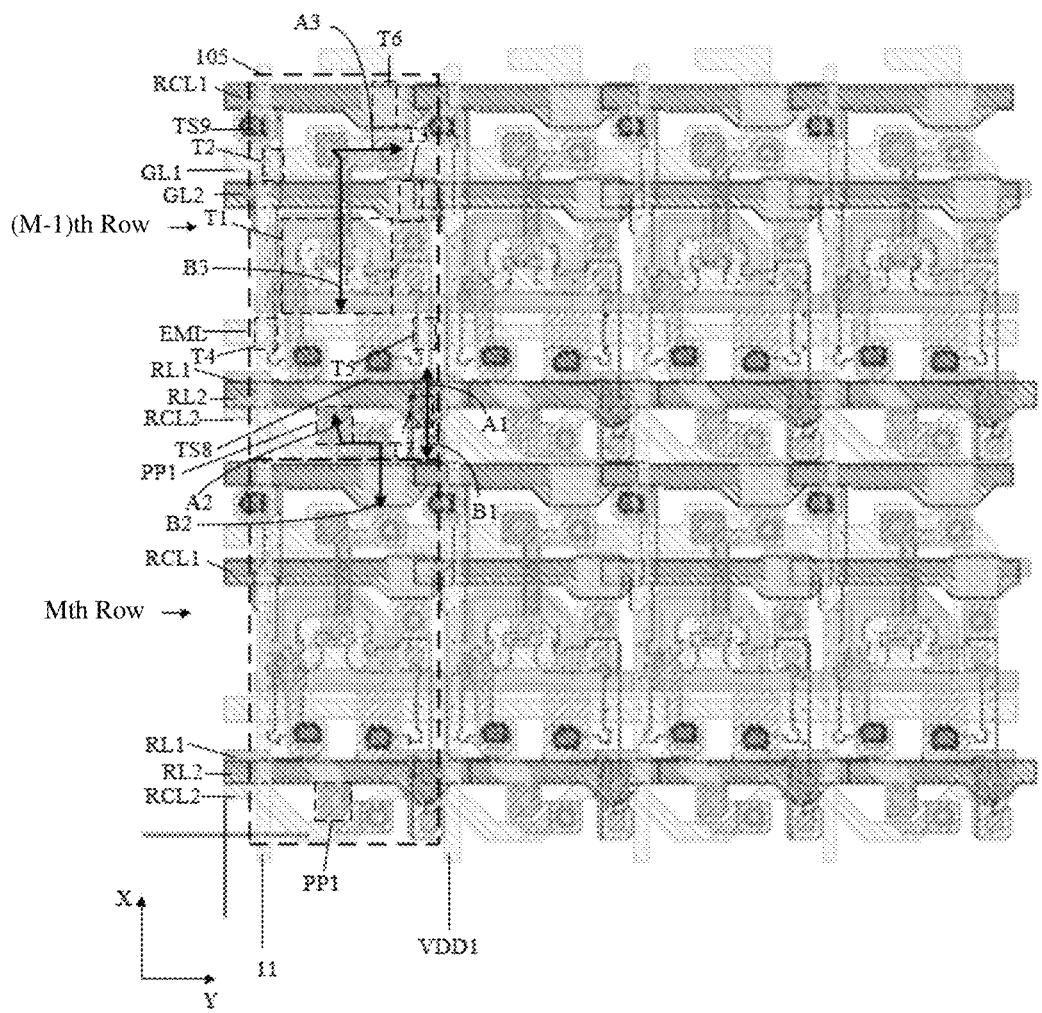
FIG. 2 is a schematic layout view of a pixel driving circuit of the display substrate provided by at least one embodiment of the present disclosure.

FIG. 1 is a schematic view of a display substrate provided by at least one embodiment of the present disclosure. FIG. 2 is a schematic layout view of a pixel driving circuit of the display substrate provided by at least one embodiment of the present disclosure.

For example, in some embodiments, as illustrated in FIG. 1, the display substrate 1 includes a base substrate 10 including a display region 101 and a peripheral region 102. The display region 101 includes a plurality of sub-pixels 100. The peripheral region 102 includes a bonding region 103. The bonding region 103 is located on one side of the display region 101 (e.g., the lower part in the figure). For example, the plurality of sub-pixels 100 are arranged in rows and columns along a first direction Y and a second direction X. The first direction Y and the second direction X are different, for example, they are orthogonal to each other.

Each sub-pixel 100 includes a light-emitting element 120 (for example, illustrated in FIG. 15B) and a pixel driving circuit 105 (for example, illustrated in FIG. 2) that drives the light-emitting element 120 to emit light. For example, a plurality of pixel driving circuits 105 are arranged in an array along the first direction Y and the second direction X. For example, the plurality of sub-pixels are arranged to constitute a conventional pixel unit of RGB pattern. In other embodiments, the sub-pixels constitute a pixel unit in a manner of sharing some sub-pixels (for example, pentile) to realize full-color display. The present disclosure does not limit the arrangement of the sub-pixels.

For example, as illustrated in FIG. 1, the display substrate 1 further includes a plurality of gate lines 12 (e.g., first scanning signal lines, second scanning signal lines, light-emitting control lines, first reset control signal lines, second reset control signal lines, etc.), a plurality of data lines 11 and a plurality of pixel regions, and each pixel region is correspondingly provided with one sub-pixel 100. For example, the gate lines 12 extend along the first direction Y, and the data lines 11 extend along the second direction X. FIG. 2 only illustrates the approximate positional relationship of the gate lines 12, the data lines 11 and the sub-pixels 100 in the display substrate, which may be specifically designed according to actual needs.

The pixel driving circuit 105 is, for example, a 2T1C (i.e., two transistors and one capacitor) pixel driving circuit, or an nTmC (n and m are positive integers) pixel driving circuit such as 4T2C, 5T1C, and 7T1C. And in different embodiments, the pixel driving circuit 105 for example further includes a compensation sub-circuit, the compensation sub-circuit includes an internal compensation sub-circuit or an external compensation sub-circuit, and the compensation sub-circuit includes a transistor, a capacitor, and the like. For example, the pixel driving circuit 105 further includes a reset circuit, a light-emitting control sub-circuit, a detection circuit, and the like, as required.

For example, the display substrate 1 further includes a gate driving circuit 13 located in the peripheral region 102 and a data driving circuit 14 located in the bonding region 103. The gate driving circuit 13 is electrically connected to the pixel driving circuit 105 through the gate line 12 to provide various scanning signals (e.g., a first scanning signal, a second scanning signal, a light-emitting control signal, a first reset control signal, a second reset control signal, etc.), and the data driving circuit 14 is electrically connected to the pixel driving circuit 105 through the data line 11 to provide a data signal. The positional relationship of the gate driving circuit 13 and the data driving circuit 14, the gate line 12 and the data line 11 in the display substrate illustrated in FIG. 1 is just an example, and the actual arrangement position may be designed as required.

For example, the display substrate 1 further includes a control circuit (not illustrated). For example, the control circuit is configured to control the data driving circuit 14 to apply the data signal, and to control the gate driving circuit to apply the various scanning signals. An example of the control circuit is a timing control circuit (T-con). The control circuit may be in various forms, including, for example, a processor and a memory, and the memory includes executable code that is executed by the processor to perform the controlling process described above.

For example, the processor is a central processing unit (CPU) or other form of processing device with data processing capabilities and/or instruction execution capabilities, which includes, for example, a microprocessor, a programmable logic controller (PLC), or the like.

For example, the memory includes one or more computer program products. The memory may include various kinds of computer readable storage media, e.g., volatile memory and/or nonvolatile memory. Volatile memory, for example, includes a random access memory (RAM) and/or a cache memory. Nonvolatile memory, for example, includes read-only memory (ROM), hard disk, flash memory, etc. One or more computer program instructions for example are stored in the computer readable storage medium, and the processor executes the program instructions to realize the desired functions. Various application programs and various data for example are also stored in the computer readable storage medium.

For example, in some embodiments, as illustrated in FIG. 2, the display substrate 1 includes a plurality of reset signal lines. The plurality of reset signal lines extend along the first direction Y. The plurality of reset signal lines include a plurality of first reset signal lines RL1 for providing a first reset signal and a plurality of second reset signal lines RL2 for providing a second reset signal. Each of the plurality of first reset signal lines RL1 is electrically connected to pixel driving circuits 105 of sub-pixels 100 in one row. Each of the plurality of second reset signal lines RL2 is electrically connected to pixel driving circuits 105 of sub-pixels 100 in one row. One of the plurality of first reset signal lines RL1 and one of the plurality of second reset signal lines RL2 are respectively connected to pixel driving circuits of a plurality of sub-pixels located in a same row, and provide the first reset signal and the second reset signal to the pixel driving circuits 105 of the plurality of sub-pixels 100 in the same row, so as to improve the display quality of the display substrate 1. The layer where the plurality of first reset signal lines RL1 are located is different from the layer where the plurality of second reset signal lines RL2 are located. That is, the layer where the first reset signal line RL1 is located is different from the layer where the second reset signal line RL2 is located, so as to reduce the wiring space of the pixel driving circuit.

For example, in some embodiments, as illustrated in FIG. 1 and FIG. 2, the plurality of sub-pixels 100 are arranged in N rows, one of the plurality of second reset signal lines RL2 (located in an (M−1)th row) is electrically connected to pixel driving circuits 105 of sub-pixels 100 in the (M−1)th row (an upper row in FIG. 2), and one of the plurality of first reset signal lines RL1 (located in an (M)th row) is electrically connected to pixel driving circuits 105 of sub-pixels 100 in the (M)th row. For example, 1<M≤N, and M and N are positive integers greater than or equal to 2. Referring to appropriately middle position in FIG. 2A, the second reset signal line RL2 is electrically connected to the pixel driving circuits 105 of the current row (i.e. the (M−1)th row), and the first reset signal line RL1 is electrically connected to the pixel driving circuits 105 of the next row (i.e. the (M)th row). The orthographic projection of the second reset signal line RL2, that is electrically connected to the pixel driving circuits 105 of the sub-pixels in the (M−1)th row, on the base substrate 10 at least partially overlaps with the orthographic projection of the first reset signal line RL1, that is electrically connected to the pixel driving circuits 105 of the sub-pixels in the (M)th row, on the base substrate 10, thereby reducing the wiring space in the pixel driving circuit 105 and improving the resolution of the display substrate.

Figure 14A:
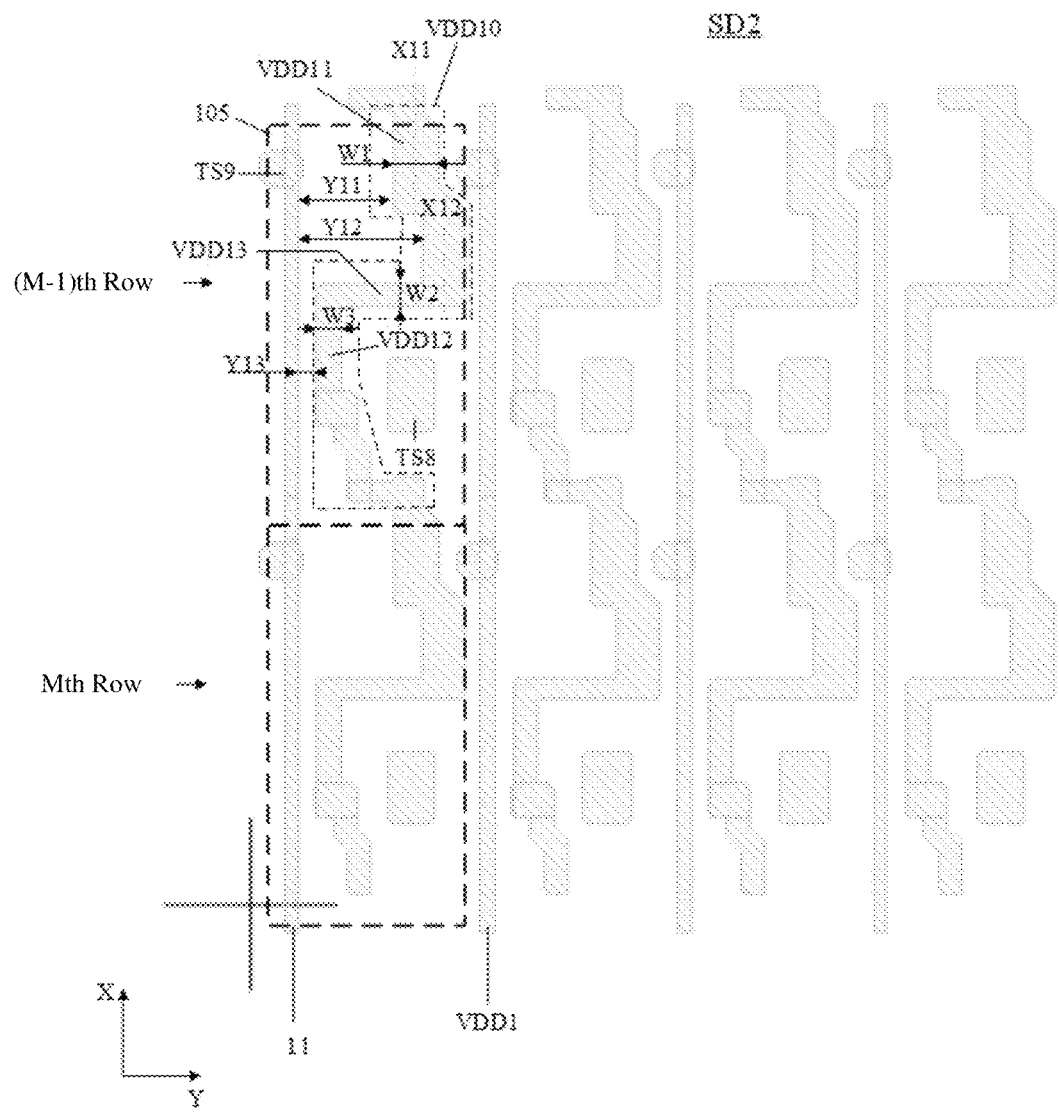
FIG. 14A is a schematic layout view of a fourth metal layer of the display substrate provided by at least one embodiment of the present disclosure.

For example, in some embodiments, as illustrated in FIG. 2, in a region where one sub-pixel of the sub-pixels in the (M−1)th row is located (for example, the region where the pixel driving circuit of the one sub-pixel is located, illustrated as a dotted box in the figure), an area of an overlapping region between the orthographic projection of the second reset signal line RL2, that is electrically connected to the pixel driving circuits of the sub-pixels in the (M−1)th row, on the base substrate 10 and the orthographic projection of the first reset signal line RL1, that is electrically connected to the pixel driving circuits of the sub-pixels in the (M)th row, on the base substrate 10 is greater than 50% of an area of the orthographic projection of the second reset signal line RL2 on the base substrate 10, or greater than 50% of an area of the orthographic projection of the first reset signal line RL1 on the base substrate 10. Therefore, the overlapping portion between the first reset signal line RL1 and the second reset signal line RL2 is relatively large, thereby reducing the wiring space in the pixel driving circuit 105 and improving the resolution of the display substrate. FIG. 14A is a schematic layout view of a fourth metal layer of the display substrate provided by at least one embodiment of the present disclosure.

For example, in some embodiments, as illustrated in FIG. 2 and FIG. 14A, the display substrate 1 further includes a plurality of first power supply voltage lines VDD1. Each of the first power supply voltage lines VDD1 extends along the second direction X different from the first direction Y, and is electrically connected to the pixel driving circuits 105 of a plurality of sub-pixels in a same column and provides a first power supply voltage (e.g., a high level). Along the second direction X, the first power supply voltage line VDD1 includes a bent portion VDD10 between orthographic projections of two adjacent first reset signal lines RL1 on the base substrate 10. That is, the orthographic projection of the bent portion VDD10 on the base substrate 10 overlaps with the orthographic projection of the pixel driving circuit 105 on the base substrate 10. The bent portion of the first power supply voltage line VDD1 forms a capacitance with a trace of other metal layers or serves as a shielding layer of other layers.

Figure 4A:
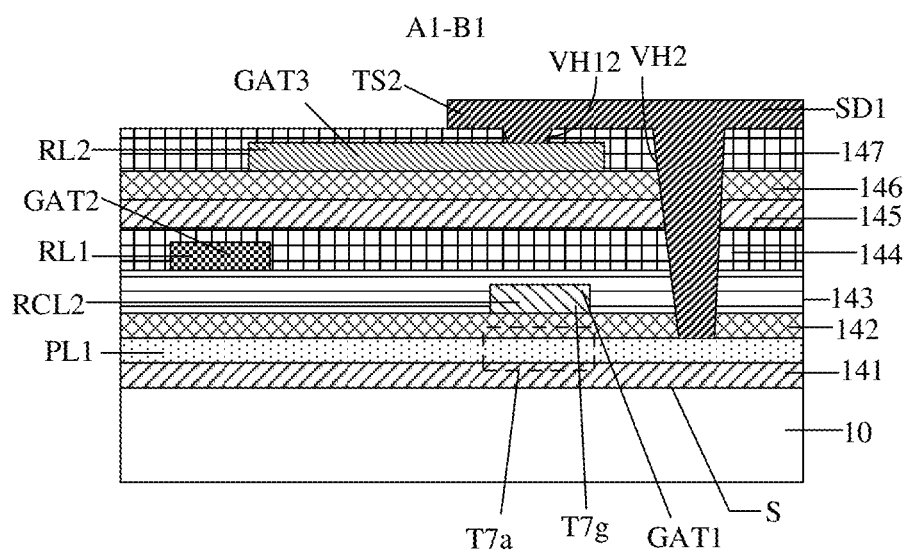
FIG. 4A is a schematic cross-sectional view along a section line A1-B1 in FIG. 2 provided by at least one embodiment of the present disclosure.

It should be noted that in the embodiments of the present disclosure, an orthographic projection of each trace or layer on the base substrate 10 is, for example, regarded as an orthographic projection of each trace or layer on the board surface S (as illustrated in FIG. 4A, for example, the upper surface of the base substrate 10) of the base substrate 10.

For example, in some embodiments, as illustrated in FIG. 2 and FIG. 14A, a partial line segment (for example, a part of the horizontal trace in FIG. 14A) of the first power supply voltage line VDD1 is routed along the first direction Y, and the line width W2 of the partial line segment is smaller than the line width W1 of at least a portion (for example, a part of the vertical trace in FIG. 14A) of the first power supply voltage line VDD1 that is routed along the second direction X. Thereby, the wiring space of the first power supply voltage line VDD1 can be reduced.

It should be noted that, the line width of a trace described in the embodiments of the present disclosure refers to the width of the trace along a direction perpendicular to its extension direction.

Figure 3A:
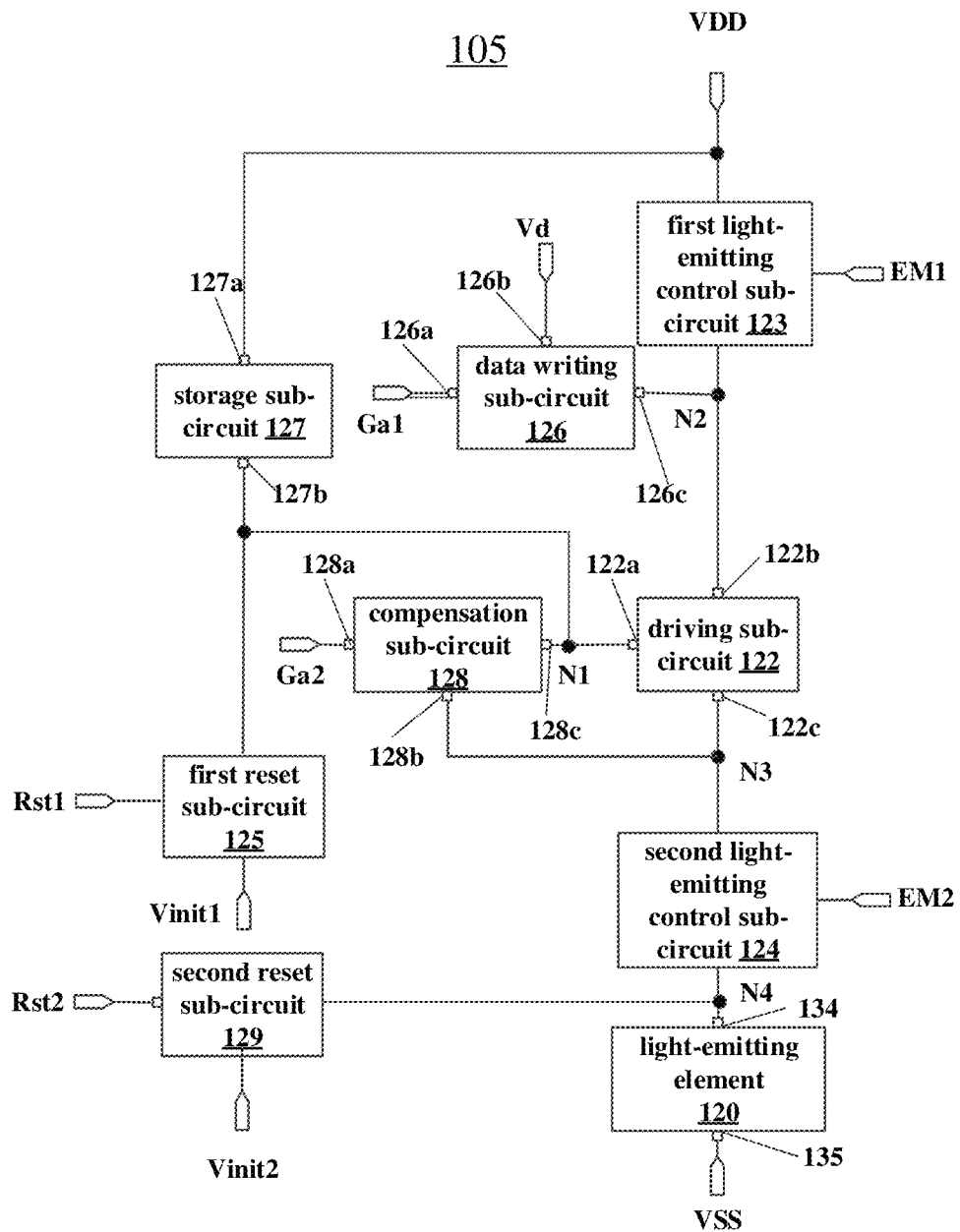
FIG. 3A is a schematic view of the pixel driving circuit provided by at least one embodiment of the present disclosure.
Figure 3B:
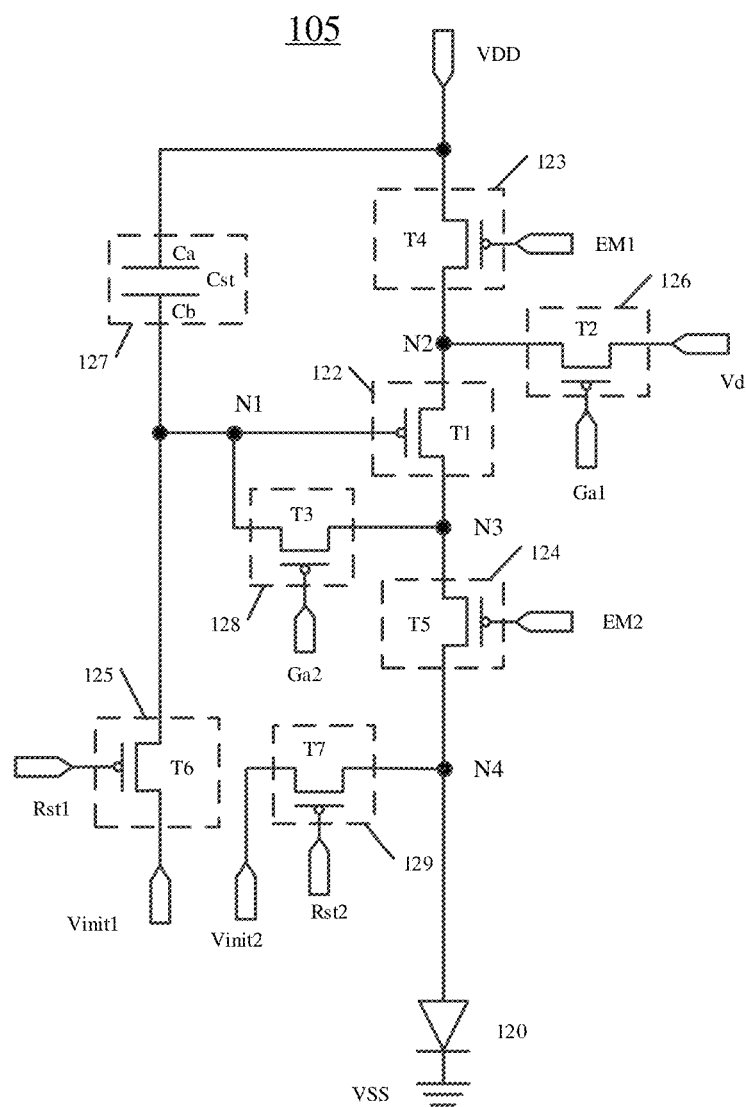
FIG. 3B is another schematic view of the pixel driving circuit provided by at least one embodiment of the present disclosure.

FIG. 3A is a schematic view of a pixel driving circuit provided by at least one embodiment of the present disclosure. FIG. 3B is another schematic view of the pixel driving circuit provided by at least one embodiment of the present disclosure.

As illustrated in FIG. 3A, the pixel driving circuit 105 includes a driving sub-circuit 122 and a compensation sub-circuit 128.

For example, the driving sub-circuit 122 is electrically connected to a first node N1, a second node N2 and a third node N3, and is configured to control the driving current flowing through the light-emitting element 120 under the control of the level of the first node N1. The driving sub-circuit 122 includes a control terminal (control electrode) 122a, a first terminal (first electrode) 122b, and a second terminal (second electrode) 122c, and is configured to be connected to the light-emitting element 120 and to control the driving current flow through the light-emitting element 120. The control terminal 122a of the driving sub-circuit 122 is connected to the first node N1, the first terminal 122b of the driving sub-circuit 122 is connected to the second node N2, and the second terminal 122c of the driving sub-circuit 122 is connected to the third node N3.

For example, the compensation sub-circuit 128 is electrically connected to the first node N1 and the third node N3, and is configured to receive a second scanning signal and perform threshold compensation on the driving sub-circuit 122 in response to the scanning signal. For example, the scanning signal is the second scanning signal provided by the second scanning signal line GL2 (illustrated in FIG. 2). The compensation sub-circuit 128 includes a control terminal (control electrode) 128a, a second terminal (second electrode) 128b and a first terminal (first electrode) 128c, and the control terminal 128a of the compensation sub-circuit 128 is configured to receive the second scanning signal Ga2. The second terminal 128b and the first terminal 128c of the compensation sub-circuit 128 are electrically connected to the second terminal 122c and the control terminal 122a of the driving sub-circuit 122, respectively, and the compensation sub-circuit 128 is configured to perform threshold compensation on the driving sub-circuit 122 in response to the second scanning signal Ga2.

For example, the pixel driving circuit 105 further includes a data writing sub-circuit 126, a storage sub-circuit 127, a first light-emitting control sub-circuit 123, a second light-emitting control sub-circuit 124, a first reset sub-circuit 125 and a second reset sub-circuit 129.

For example, the data writing sub-circuit 126 is electrically connected to the second node N2, and is configured to receive a first scanning signal Ga1, and write a data signal to the driving sub-circuit data 122 in response to the first scanning signal Ga1. The data writing sub-circuit 126 includes a control terminal 126a, a first terminal (first electrode) 126b and a second terminal (second electrode) 126c, the control terminal 126a is configured to receive the first scanning signal Ga1, the first terminal 126b is configured to receive the data signal Vd, and the second terminal 126c is connected to the first terminal 122b (i.e., the second node N2) of the driving sub-circuit 122. The data writing sub-circuit 126 is configured to write the data signal Vd to the first terminal 122b of the driving sub-circuit 122 in response to the first scanning signal Ga1. For example, the first terminal 126b of the data writing sub-circuit 126 is connected to the data line 11 (as illustrated in FIG. 2) to receive the data signal Vd, and the control terminal 126a is connected to the first scanning signal line GL1 (as illustrated in FIG. 2) to receive the first scanning signal Ga1. For example, in a data writing and compensation phase, the data writing sub-circuit 126 is turned on in response to the first scanning signal Ga1, so that the data signal is written into the first terminal 122b (the second node N2) of the driving sub-circuit 122, and the data signal is stored in the storage sub-circuit 127, so that the driving current for driving the light-emitting element 120 to emit light is generated according to the data signal in a light-emitting phase, for example.

For example, in some embodiments of the present disclosure, the first scanning signal Ga is different from the second scanning signal Ga2. For example, the first scanning signal Ga1 and the second scanning signal Ga2 are connected to different signal output terminals, respectively. For example, the first scanning signal Ga1 and the second scanning signal Ga2 are transmitted through different scanning signal lines (the first scanning signal line GL1 and the second scanning signal line GL2), respectively.

For example, in other embodiments, the first scanning signal Ga1 is the same as the second scanning signal Ga2. For example, the scanning signal Ga1 is connected to the same signal output terminal as the scanning signal Ga2. For example, the scanning signal Ga1 and the scanning signal Ga2 are transmitted through the same scanning signal line.

For example, the storage sub-circuit 127 is electrically connected to the first node N1 and is configured to store the data signal. The storage sub-circuit 127 includes a second terminal (also referred to as a second storage electrode) 127a and a first terminal (also referred to as a first storage electrode) 127b, the second terminal 127a of the storage sub-circuit is configured to receive a first power supply voltage VDD, and the first terminal 127b of the storage sub-circuit is electrically connected to the control terminal 122a of the driving sub-circuit 122. For example, in the data writing and compensation phase, the compensation sub-circuit 128 is turned on in response to the second scanning signal Ga2, so that the data signal written by the data writing sub-circuit 126 is stored in the storage sub-circuit 127. At the same time, the compensation sub-circuit 128 electrically connects the control terminal 122a and the second terminal 122c of the driving sub-circuit 122, so that the relevant information of the threshold voltage of the driving sub-circuit 122 is correspondingly stored in the storage sub-circuit 127, so that, for example, in a light-emitting stage, the data signal and the threshold voltage that are stored are used to control the driving sub-circuit 122, so that the output of the driving sub-circuit 122 is compensated.

For example, in the data writing and compensation phase, the compensation sub-circuit 128 is turned on in response to the second scanning signal Ga2, so that the data signal Vd written by the data writing sub-circuit 126 is stored in the storage sub-circuit 127. For example, in the data writing and compensation phases at the same time, the compensation sub-circuit 128 electrically connects the control terminal 122a and the second terminal 122c of the driving sub-circuit 122, so that the relevant information of the threshold voltage of the driving sub-circuit 122 is also correspondingly stored in the storage sub-circuit, so that, for example, in a light-emitting stage, the data signal and the threshold voltage that are stored are used to control the driving sub-circuit 122, so that the output of the driving sub-circuit 122 is compensated.

Figure 4B:
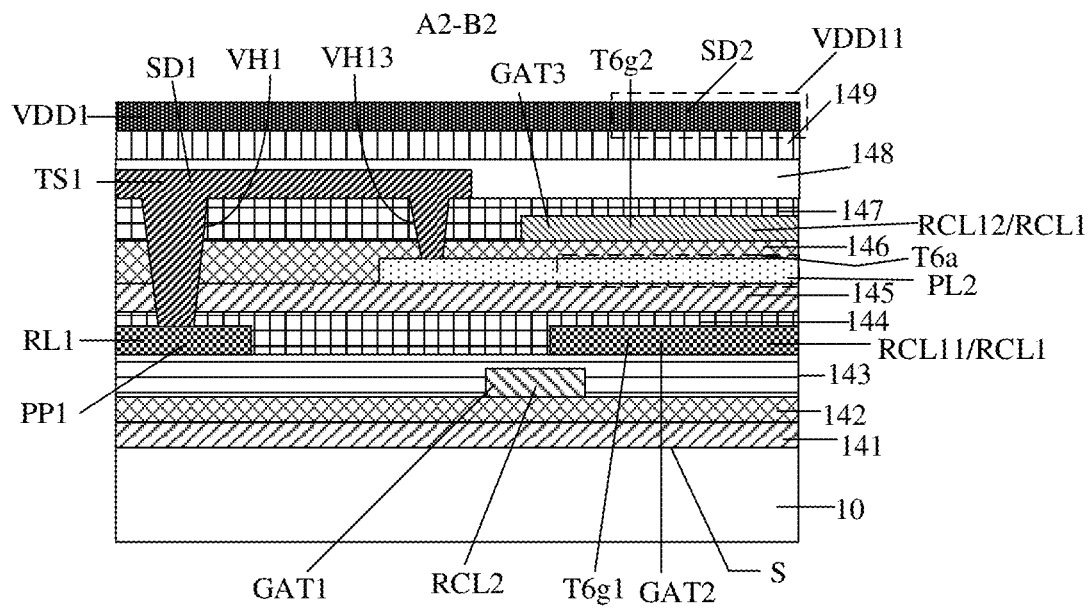
FIG. 4B is a schematic cross-sectional view along a section line A2-B2 in FIG. 2 provided by at least one embodiment of the present disclosure.

For example, the first light-emitting control sub-circuit 123 is electrically connected to the second node N2, and is configured to apply the first power supply voltage VDD to the driving sub-circuit 122 in response to a light-emitting control signal. The first light-emitting control sub-circuit 123 is connected to the first terminal 122b (the second node N2) of the driving sub-circuit 122 and the first power supply voltage terminal VDD, and is configured to apply the first power supply voltage VDD of the first power supply voltage terminal VDD to the first terminal 122b of the driving sub-circuit 122 in response to the first light-emitting control signal EM1. For example, as illustrated in FIG. 4B, the first light-emitting control sub-circuit 123 is connected to the first light-emitting control terminal EM1, the first power supply voltage terminal VDD and the second node N2.

For example, the second light-emitting control sub-circuit 124 is electrically connected to the third node N3 and a fourth node N4, and is configured to enable the driving current to be applied to the light-emitting element 120 in response to a light-emitting control signal. The second light-emitting control sub-circuit 124 is connected to a second light-emitting control terminal EM2, the first terminal (first electrode) 134 of the light-emitting element 120, and the second terminal 122c of the driving sub-circuit 122, and is configured to enable the driving current to be applied to the light-emitting element 120 in response to the second light-emitting control signal EM2.

For example, in the light-emitting phase, the second light-emitting control sub-circuit 124 is turned on in response to the second light-emitting control signal EM2 provided by the second light-emitting control terminal EM2, so that the driving sub-circuit 122 is electrically connected to the light-emitting element 120 through the second light-emitting control sub-circuit 124, thereby driving the light-emitting element 120 to emit light under the control of the driving current. And in a non-light-emitting phase, the second light-emitting control sub-circuit 124 is turned off in response to the second light-emitting control signal EM2, so as to prevent current from flowing through the light-emitting element 120 to emit light, thereby improving the contrast ratio of the corresponding display device.

For another example, in an initialization phase, the second light-emitting control sub-circuit 124 is turned on in response to the second light-emitting control signal, so as to be combined with a reset circuit to perform a reset operation on the driving sub-circuit 122 and the light-emitting element 120.

For example, the second light-emitting control signal EM2 is the same as the first light-emitting control signal EM1. For example, the second light-emitting control signal EM2 is connected to the same signal output terminal as the first light-emitting control signal EM1. For example, the light-emitting control signal EM2 is transmitted through the same light-emitting control line EML (as illustrated in FIG. 2) as the light-emitting control signal EM1.

In other examples, the second light-emitting control signal EM2 is different from the first light-emitting control signal EM1. For example, the second light-emitting control signal EM2 and the first light-emitting control signal EM1 are respectively connected to different signal output terminals. For example, the second light-emitting control signal EM2 and the first light-emitting control signal EM1 are respectively transmitted through different light-emitting control lines.

The embodiments of the present disclosure are described as examples in which the first scanning signal Ga1 and the second scanning signal Ga2 are respectively transmitted through different scanning signal lines (the first scanning signal line GL1 and the second scanning signal line GL2), and the second light-emitting control signal EM2 and the first light-emitting control signal EM1 are transmitted through the same light-emitting control line EML (as illustrated in FIG. 2).

For example, the first reset sub-circuit 125 is electrically connected to the first node N1 and is configured to apply a first reset voltage Vinit1 (e.g., a first reset signal) to the first node N1 in response to a first reset control signal Rst1. The first reset sub-circuit 125 is connected to a first reset voltage terminal Vinit1 and the control terminal 122a (the first node N1) of the driving sub-circuit 122, and is configured to apply the first reset voltage Vinit1 (i.e., the first reset signal) to the control terminal 122a of the driving sub-circuit 122 in response to the first reset control signal Rst1.

For example, the second reset sub-circuit 129 is electrically connected to the fourth node N4 and is configured to apply a second reset voltage Vinit2 (e.g., a second reset signal) to the fourth node N4 in response to a second reset control signal Rst2. The second reset sub-circuit 129 is connected to a second reset voltage terminal Vinit2 and the fourth node N4, and is configured to apply the second reset voltage Vinit2 (i.e., the second reset signal) to the first terminal 134 of the light-emitting element 120 in response to the second reset control signal Rst2.

For example, the first reset sub-circuit 125 and the second reset sub-circuit 129 are respectively turned on in response to the first reset control signal Rst1 and the second reset control signal Rst2, so that the second reset voltage Vinit2 is applied to the first node N1 and the first reset voltage Vinit1 is applied to the first terminal 134 of the light-emitting element 120, thereby performing a reset operation on the driving sub-circuit 122, the compensation sub-circuit 128 and the light-emitting element 120 to eliminate the influence of the light-emitting phase performed before.

For example, the first reset control signal Rst1 and the first reset voltage Vinit1 of each row of sub-pixels 100 are provided by the first reset control signal line RCL1 (as illustrated in FIG. 2) and the first reset signal line RL1 (on a row above the row of sub-pixels 100) which are electrically connected to the row of sub-pixels 100. For example, the second reset control signal Rst2 and the second reset voltage Vinit2 of each row of sub-pixels 100 are provided by the second reset control signal line RCL2 (as illustrated in FIG. 2) and the second reset signal line RL2 which are electrically connected to the row of sub-pixels 100.

For example, the light-emitting element 120 includes the first terminal (also referred to as a first electrode) 134 and a second terminal (also referred to as a second electrode) 135, the first terminal 134 of the light-emitting element 120 is configured to be connected to the second terminal 122c of the driving sub-circuit 122, and the second terminal 135 (e.g., the second electrode) of the light-emitting element 120 is configured to be connected to a second power supply voltage terminal VSS. For example, in one example, as illustrated in FIG. 3B, the first terminal 134 of the light-emitting element 120 is connected to the fourth node N4 through the second light-emitting control sub-circuit 124, and the embodiments of the present disclosure include but are not limited to this case.

For example, in the embodiments of the present disclosure, a second power supply voltage VSS provided by the second power supply voltage terminal VSS is supplied to the second terminal 135 of the light-emitting element 120. The first power supply voltage VDD is at a high level, and the second power supply voltage VSS is at a low level.

It should be noted that, in the description of the embodiments of the present disclosure, the first node N1, the second node N2, the third node N3 and the fourth node N4 do not necessarily represent actual components, but represent the junctions of related circuit connections in the circuit diagram.

It should be noted that in the description of the embodiments of the present disclosure, the symbol Vd for example represents both the data signal terminal and the level of the data signal. Similarly, for example, the symbols Ga1 and Ga2 represent the first scanning signal and the second scanning signal, and also represent the first scanning signal terminal and the second scanning signal terminal. For example, the symbols Rst1 and Rst2 represent the first reset control terminal and the second reset control terminal, and also represent the first reset control signal and the second reset control signal. For example, the symbols Vinit1 and Vinit2 represent the first reset voltage terminal and the second reset voltage terminal, and also represent the first reset voltage and the second reset voltage. The symbol VDD for example represents both the first power supply voltage terminal and the first power supply voltage. The symbol VSS for example represents both the second supply voltage terminal and the second supply voltage. The following embodiments are the same and will not be repeated.

As illustrated in FIG. 3B, the pixel driving circuit 105 includes a first transistor T1, a second transistor T2, a third transistor T3, a fourth transistor T4, a fifth transistor T5, a sixth transistor T6, a seventh transistor T7, and further includes a storage capacitor Cst. For example, the first transistor T1 is used as a driving transistor, and the other second to seventh transistors are used as switching transistors.

For example, as illustrated in FIG. 3B, the driving sub-circuit 122 is implemented as the first transistor T1. A gate electrode of the first transistor T1 serves as the control terminal 122a of the driving sub-circuit 122, and is connected to the first node N1. A first electrode of the first transistor T1 serves as the first terminal 122b of the driving sub-circuit 122, and is connected to the second node N2. A second electrode of the first transistor T1 serves as the second terminal 122c of the driving sub-circuit 122, and is connected to the third node N3.

For example, as illustrated in FIG. 3B, the data writing sub-circuit 126 is implemented as the second transistor T2. A gate electrode of the second transistor T2 is connected to the first scanning signal line GL (the first scanning signal terminal Ga1) to receive the first scanning signal Ga1, a first electrode of the second transistor T2 is connected to the data line 11 (the data signal terminal Vd) to receive the data signal Vd, and a second electrode of the second transistor T2 is connected to the first terminal 122b (the second node N2) of the driving sub-circuit 122.

For example, as illustrated in FIG. 3B, the compensation sub-circuit 128 is implemented as the third transistor T3. A gate electrode, a second electrode and a first electrode of the third transistor T3 serve as the control electrode 128a, the second electrode 128b and the first electrode 128c of the compensation sub-circuit, respectively. The gate electrode of the third transistor T3 is configured to be connected to the second scanning signal line GL (the second scanning signal terminal Ga2) to receive the second scanning signal Ga2, the second electrode of the third transistor T3 is connected to the second terminal 122c (the third node N3) of the driving sub-circuit 122, and the first electrode of the third transistor T3 is connected to the control terminal 122 a (the first node N1) of the driving sub-circuit 122.

For example, as illustrated in FIG. 3B, the storage sub-circuit 127 is implemented as the storage capacitor Cst, and the storage capacitor Cst includes a second capacitor electrode Ca and a first capacitor electrode Cb. The second capacitor electrode Ca is coupled, e.g. electrically connected, to the first power supply voltage terminal VDD, and the first capacitor electrode Cb is coupled, e.g. electrically connected, to the control terminal 122a of the driving sub-circuit 122.

It should be noted that, in the embodiments of the present disclosure, Ca represents both the second capacitor electrode and a second electrode plate, and Cb represents both the first capacitor electrode and a first electrode plate.

For example, as illustrated in FIG. 3B, the first light-emitting control sub-circuit 123 is implemented as the fourth transistor T4. A gate electrode of the fourth transistor T4 is connected to the light-emitting control line EML (the first light-emitting control terminal EM1) to receive the light-emitting control signal EM1, a first electrode of the fourth transistor T4 is connected to the first power supply voltage terminal VDD to receive the first power supply voltage VDD, and a second electrode of the fourth transistor T4 is connected to the first terminal 122b (the second node N2) of the driving sub-circuit 122.

For example, the light-emitting element 120 is embodied as a light-emitting diode (LED), for example an organic light-emitting diode (OLED), a quantum dot light-emitting diode (QLED), or an inorganic light-emitting diode, such as a micro light-emitting diode (Micro LED) or a micro OLED. For example, the light-emitting element 120 is a top emitting structure, a bottom emitting structure, or a double-sided emitting structure. The light-emitting element 120 emits red light, green light, blue light or white light, and the like. The embodiments of the present disclosure do not limit the specific structure of the light-emitting element.

For example, a first electrode 134 (e.g., an anode) of the light-emitting element 120 is connected to the fourth node N4 and is configured to be connected to the second terminal 122c of the driving sub-circuit 122 through the second light-emitting control sub-circuit 124, and a second electrode 135 (e.g., a cathode) of the light-emitting element 120 is configured to be connected to the second power supply voltage terminal VSS to receive the second power supply voltage VSS. The current flowing into the light-emitting element 120 from the second terminal 122c of the driving sub-circuit 122 determines the brightness of the light-emitting element. For example, the second power supply voltage terminal is grounded, that is, VSS is at 0V. For example, the second voltage supply voltage VSS is a negative voltage.

For example, the second light-emitting control sub-circuit 124 is implemented as the fifth transistor T5. A gate electrode of the fifth transistor T5 is connected to the light-emitting control line EML (the second light-emitting control terminal EM2) to receive the second light-emitting control signal EM2, a second electrode of the fifth transistor T5 is connected to the second terminal 122c (third node N3) of the driving sub-circuit 122, and a first electrode of the fifth transistor T5 is connected to the first terminal 134 (fourth node N4) of the light-emitting element 120.

For example, the first reset sub-circuit 125 is implemented as the sixth transistor T6, and the second reset sub-circuit is implemented as the seventh transistor T7. A gate transistor of the sixth transistor T6 is configured to be connected to the first reset control terminal Rst1 to receive the first reset control signal Rst1, a first electrode of the sixth transistor T6 is connected to the first reset voltage terminal Vinit1 to receive the first reset voltage Vinit1, and a second electrode of the sixth transistor T6 is configured to be connected to the first node N1. A gate transistor of the seventh transistor T7 is configured to be connected to the second reset control terminal Rst2 to receive the second reset control signal Rst2, a first electrode of the seventh transistor T7 is connected to the second reset voltage terminal Vinit2 to receive the second reset voltage Vinit2, and a second electrode of the seventh transistor T7 is configured to be connected to the fourth node N4.

It should be noted that, the transistors used in the embodiments of the present disclosure for example are all thin film transistors, field effect transistors, or other switching devices with the same characteristics; and the thin film transistors are used as examples in the embodiments of the present disclosure. The source electrode and the drain electrode of the transistor used in the embodiments of the present disclosure for example is symmetrical in structure, so that the source electrode and the drain electrode is structurally indistinguishable. In the embodiments of the present disclosure, in order to distinguish the two electrodes of the transistor except the gate electrode, one electrode is directly described as the first electrode, and the other electrode is described as the second electrode.

In addition, the transistors is divided into N-type transistors or P-type transistors according to characteristics of the transistors. In a case where the transistor is a P-type transistor, turn-on voltage of the transistor is a low-level voltage (for example, 0V, -5V, -10V, or other appropriate voltage), and turn-off voltage of the transistor is a high-level voltage (for example, 5V, 10V, or other appropriate voltage). In a case where the transistor is an N-type transistor, turn-on voltage of the transistor is a high-level voltage (for example, 5V, 10V, or other appropriate voltage), and turn-off voltage of the transistor is a low-level voltage (for example, 0V, -5V, -10V, or other appropriate voltage). For example, as illustrated in FIG. 3B, the first to seventh transistors T1-T7 are all P-type transistors, such as low temperature polysilicon thin film transistors or low temperature polycrystalline oxide transistors, which will be described in detail later.

Figure 3C:
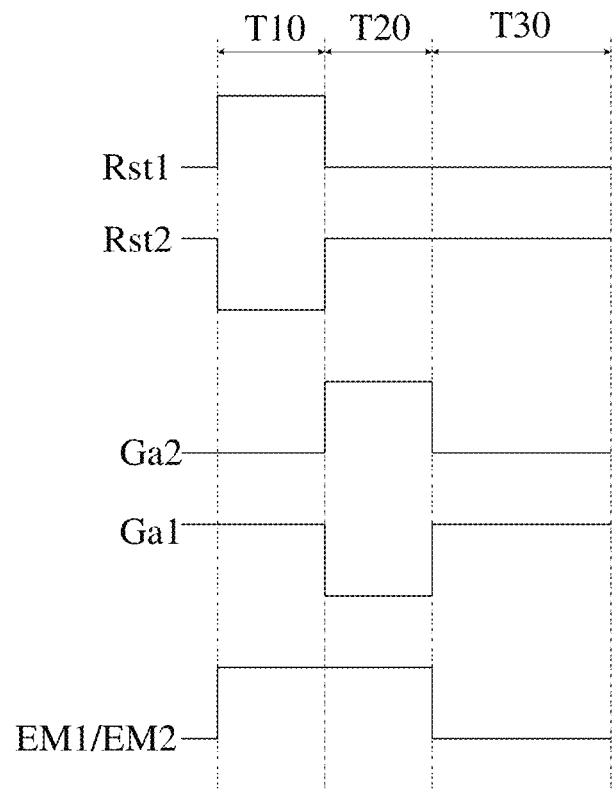
FIG. 3C is a timing signal view of the pixel driving circuit illustrated in FIG. 3B provided by at least one embodiment of the present disclosure.

FIG. 3C is a timing signal view of the pixel driving circuit illustrated in FIG. 3B provided by at least one embodiment of the present disclosure. The operation principle of the pixel driving circuit illustrated in FIG. 3B will be described below with reference to the timing signal view illustrated in FIG. 3C.

As illustrated in FIG. 3C, the display process of each frame of image includes three phases, which are an initialization phase T10, a data writing and compensation phase T20, and a light-emitting phase T30.

During the initialization phase T10, the first reset control signal Rst1 controls the sixth transistor T6 to be turned on, so as to provide the signal transmitted on the first reset signal RL1 (as illustrated in FIG. 2) to the gate electrode of the first transistor T1 to reset the gate electrode of the first transistor T1. The second reset control signal Rst2 controls the seventh transistor T7 to be turned on, so as to provide the signal transmitted on the second reset signal RL2 (as illustrated in FIG. 2) to the first terminal 134 of the light-emitting element 120 to reset the first terminal 134 of the light-emitting element 120. And, during this phase, the first scanning signal Ga1 controls the second transistor T2 to be turned off. The second scanning signal Ga2 controls the third transistor T3 to be turned off. The first light-emitting control signal EM1 or the second light-emitting control signal EM2 controls both the fourth transistor T4 and the fifth transistor T5 to be turned off.

During the data writing and compensation phase T20, the first scanning signal Ga1 controls the second transistor T2 to be turned on, and the second scanning signal Ga2 controls the third transistor T3 to be turned on, so that the data signal transmitted on the data line 11 charges the control terminal of the first transistor T1, so that the voltage of the control terminal of the driving transistor T1 becomes: Vdata+Vth, in which Vth represents the threshold voltage of the first transistor T1, and Vdata represents the voltage of the data signal. And, during this phase, the first reset control signal Rst1 controls the sixth transistor T6 to be turned off. The second reset control signal Rst2 controls the seventh transistors T7 to be turned off. The first light-emitting control signal EM1 or the second light-emitting control signal EM2 controls both the fourth transistor T4 and the fifth transistor T5 to be turned off.

During the light-emitting phase T30, the first light-emitting control signal EM1 or the second light-emitting control signal EM2 controls both the fourth transistor T4 and the fifth transistor T5 to be turned on. The fourth transistor T4 that is turned on provides the voltage Vdd of the first power supply voltage terminal VDD to the first terminal of the first transistor T1, so that the voltage of the first terminal of the first transistor T1 is Vdd. The driving transistor T1 generates a driving current according to the voltage Vdata+|Vth| of the gate electrode of the driving transistor T1 and the voltage Vdd of the first electrode. The driving current is supplied to the light-emitting element 120 through the fifth transistor T5 that is turned on, thereby driving the light-emitting element 120 to emit light. Moreover, during this phase, the first reset control signal Rst1 controls the sixth transistor T6 to be turned off, and the second reset control signal Rst2 controls the seventh transistor T7 to be turned off. The first scanning signal Ga1 controls the second transistor T2 to be turned off, and the second scanning signal Ga2 controls the third transistor T3 to be turned off.

Figure 5A:
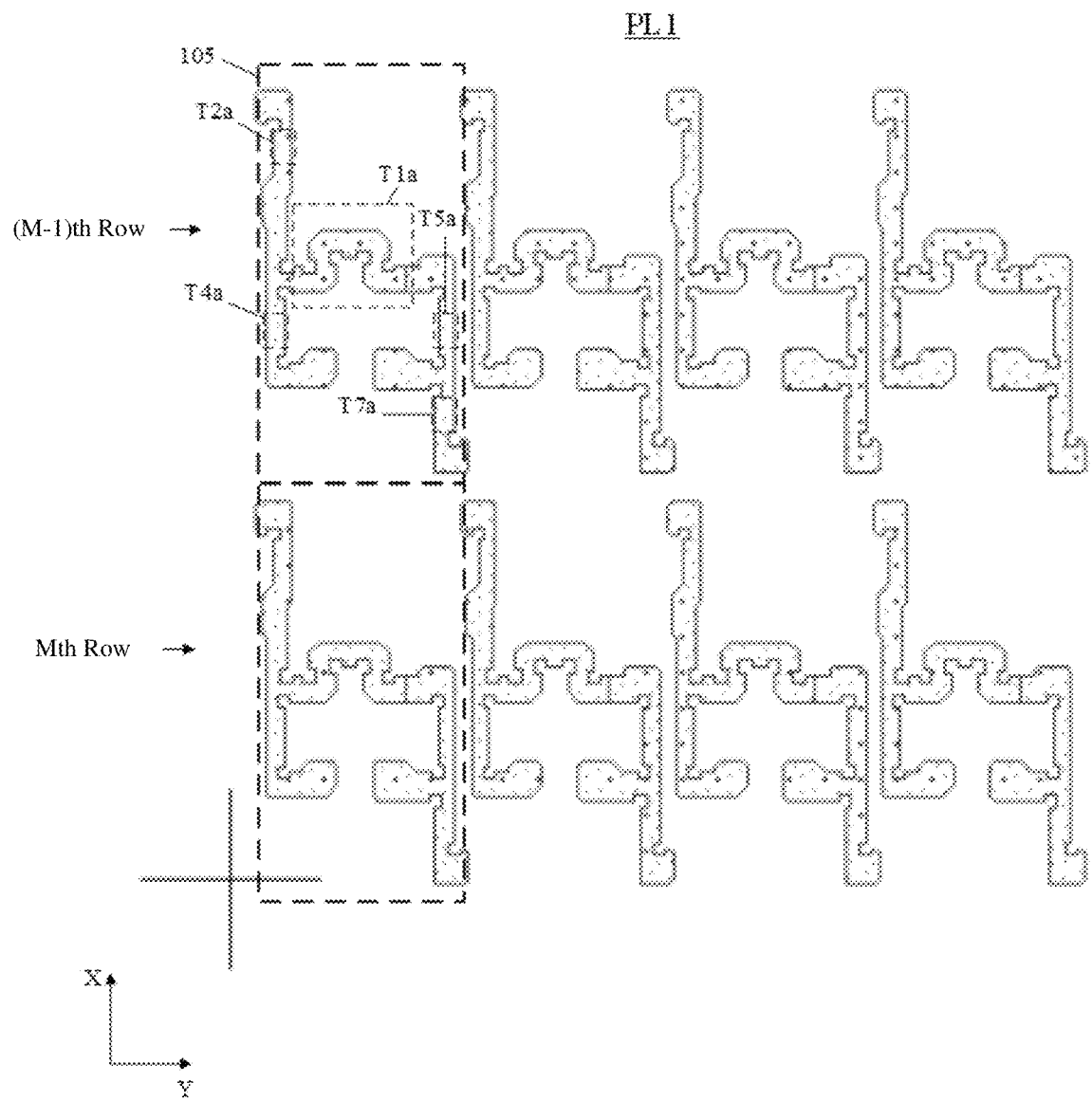
FIG. 5A is a schematic layout view of a first semiconductor layer of the display substrate provided by at least one embodiment of the present disclosure.
Figure 5B:
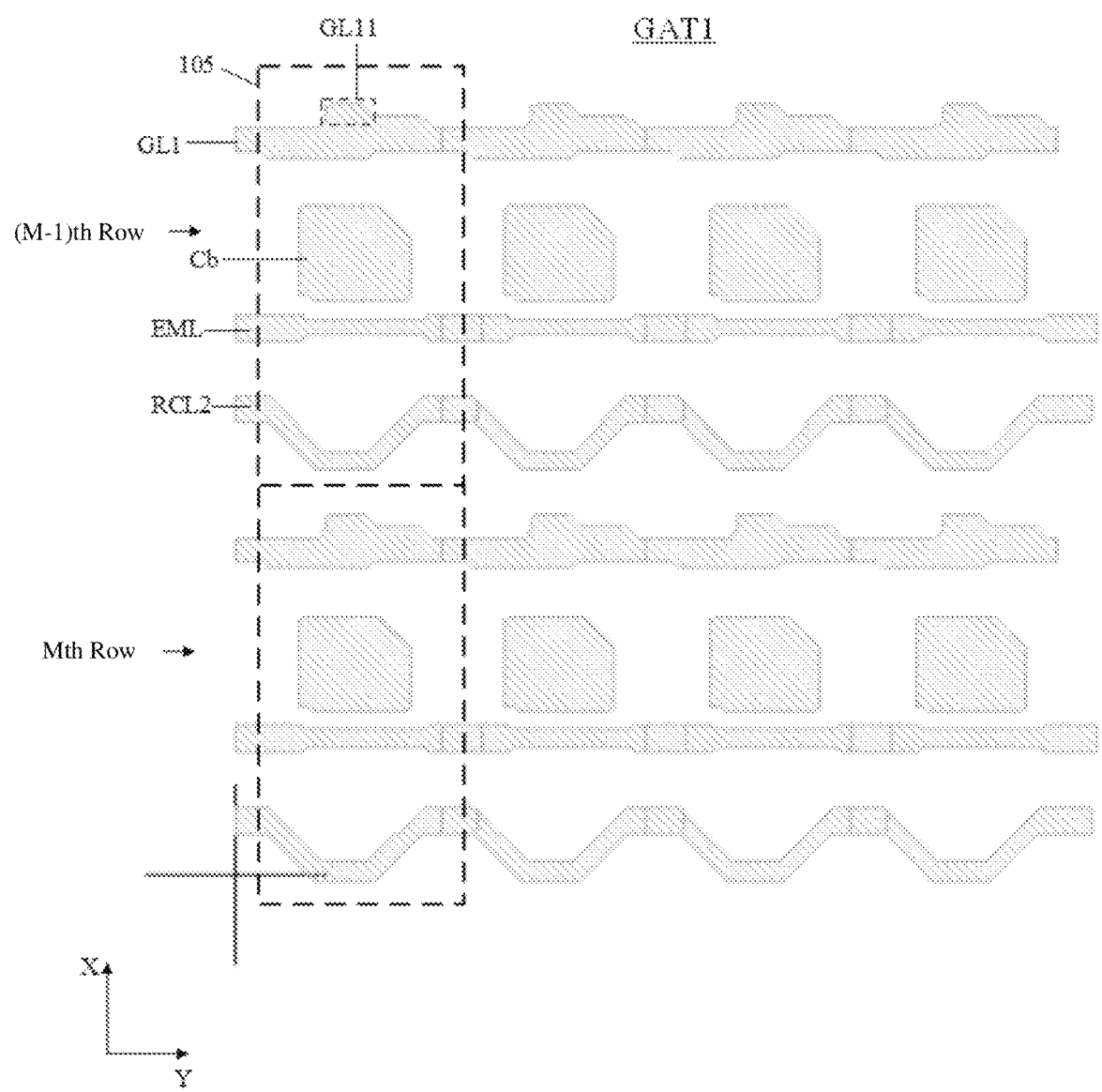
FIG. 5B is a schematic layout view of a first metal layer of the display substrate provided by at least one embodiment of the present disclosure.
Figure 5C:
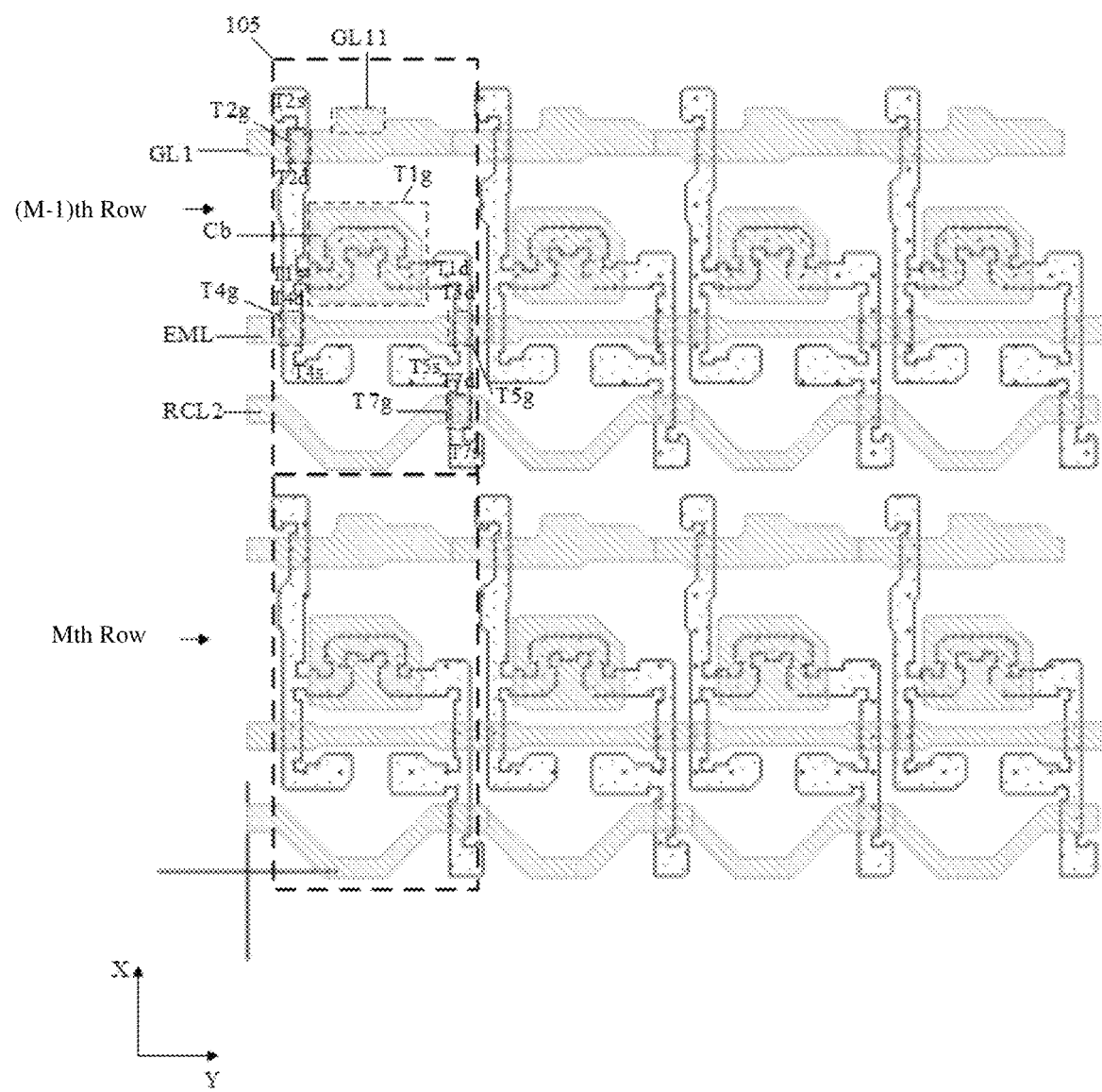
FIG. 5C is a schematic layout view obtained by stacking the layers of FIG. 5A and FIG. 5B.
Figure 6A:
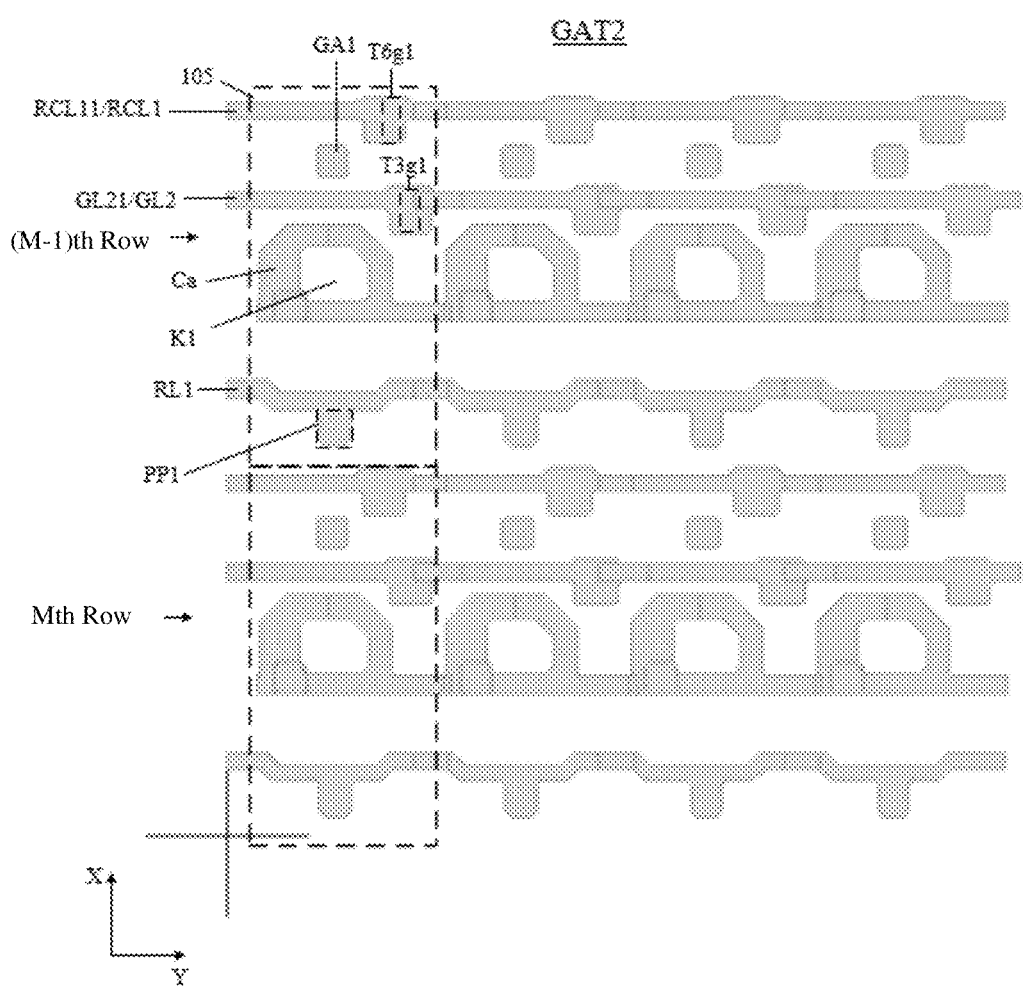
FIG. 6A is a schematic layout view of a second metal layer of the display substrate provided by at least one embodiment of the present disclosure.
Figure 6B:
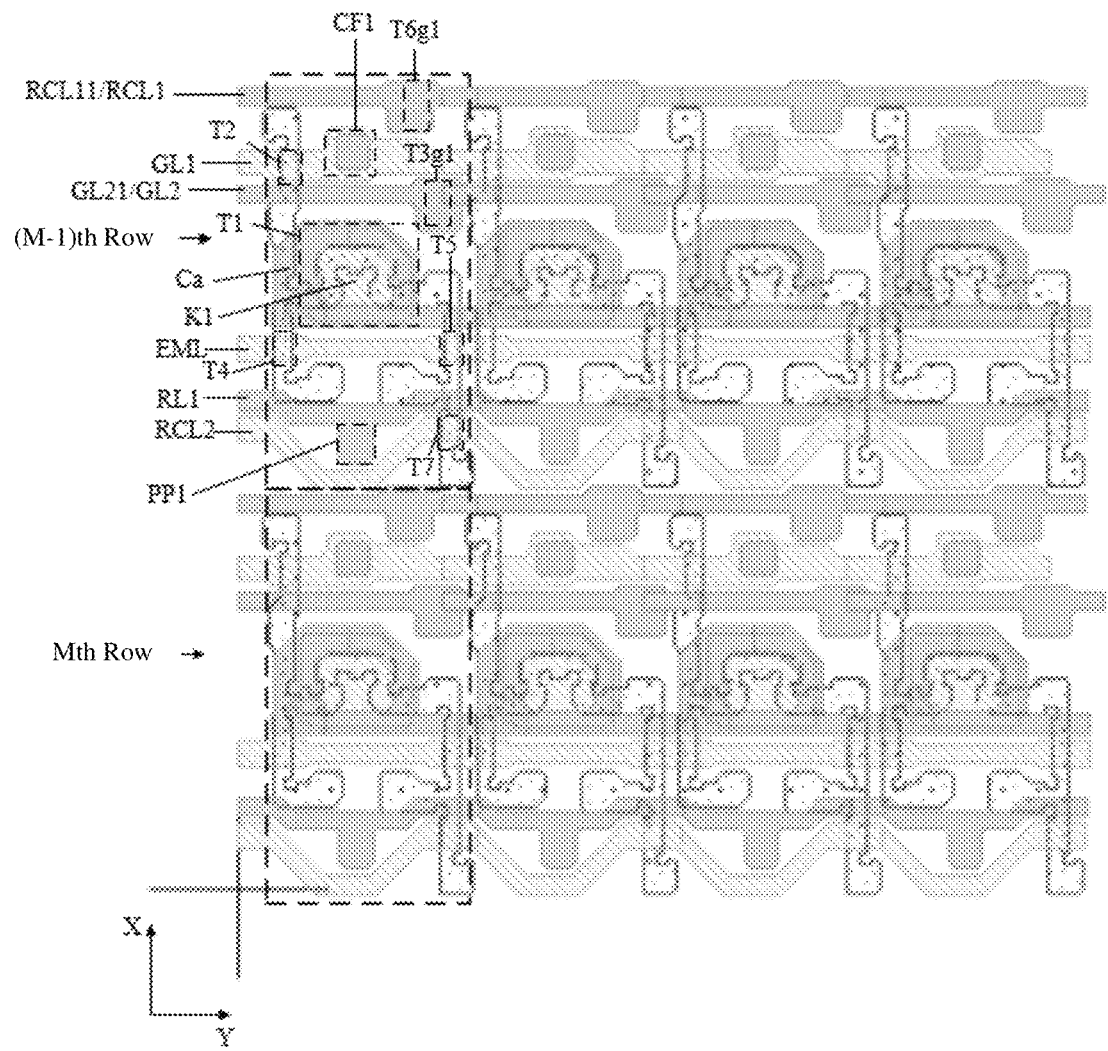
FIG. 6B is a schematic layout view obtained by stacking the layers of FIG. 5A, FIG. 5B and FIG. 6A.

FIG. 4A is a schematic cross-sectional view along a section line A1-B1 in FIG. 2 provided by at least one embodiment of the present disclosure. FIG. 5A is a schematic layout view of a first semiconductor layer of the display substrate provided by at least one embodiment of the present disclosure. FIG. 5B is a schematic layout view of a first metal layer of the display substrate provided by at least one embodiment of the present disclosure. FIG. 5C is a schematic layout view obtained by stacking the layers of FIG. 5A and FIG. 5B. FIG. 6A is a schematic layout view of a second metal layer of a display substrate provided by at least one embodiment of the present disclosure. FIG. 6B is a schematic layout view obtained by stacking the layers of FIG. 5A, FIG. 5B and FIG. 6A.

For convenience of description, in the following description, Tng, Tns, Tnd, and Tna are used to represent a gate electrode, a first electrode, a second electrode and a channel region of an (n)th transistor Tn, respectively, where n is 1-7.

It should be noted that "provided in a same layer" described in the embodiments of the present disclosure refers to two (or more than two) structures, which are provided in a same layer, are formed by the same deposition process and patterned by the same patterning process, and materials of the two structures are the same or different. The "integrated structure" in the present disclosure refers to two (or more than two) structures, which are integrated, are formed by the same deposition process and patterned by the same patterning process and are connected to each other, and materials of the two structures are the same or different.

For example, in some embodiments, as illustrated in FIG. 4A and FIG. 5A, the display substrate 1 further includes a first semiconductor layer PL1, a first insulating layer 142 (a first gate insulating layer), a second insulating layer 143 (a second gate insulating layer) and a third insulating layer 144 (a first interlayer insulating layer) on the base substrate 10. A plan layout view of the first semiconductor layer PL1 is illustrated in FIG. 5A. The semiconductor layer in each pixel driving circuit 105 is integrally provided. The first semiconductor layer PL1 includes an active layer T1a of the first transistor T1, an active layer T2a of the second transistor T2, an active layer T4a of the fourth transistor T4, an active layer T5a of the fifth transistor T5, and an active layer T7a of the seventh transistor T7. Parts shown by small dotted boxes in the figure respectively are the channel regions of the first transistor T1, the second transistor T2, the fourth transistor T4, the fifth transistor T5 and the seventh transistor T7, for example, these parts are respectively at a position overlapping with a gate electrode layer. The active layers of the above transistors are connected into an integrated structure.

For example, the material of the first semiconductor layer PL1 includes polysilicon.

For example, as illustrated in FIG. 5B and FIG. 6A, the display substrate 1 further includes a first metal layer GAT1 (a first gate electrode layer) and a second metal layer GAT2 (a second gate electrode layer). FIG. 5B is a schematic layout view of the first metal layer GAT1, and FIG. 6A is a schematic layout view of the second metal layer GAT2.

FIG. 4A illustrates a schematic cross-sectional view of a partial structure of the transistor T7. As illustrated in FIG. 4A, the first insulating layer 142 is located on the base substrate 10, the second insulating layer 143 is located on the side of the first insulating layer 142 away from the base substrate 10, and the first semiconductor layer PL1 is located between the first insulating layer 142 and the second insulating layer 143. The third insulating layer 144 is located on the side of the second insulating layer 143 away from the base substrate 10, the first metal layer GAT1 is located between the first insulating layer 142 and the second insulating layer 143, and the second metal layer GAT2 is located between the second insulating layer 143 and the third insulating layer 144.

For example, the material of the first semiconductor layer PL1 includes polysilicon or an oxide semiconductor (e.g., indium gallium zinc oxide).

For example, the base substrate 10 is a glass plate, a quartz plate, a metal plate, a resin-based plate, or the like. For example, the material of the base substrate includes an organic material, for example, the organic material is a resin material such as polyimide, polycarbonate, polyacrylate, polyetherimide, polyethersulfone, polyethylene terephthalate, polyethylene naphthalate, and the like. For example, the base substrate 10 is a flexible substrate or a non-flexible substrate, which is not limited in the embodiments of the present disclosure.

For example, materials of one or more of the first insulating layer 142, the second insulating layer 143 and the third insulating layer 144 include an insulating material such as silicon oxide, silicon nitride, silicon oxynitride, and the like. The materials of the first insulating layer 142, the second insulating layer 143 and the third insulating layer 144 are the same or different.

For example, the materials of the first metal layer GAT1 and the second metal layer GAT2 include metal materials or alloy materials, such as a metal single-layer or multi-layer structure formed by molybdenum, aluminum and titanium, for example, the multi-layer structure is a structure in which multiple metal layers are stacked (such as three-layer metal stack of titanium, aluminum and titanium (Ti/Al/Ti)).

For example, in some embodiments, as illustrated in FIG. 5B and FIG. 5C, the first metal layer GAT1 includes the gate electrode T1g of the first transistor T1, the gate electrode T2g of the second transistor T2, the gate electrode T4g of the fourth transistor T4, the gate electrode T5g of the fifth transistor T5 and the gate electrode T7g of the seventh transistor T7, which are respectively illustrated in the dotted boxes in FIG. 5C. The position of the gate electrode of the transistor is the position where the first metal layer GAT1 overlaps with the first semiconductor layer PL1. That is, the gate electrode of the transistor blocks the channel region of the transistor.

For example, as illustrated in FIG. 5C, the first metal layer GAT1 further includes the first capacitor electrode Cb of the storage capacitor Cst. For example, the display substrate 1 adopts a self-alignment process, and uses the first metal layer GAT1 as a mask to perform conductive treatment (e.g., doping treatment) on the first semiconductor layer PL1, so that the part of the first semiconductor layer PL1 that is not covered by the first metal layer GAT1 is conductive, thus the part of the active layer of each transistor located on both sides of the channel region is conductive to form the first electrode and the second electrode of the transistor, respectively.

For example, in some embodiments, the first reset signal line RL1 illustrated in FIG. 2A is located in the first metal layer GAT1, and the second reset signal line RL2 is located in the second metal layer GAT2.

Figure 7A:
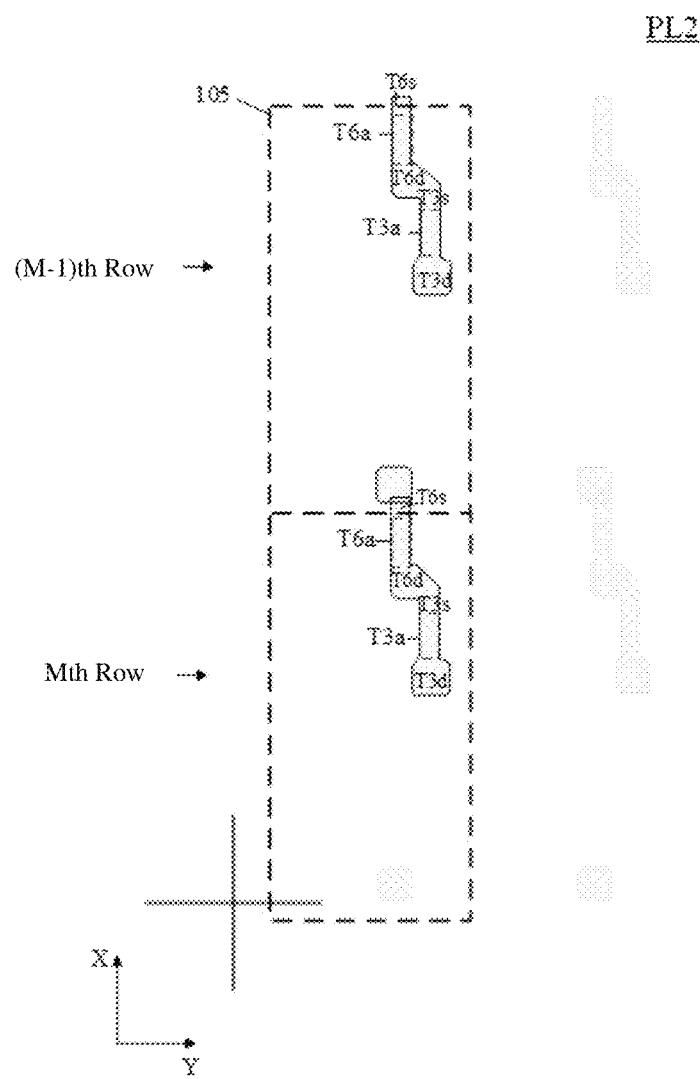
FIG. 7A is a schematic layout view of a second semiconductor layer of the display substrate provided by at least one embodiment of the present disclosure.
Figure 7B:
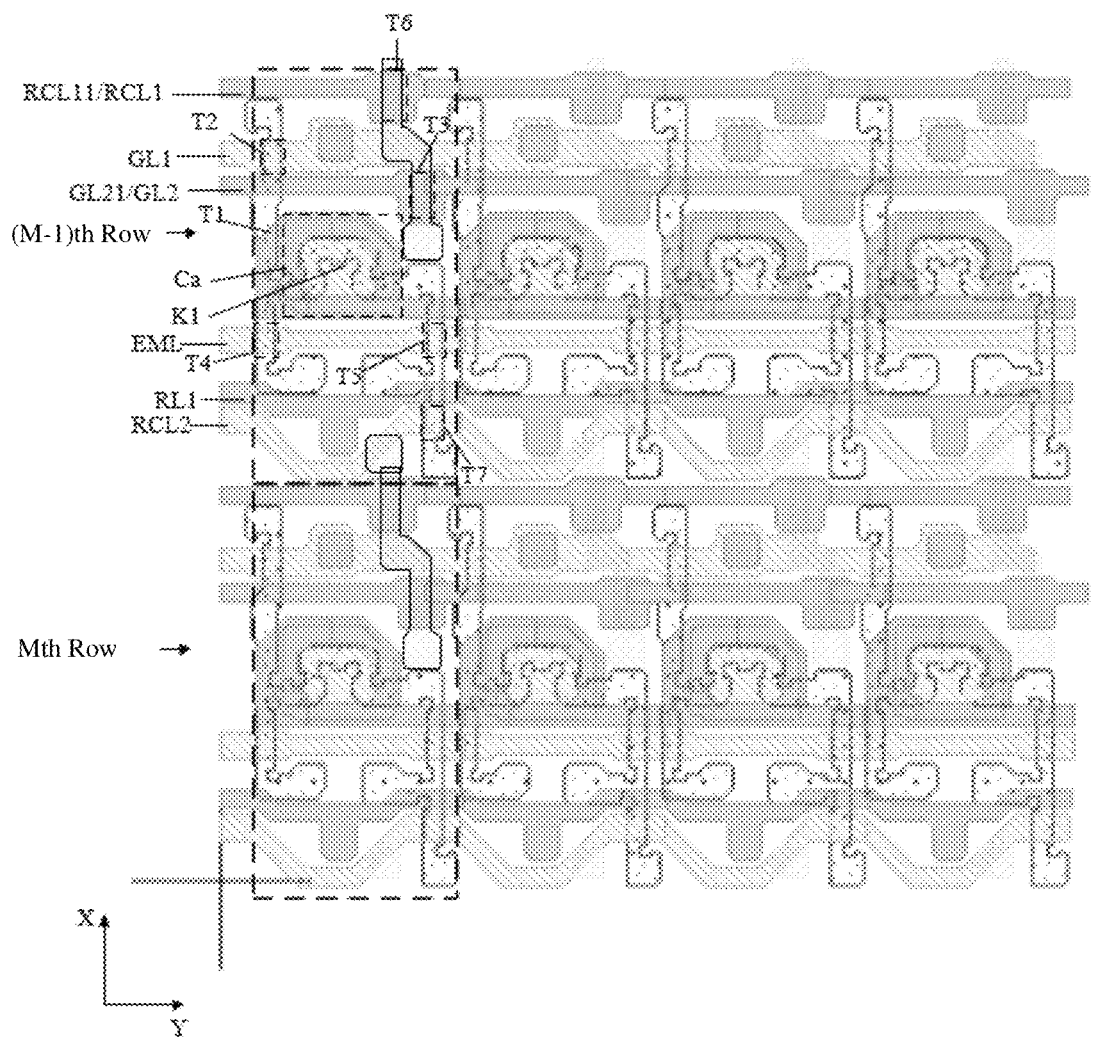
FIG. 7B is a schematic layout view obtained by stacking the layers of FIG. 5A, FIG. 5B, FIG. 6A and FIG. 7A.
Figure 8A:
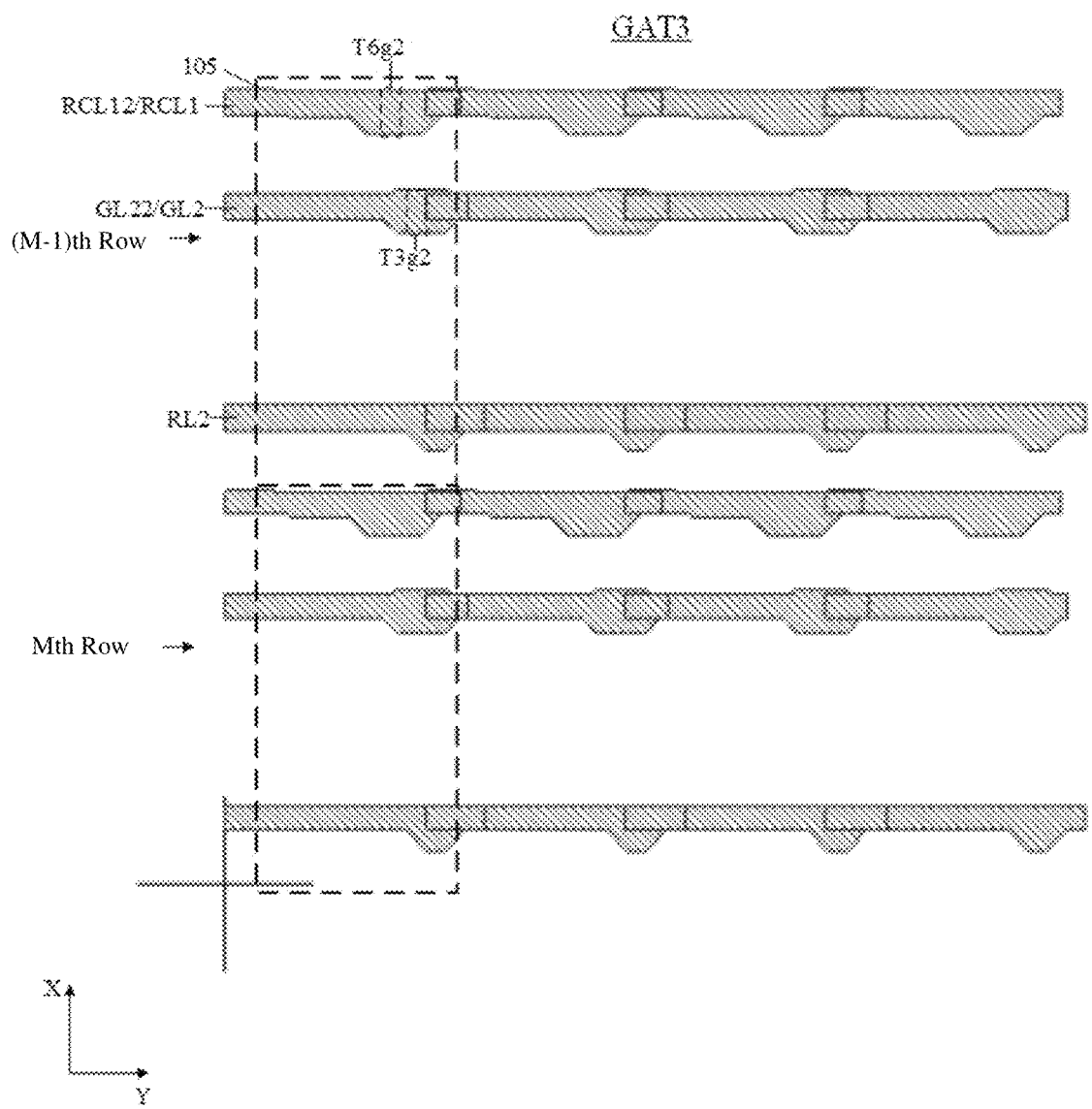
FIG. 8A is a schematic layout view of a third metal layer of the display substrate provided by at least one embodiment of the present disclosure.
Figure 8B:
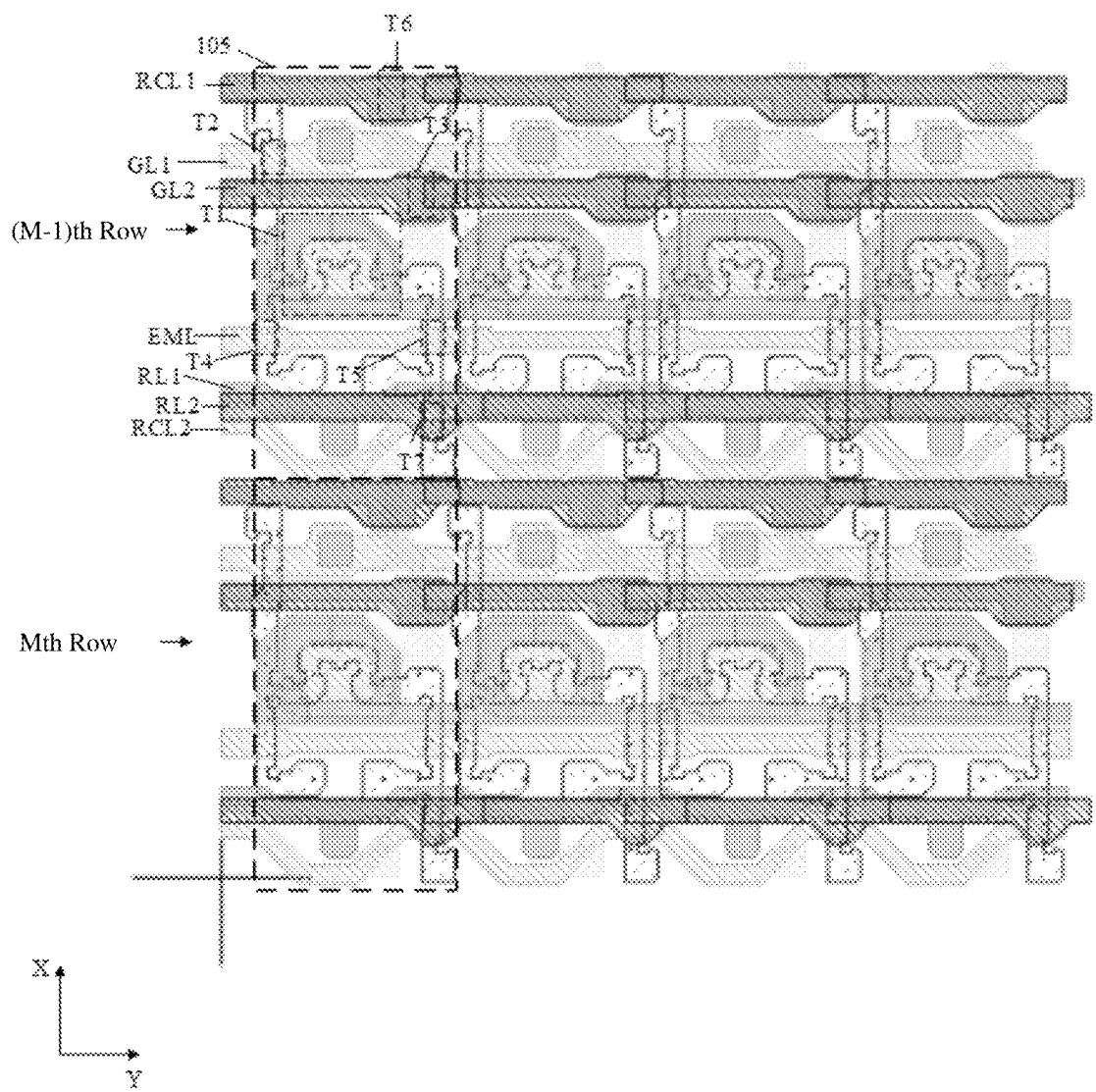
FIG. 8B is a schematic layout view obtained by stacking the layers of FIG. 5A, FIG. 5B, FIG. 6A, FIG. 7A and FIG. 8A.

FIG. 7A is a schematic layout view of a second semiconductor layer of the display substrate provided by at least one embodiment of the present disclosure. FIG. 7B is a schematic layout view obtained by stacking the layers of FIG. 5A, FIG. 5B, FIG. 6A and FIG. 7A. FIG. 8A is a schematic layout view of a third metal layer of the display substrate provided by at least one embodiment of the present disclosure. FIG. 8B is a schematic layout view obtained by stacking the layers of FIG. 5A, FIG. 5B, FIG. 6A, FIG. 7A and FIG. 8A.

For example, in some embodiments, as illustrated in FIG. 8A, the display substrate 1 further includes a third metal layer GAT3. As illustrated in FIG. 4A, the third metal layer GAT3 is located on the side of the third insulating layer 144 away from the base substrate 10.

For example, in some embodiments, the first electrode plate and the second electrode plate of the storage capacitor are respectively located in two of the first metal layer, the second metal layer and the third metal layer. For example, the first reset signal line is located in the second metal layer, and the second reset signal line is located in the third metal layer; or, the first reset signal line is located in the first metal layer, and the second reset signal line is located in the third metal layer; or, the first reset signal line is located in the first metal layer, and the second reset signal line is located in the second metal layer. Thereby, the above components are flexibly arranged according to the wiring space of the display substrate.

The embodiments of the present disclosure are described by taking an example in which the first electrode plate of the storage capacitor is located in the first metal layer, the second electrode plate is located in the second metal layer, the first reset signal line is located in the second metal layer, and the second reset signal line is located in the third metal layer, but the embodiments of the present disclosure are not limited thereto.

For example, as illustrated in FIG. 5B, the first metal layer GAT1 includes the first electrode plate Cb of the storage capacitor Cst.

For example, as illustrated in FIG. 6A, the second metal layer GAT2 includes the first reset signal line RL1. One first reset signal line RL1 extending along the first direction Y is provided in each row of pixel driving circuits 105. FIG. 5B illustrates the first reset signal line RL1 located in the pixel driving circuits 105 in the (M−1)th row and the first reset signal line RL1 located in the pixel driving circuits 105 in the (M)th row.

For example, as illustrated in FIG. 8A, the third metal layer GAT3 includes the second reset signal line RL2. One second reset signal line RL2 extending along the first direction Y is provided in each row of the pixel driving circuits 105. FIG. 8A illustrates the second reset signal line RL2 located in the pixel driving circuits 105 in the (M−1)th row and the second reset signal line RL2 located in the pixel driving circuits 105 in the (M)th row. As illustrated in FIG. 8A, the orthographic projections of the first reset signal line RL1 and the second reset signal line RL2, which are located in the same row of pixel driving circuits 105, on the base substrate 10 at least partially overlap with each other to reduce wiring space.

Figure 4C:
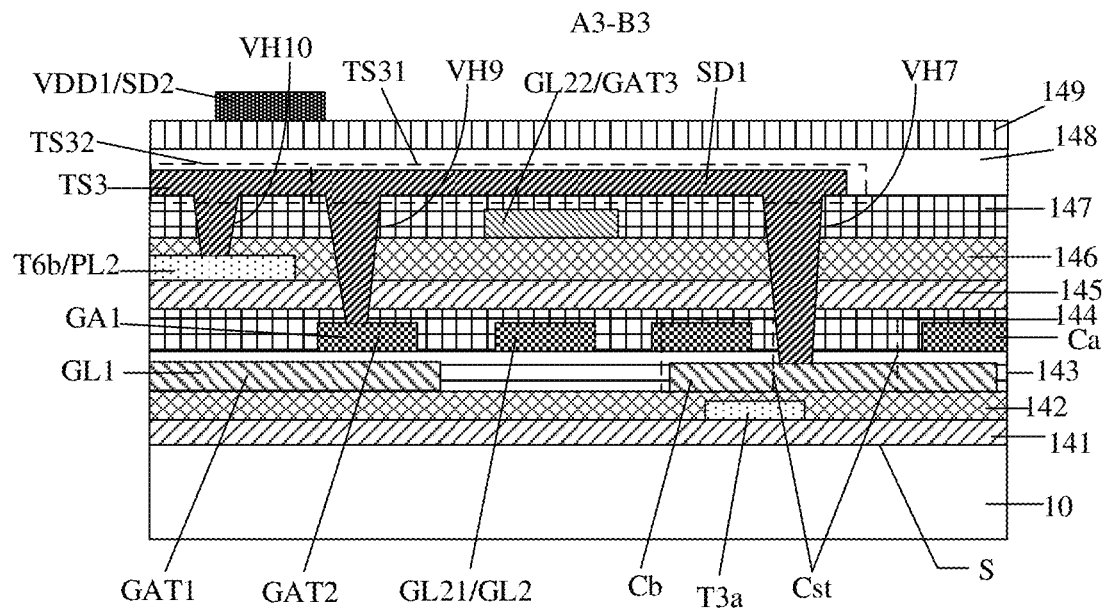
FIG. 4C is a schematic cross-sectional view along a section line A3-B3 in FIG. 2 provided by at least one embodiment of the present disclosure.

FIG. 4B is a schematic cross-sectional view along a section line A2-B2 in FIG. 2 provided by at least one embodiment of the present disclosure, and the section line A2-B2 passes through the sixth transistor T5 in FIG. 2. FIG. 4C is a schematic cross-sectional view along a section line A3-B3 in FIG. 2 provided by at least one embodiment of the present disclosure, and the section line A3-B3 passes through the first transistor T1 in FIG. 2.

For example, in some embodiments, as illustrated in FIG. 4A, FIG. 4B and FIG. 4C, the display substrate 1 further includes a fourth insulating layer 147 (a second interlayer insulating layer), and the fourth insulating layer 147 is located on the side of the third insulating layer 144 away from the base substrate 10.

For example, in some embodiments, as illustrated in FIG. 14A, the display substrate 1 further includes a fourth metal layer SD2. The fourth metal layer SD2 is located on the side of the fourth insulating layer 147 away from the base substrate 10. The first power supply voltage line VDD1 is located in the fourth metal layer SD2. It should be noted that the first power supply voltage line VDD1 may be provided in other metal layers according to the needs of the wiring design of the display substrate, and the embodiments of the present disclosure are not limited to this.

For example, as illustrated in FIG. 7A, the display substrate 1 further includes a second semiconductor layer PL2. A portion of the second semiconductor layer PL2 where the orthographic projection of the second semiconductor layer PL2 on the base substrate does not overlap with the orthographic projections of the second metal layer (as illustrated in FIG. 6A) and the third metal layer (as illustrated in FIG. 8A) on the base substrate 10 is conductive to form the first electrode T3s and the second electrode T3d of the third transistor T3, and the first electrode T6s and the second electrode T6d of the sixth transistor T6.

For example, the material of the second semiconductor layer PL2 includes an oxide semiconductor material (e.g., indium gallium zinc oxide).

For example, as illustrated in FIG. 5C, a portion of the first semiconductor layer PL1 where the orthographic projection of the first semiconductor layer PL1 on the base substrate 10 does not overlap with the orthographic projection of the first metal layer GAT1 on the base substrate 10 is conductive to form the first electrode T1s and the second electrode T1d of the first transistor T1, the first electrode T2s and the second electrode T2d of the second transistor T2, the first electrode T4s and the second electrode T4d of the fourth transistor T4, the first electrode T5s and the second electrode T5d of the fifth transistor T5, and the first electrode T7s and the second electrode T7d of the seventh transistor T7.

For example, as illustrated in FIG. 4B and FIG. 4C, the display substrate 1 further includes a fifth insulating layer 146 (a third gate insulating layer). The second semiconductor layer PL2 is located between the third insulating layer 144 and the third metal layer GAT3, and the fifth insulating layer 146 is located between the second semiconductor layer PL2 and the third metal layer GAT3.

For example, as illustrated in FIG. 6A, the second metal layer GAT2 further includes the second electrode plate Cb of the storage capacitor Cst, a first gate electrode T3g1 of the third transistor T3 and a first gate electrode T6g1 of the sixth transistor T6. As illustrated in FIG. 7B, a portion of the second metal layer GAT2 overlapping with the second semiconductor layer PL2 constitutes the first gate electrode T3g1 of the third transistor T3 and the first gate electrode T6g1 of the sixth transistor T6.

For example, as illustrated in FIG. 7A and FIG. 7B, the second semiconductor layer PL2 includes an active layer T3a of the third transistor T3 and an active layer T6a of the sixth transistor T6. A portion of the second semiconductor layer PL2 overlapping the second metal layer GAT2 or the third metal layer GAT3 constitutes the active layer T3a of the third transistor T3 and the active layer T6a of the sixth transistor T6.

For example, as illustrated in FIG. 8A and FIG. 8B, the third metal layer GAT3 includes a second gate electrode T3g2 of the third transistor T3 and a second gate electrode T6g2 of the sixth transistor T6. In FIG. 8B, a portion of the third metal layer GAT3 overlapping the second semiconductor layer PL2 constitutes the second gate electrode T3g2 of the third transistor T3 and the second gate electrode T6g2 of the sixth transistor T6.

For example, as illustrated in FIG. 7A, FIG. 7B and FIG. 8B, the third transistor T3 includes two gate electrodes. The first gate electrode T3g1 of the third transistor T3 is located on the side of the second semiconductor layer PL2 close to the base substrate 10, and the second gate electrode T3g2 of the third transistor T3 is located on the side of the second semiconductor layer PL2 away from the base substrate 10. The sixth transistor T6 includes two gate electrodes. The first gate electrode T6g1 of the sixth transistor T6 is located on the side of the second semiconductor layer PL2 close to the base substrate 10, and the second gate electrode T6g2 of the sixth transistor T6 is located on the side of the second semiconductor layer PL2 away from the base substrate 10. The third transistor T3 and the sixth transistor T6 are transistors of TLPO type, so that they have better anti-leakage performance. For example, the third transistor T3 is implemented as a dual gate structure, so as to improve the switching capability of the third transistor T3 and prevent leakage current from occurring in an off state of the third transistor T3. For example, the sixth transistor T6 is implemented as a dual gate structure, so as to improve the switching capability of the sixth transistor T6 and prevent leakage current from occurring in an off state of the sixth transistor T6. The dual gate structure is adopted to improve the gate control capability of the third transistor T3 and the sixth transistor T6, which is helpful to reduce the leakage current of the transistors, so as to maintain the voltage of N1 node and improve the display uniformity of the display substrate in the light-emitting phase.

For example, in some embodiments, as illustrated in FIG. 6B and FIG. 8A, the orthographic projection of the first gate electrode T3g1 of the third transistor T3 on the base substrate at least partially overlaps with the orthographic projection of the second gate electrode T3g2 of the third transistor T3 on the base substrate, so as to reduce the wiring space of the display substrate 1. The orthographic projection of the first gate electrode T6g1 of the sixth transistor T6 on the base substrate at least partially overlaps with the orthographic projection of the second gate electrode T6g2 of the sixth transistor T6 on the base substrate, so as to reduce the wiring space of the display substrate 1.

For example, in some embodiments, as illustrated in FIG. 14A, the bent portion VDD10 of the first power supply voltage line VDD1 includes a first portion VDD11 and a second portion VDD12 respectively extending along the second direction X, and a third portion VDD13 extending along the first direction Y, the third portion VDD13 connects the first portion VDD11 and the second portion VDD12. For example, the first power supply voltage line VDD1 is like an "S-shaped" bent line.

For example, in some embodiments, as illustrated in FIG. 2 and FIG. 4B, the orthographic projection of the first portion VDD11 on the base substrate 10 overlaps with the orthographic projections of the first gate electrode T3g1 of the third transistor T3, the second gate electrode T3g2 of the third transistor T3, the first gate electrode T6g1 of the sixth transistor T6 and the second gate electrode T6g2 of the sixth transistor T6, so that the third transistor T3 and the sixth transistor T6 are shielded by the first power supply voltage line VDD to prevent the generation of leakage current.

Figure 9A:
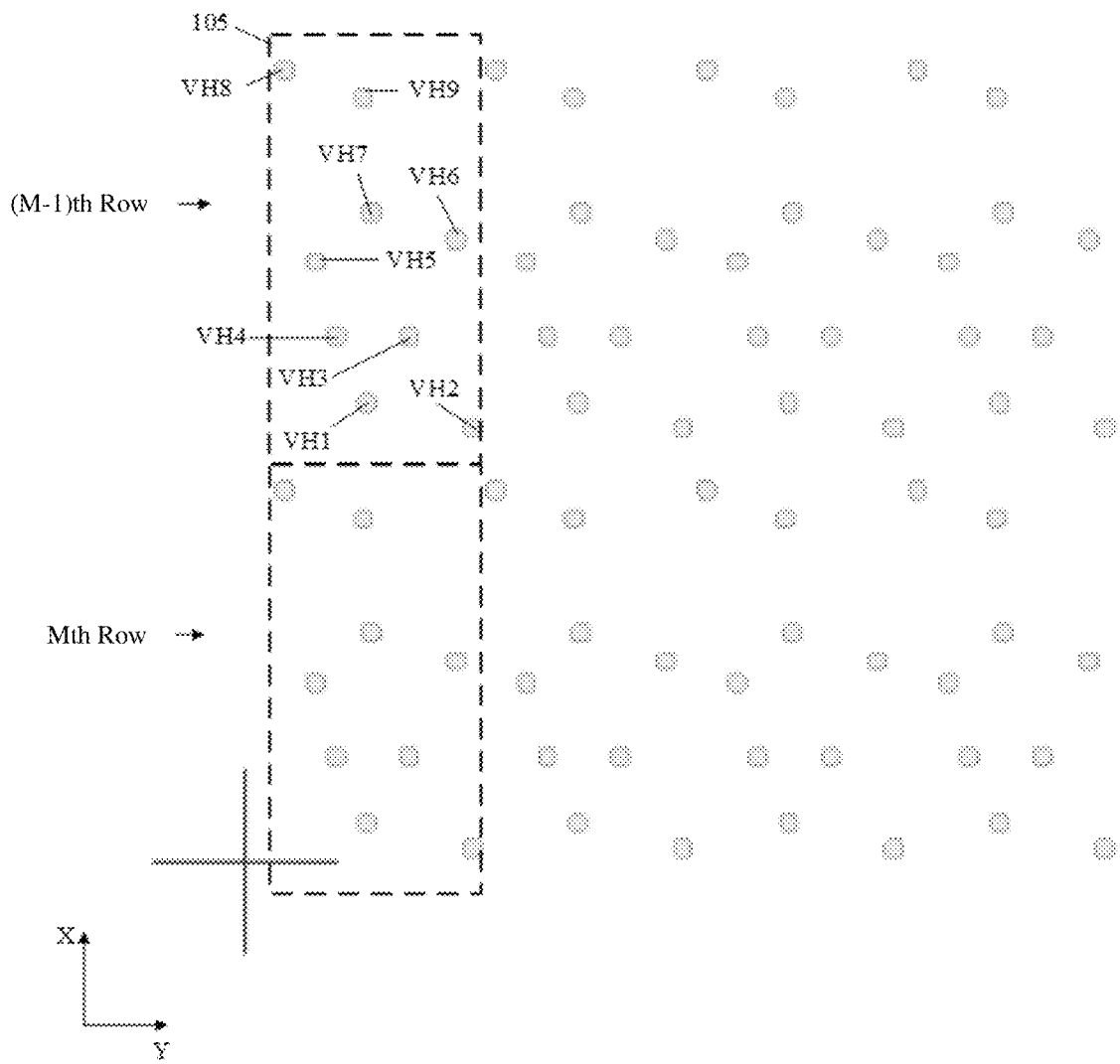
FIG. 9A is a schematic layout view of via holes in at least one insulating layer of the display substrate provided by at least one embodiment of the present disclosure.
Figure 9B:
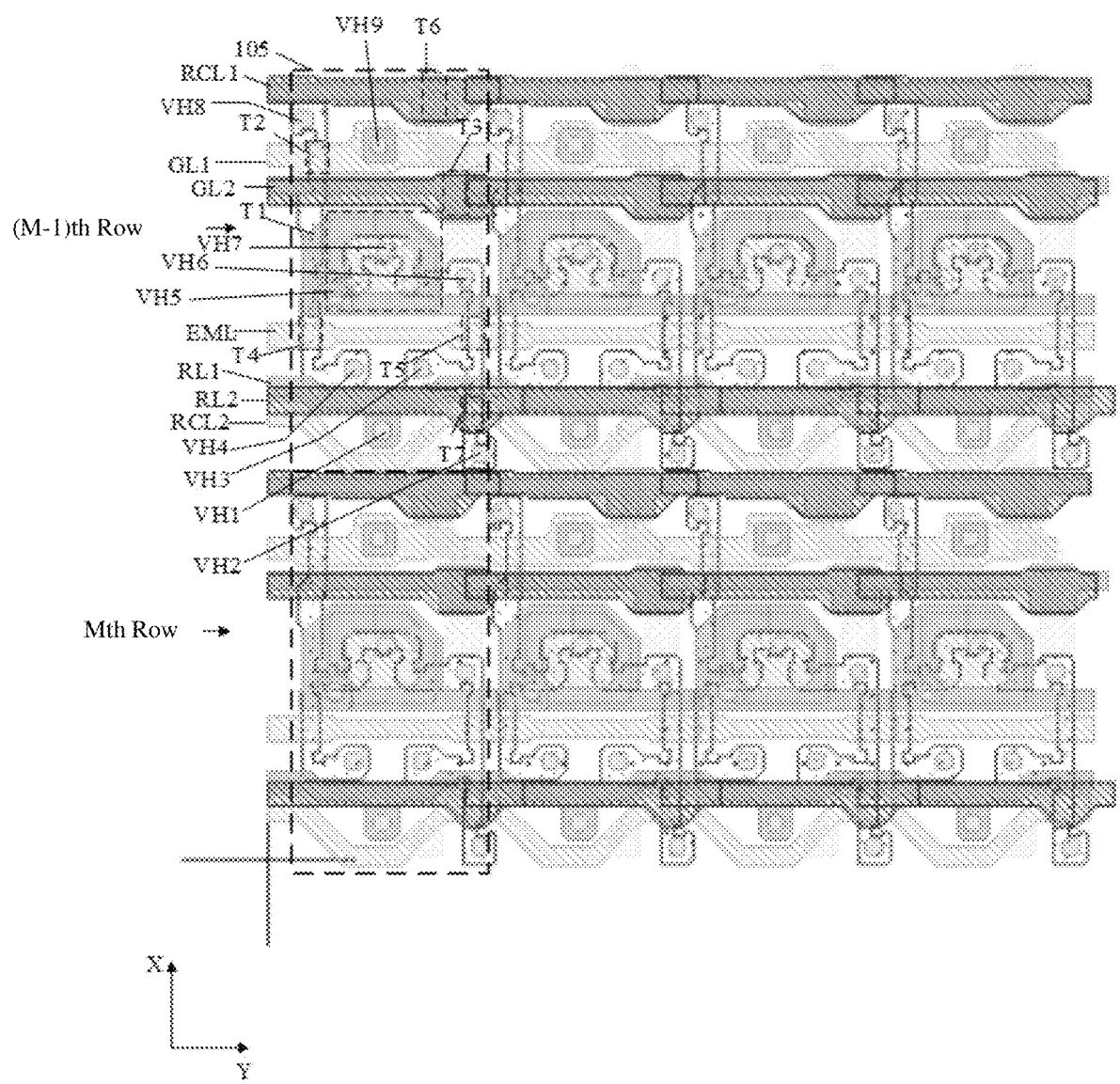
FIG. 9B is a schematic layout view obtained by stacking the layers of FIG. 5A, FIG. 5B, FIG. 6A, FIG. 7A, FIG. 8A and FIG. 9A.
Figure 10A:
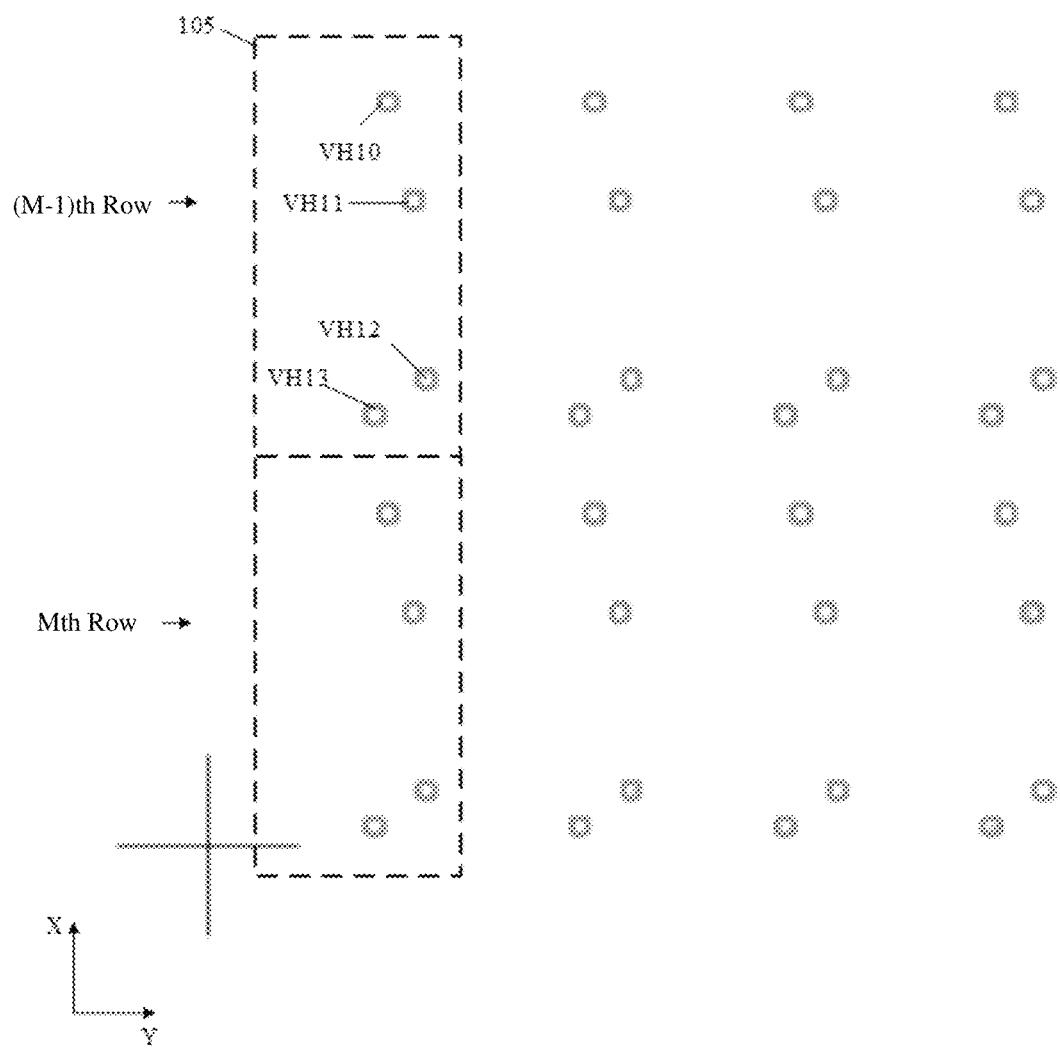
FIG. 10A is a schematic layout view of via holes in at least another insulating layer of the display substrate provided by at least one embodiment of the present disclosure.
Figure 10B:
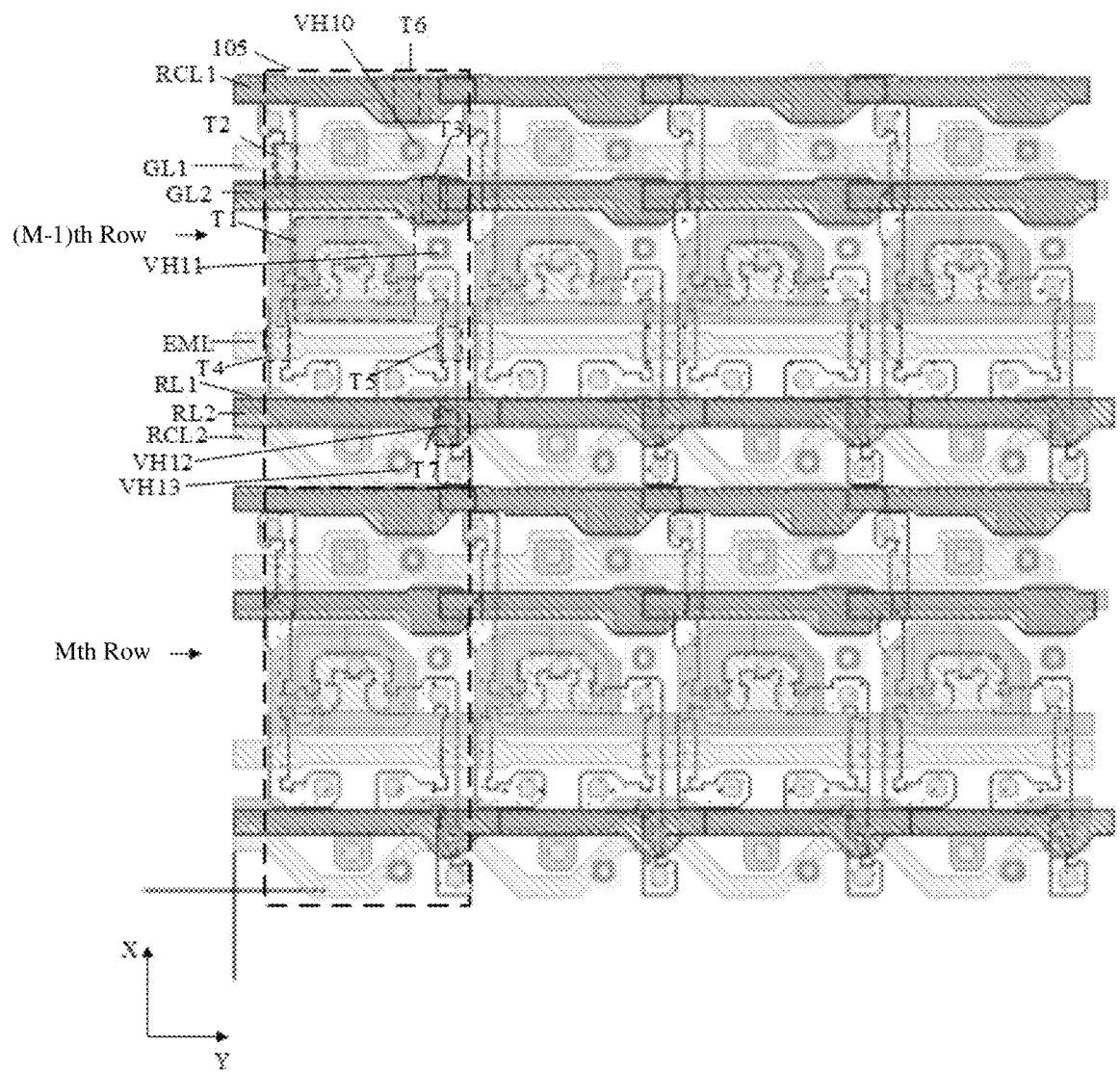
FIG. 10B is a schematic layout view obtained by stacking the layers of FIG. 5A, FIG. 5B, FIG. 6A, FIG. 7A, FIG. 8A, FIG. 9A and FIG. 10A.
Figure 11A:
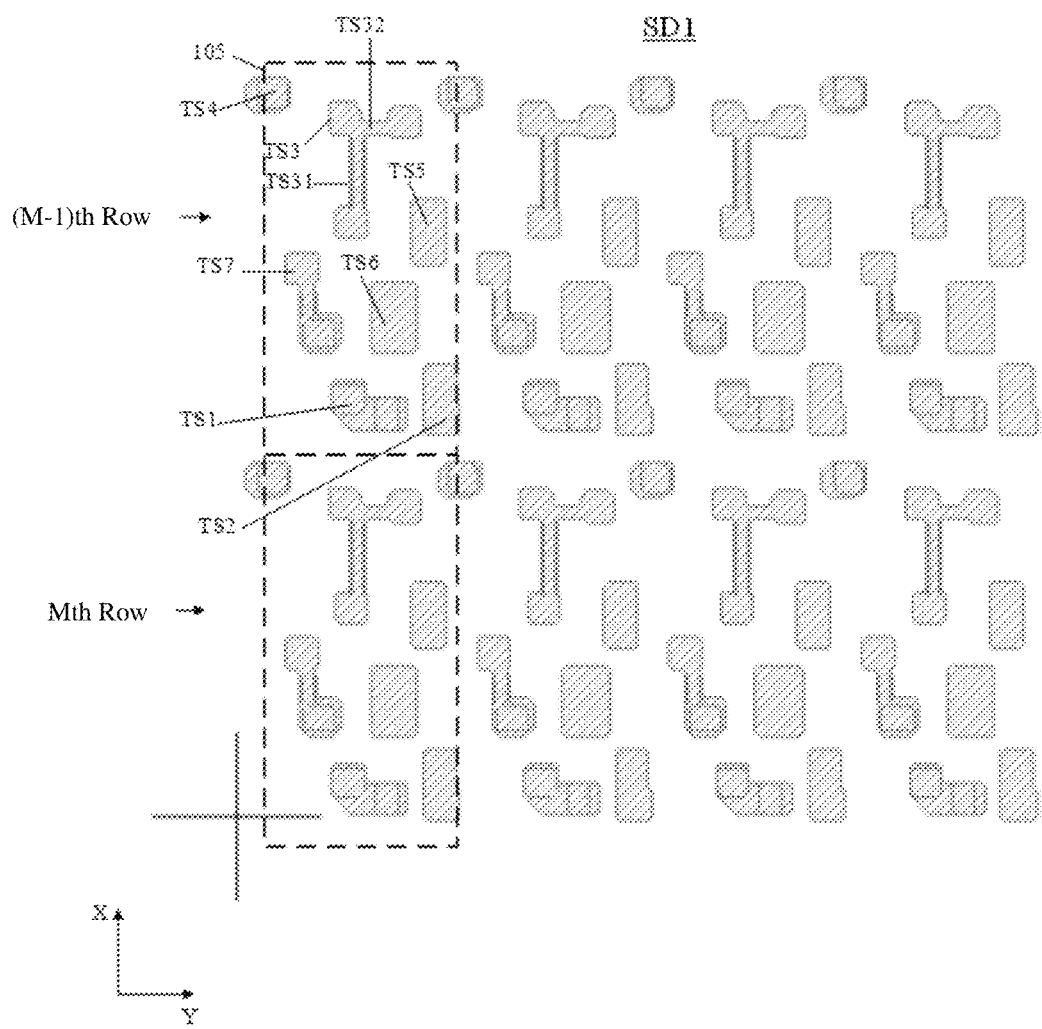
FIG. 11A is a schematic layout view of a fifth metal layer of the display substrate provided by at least one embodiment of the present disclosure.
Figure 11B:
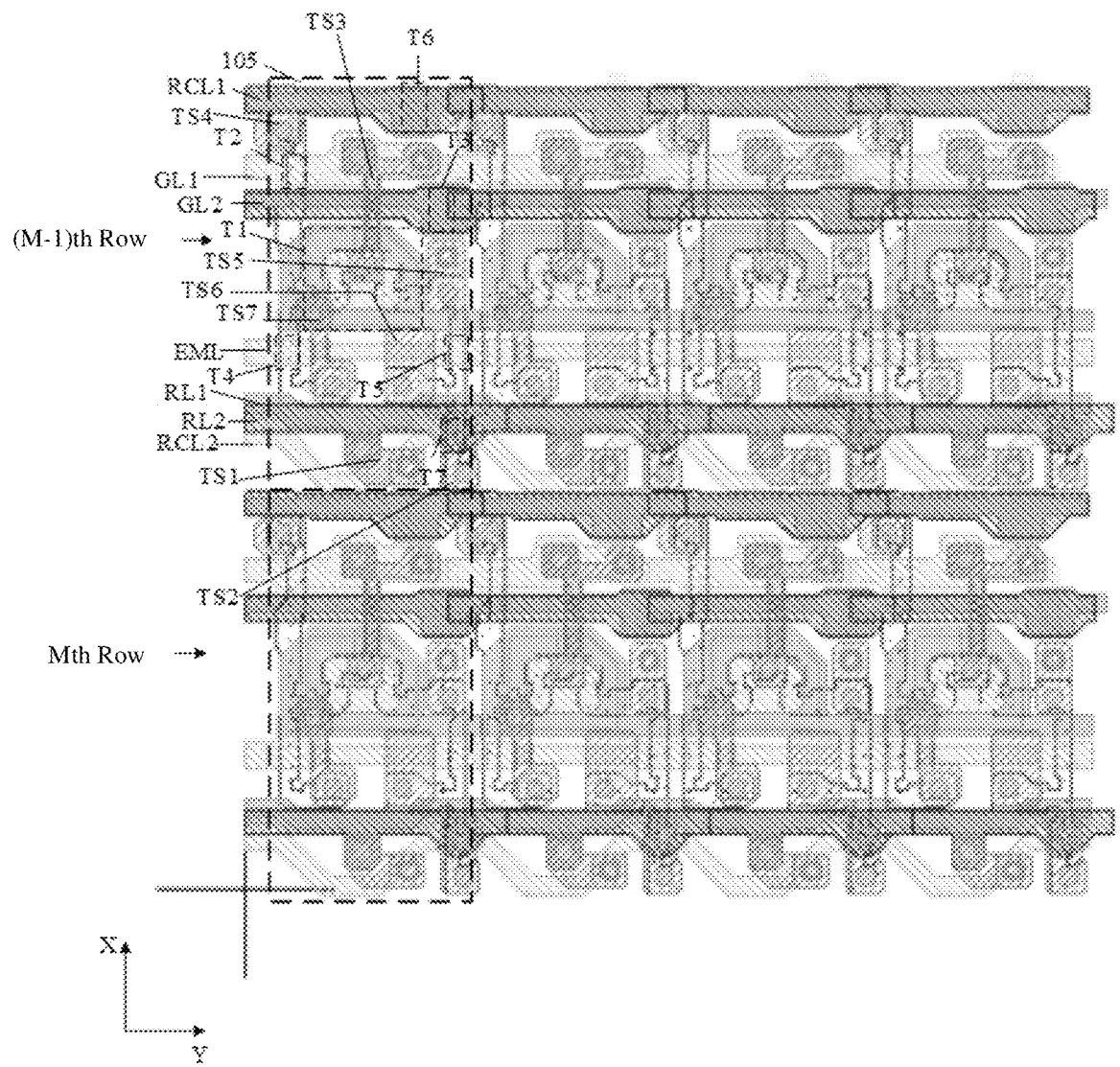
FIG. 11B is a schematic layout view obtained by stacking the layers of FIG. 5A, FIG. 5B, FIG. 6A, FIG. 7A, FIG. 8A, FIG. 9A, FIG. 10A and FIG. 11A.
Figure 12A:
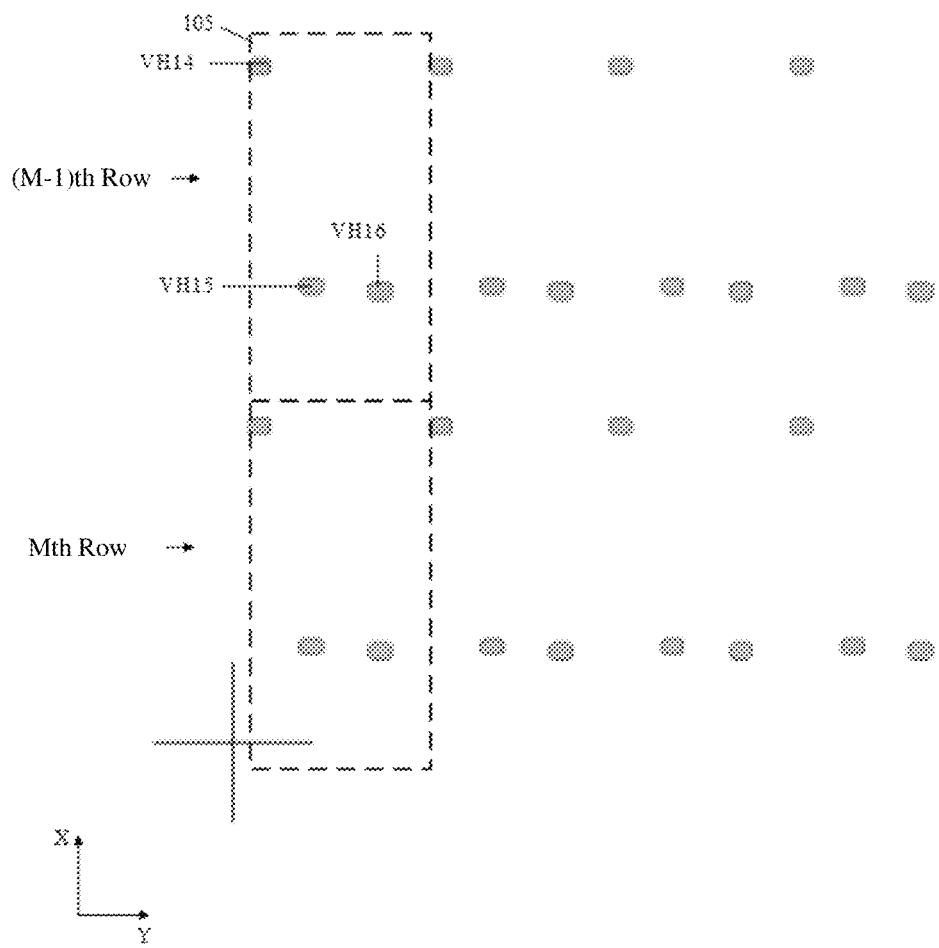
FIG. 12A is a schematic layout view of via holes in at least still another insulating layer of the display substrate provided by at least one embodiment of the present disclosure.
Figure 12B:
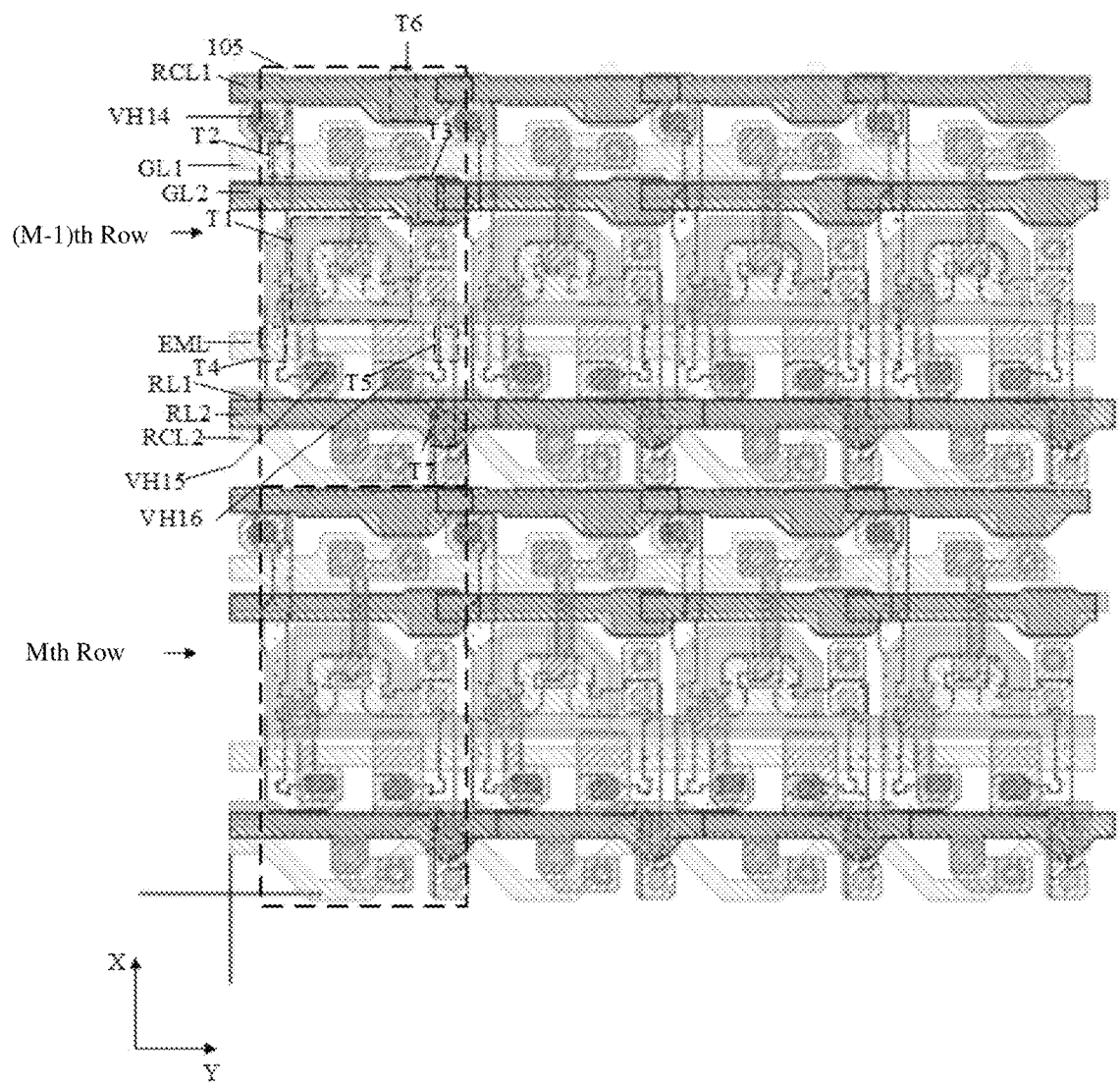
FIG. 12B is a schematic layout view obtained by stacking the layers of FIG. 5A, FIG. 5B, FIG. 6A, FIG. 7A, FIG. 8A, FIG. 9A, FIG. 10A, FIG. 11A and FIG. 12A.
Figure 13A:
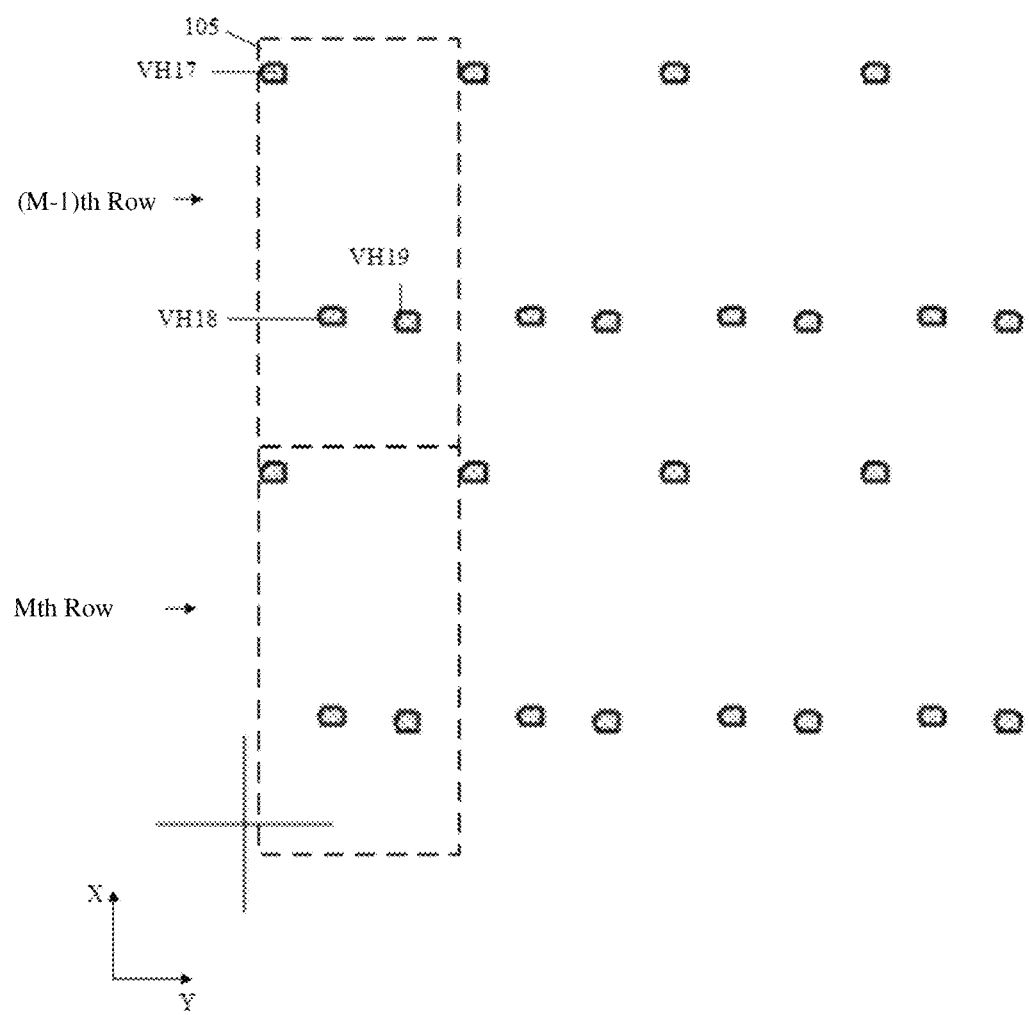
FIG. 13A is a schematic layout view of via holes in at least still another insulating layer of the display substrate provided by at least one embodiment of the present disclosure.
Figure 13B:
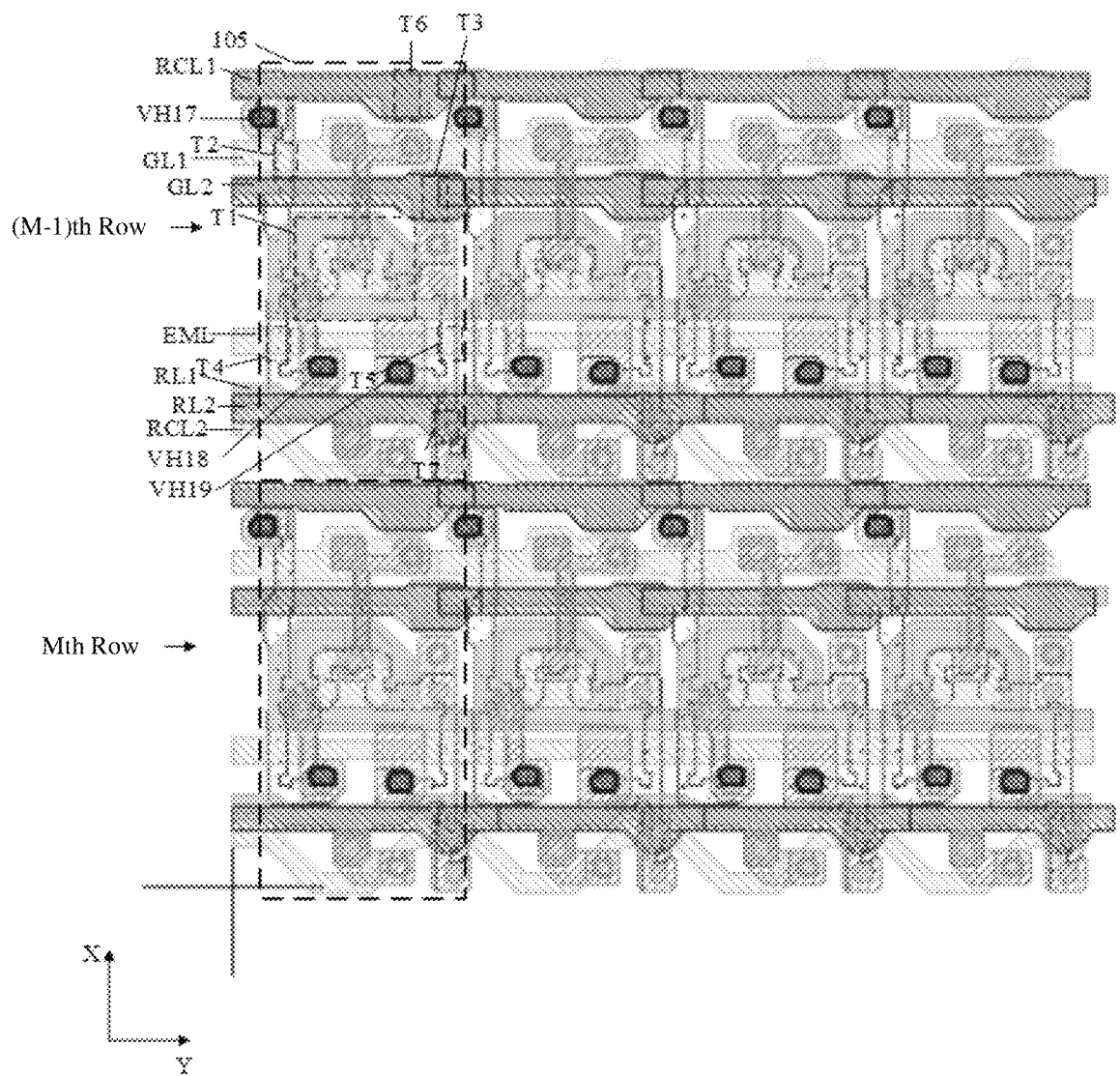
FIG. 13B is a schematic layout view obtained by stacking the layers of FIG. 5A, FIG. 5B, FIG. 6A, FIG. 7A, FIG. 8A, FIG. 9A, FIG. 10A, FIG. 11A, FIG. 12A and FIG. 13A.
Figure 14B:
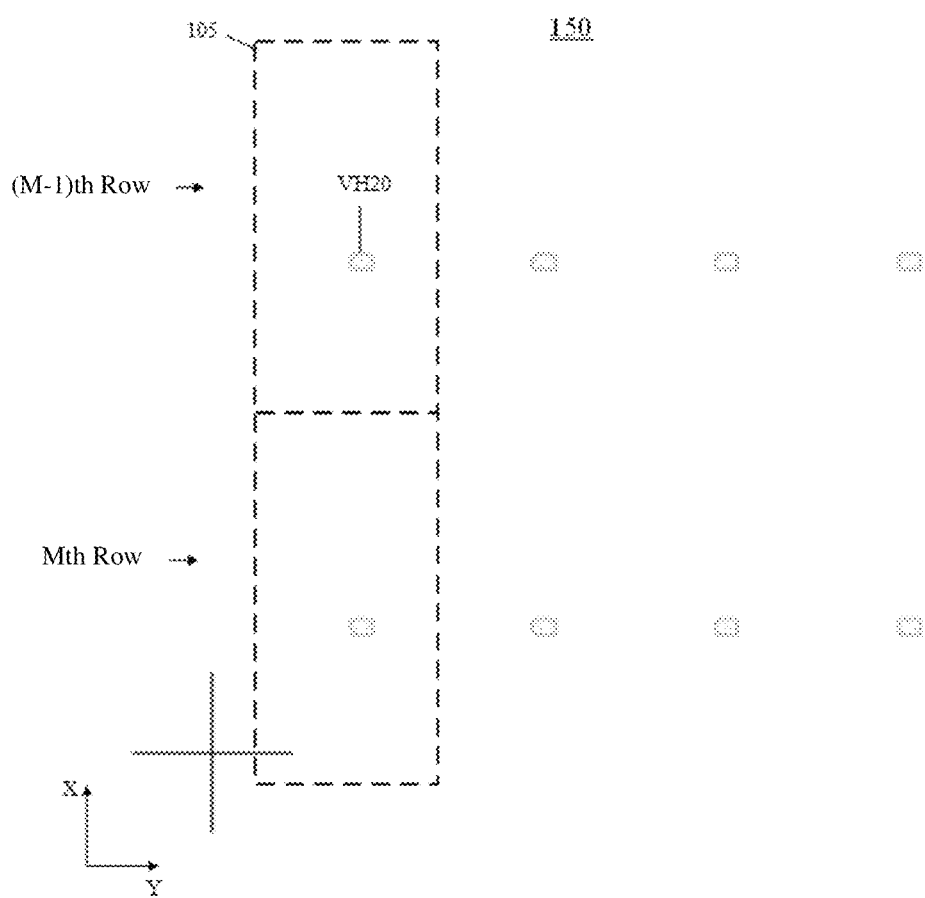
FIG. 14B is a schematic layout view of via holes in at least still another insulating layer of the display substrate provided by at least one embodiment of the present disclosure.
Figure 14C:
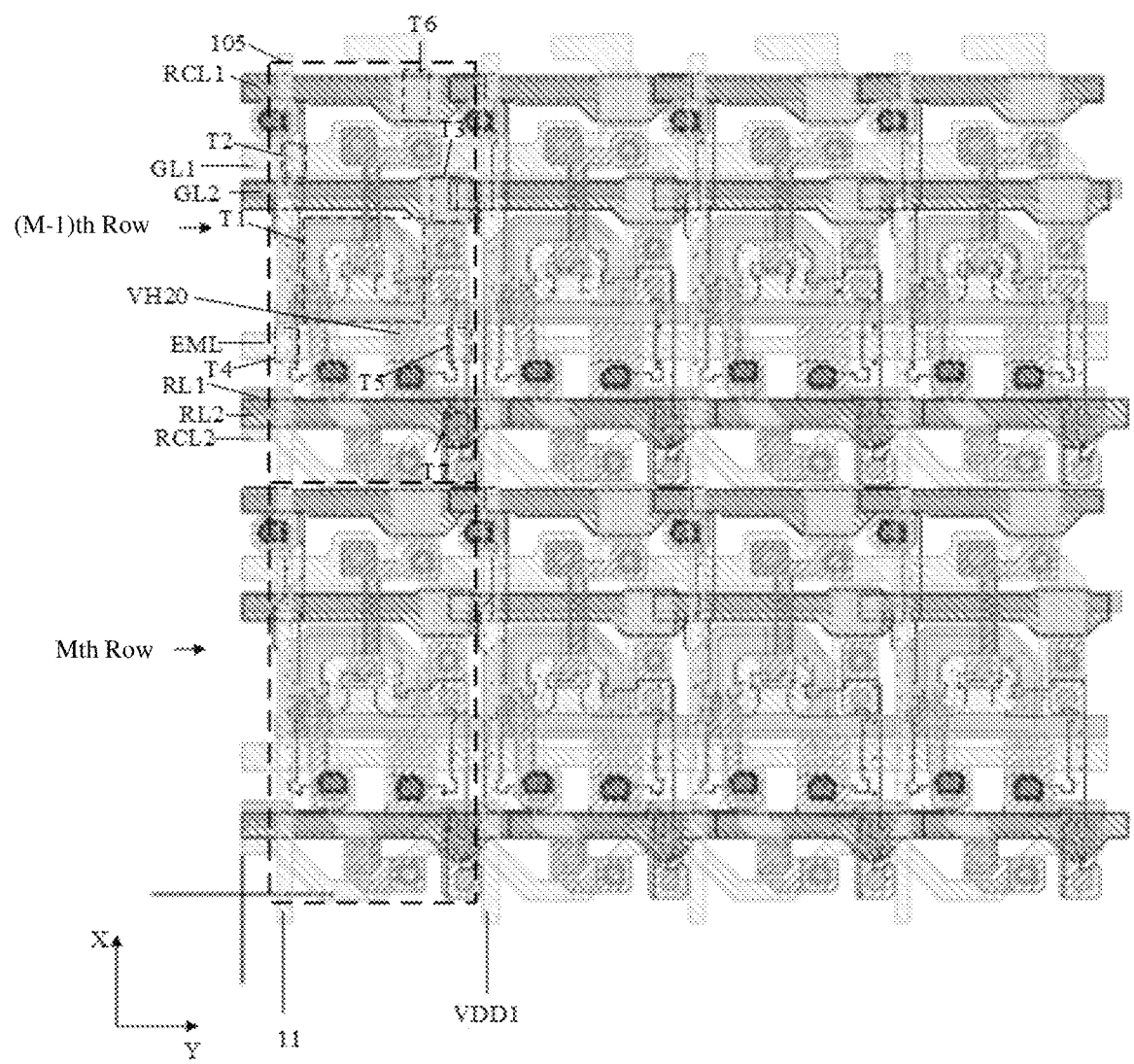
FIG. 14C is a schematic layout view obtained by stacking the layers of FIG. 5A, FIG. 5B, FIG. 6A, FIG. 7A, FIG. 8A, FIG. 9A, FIG. 10A, FIG. 11A, FIG. 12A, FIG. 13A, FIG. 14A and FIG. 14B.

FIG. 9A is a schematic layout view of via holes in at least one insulating layer of the display substrate provided by at least one embodiment of the present disclosure. FIG. 9B is a schematic layout view obtained by stacking the layers of FIG. 5A, FIG. 5B, FIG. 6A, FIG. 7A, FIG. 8A and FIG. 9A. FIG. 10A is a schematic layout view of via holes in at least another insulating layer of the display substrate provided by at least one embodiment of the present disclosure. FIG. 10B is a schematic layout view obtained by stacking the layers of FIG. 5A, FIG. 5B, FIG. 6A, FIG. 7A, FIG. 8A, FIG. 9A and FIG. 10A. FIG. 11A is a schematic layout view of a fifth metal layer of the display substrate provided by at least one embodiment of the present disclosure. FIG. 11B is a schematic layout view obtained by stacking the layers of FIG. 5A, FIG. 5B, FIG. 6A, FIG. 7A, FIG. 8A, FIG. 9A, FIG. 10A and FIG. 11A. FIG. 12A is a schematic layout view of via holes in at least still another insulating layer of the display substrate provided by at least one embodiment of the present disclosure. FIG. 12B is a schematic layout view obtained by stacking the layers of FIG. 5A, FIG. 5B, FIG. 6A, FIG. 7A, FIG. 8A, FIG. 9A, FIG. 10A, FIG. 11A and FIG. 12A. FIG. 13A is a schematic layout view of via holes in at least still another insulating layer of the display substrate provided by at least one embodiment of the present disclosure. FIG. 13B is a schematic layout view obtained by stacking the layers of FIG. 5A, FIG. 5B, FIG. 6A, FIG. 7A, FIG. 8A, FIG. 9A, FIG. 10A, FIG. 11A, FIG. 12A and FIG. 13A. FIG. 14A is a schematic layout view of a fourth metal layer of the display substrate provided by at least one embodiment of the present disclosure. FIG. 14B is a schematic layout view of via holes in at least still another insulating layer of the display substrate provided by at least one embodiment of the present disclosure. FIG. 14C is a schematic layout view obtained by stacking the layers of FIG. 5A, FIG. 5B, FIG. 6A, FIG. 7A, FIG. 8A, FIG. 9A, FIG. 10A, FIG. 11A, FIG. 12A, FIG. 13A, FIG. 14A and FIG. 14B.

For example, as illustrated in FIG. 4B and FIG. 4C, the display substrate further includes a first buffer layer 141 and a second buffer layer 145. The first buffer layer 141 is provided on the side of the first insulating layer 142 close to the base substrate 10. The second buffer layer 145 is provided between the second semiconductor layer PL2 and the third insulating layer 144. The first buffer layer 141 serves as a transition layer, which not only prevents harmful substances in the base substrate 10 from invading the interior of the display substrate, but also increases the adhesion of the layers in the display substrate 1 on the base substrate 10. The second buffer layer 145 prevents harmful substances from invading the second semiconductor layer PL2.

For example, in some embodiments, as illustrated in FIG. 2 and FIG. 14A, the second portion VDD12 is electrically connected to the first electrode T4s of the fourth transistor T4 (as illustrated in FIG. 5C).

For example, as illustrated in FIG. 11A, the display substrate 1 further includes a fifth metal layer SD1. For example, as illustrated in FIG. 4B, the fifth metal layer SD1 is located between the fourth metal layer SD2 and the third metal layer GAT3. For example, the fifth metal layer SD1 includes a seventh connection electrode TS7. The orthographic projection of the lower end of the seventh connection electrode TS7 on the base substrate 10 corresponds to the orthographic projection of the first electrode T4s of the fourth transistor T4 on the base substrate 10.

For example, as illustrated in FIG. 4B, the display substrate 1 further includes a sixth insulating layer 149. The sixth insulating layer 149 is located between the fourth metal layer SD2 and the fifth metal layer SD1. For example, the display substrate 1 further includes a passivation layer 148. For example, the passivation layer 148 is located between the sixth insulating layer 149 and the fifth metal layer SD1. The passivation layer 148 protects the first and second electrodes of the transistors of the pixel driving circuit 105 from being corroded by water vapor.

For example, the material of the passivation layer 148 includes organic insulating material or inorganic insulating material, for example, silicon nitride material, because of its high dielectric constant and good hydrophobic function, it can well protect the pixel driving circuit 105 from being corroded by water vapor.

For example, as illustrated in FIG. 9A and FIG. 9B, the seventh connection electrode TS7 is connected to the first electrode T4s of the fourth transistor T4 through a fourth via hole VH4. For example, the fourth via hole VH4 penetrates through the first insulating layer 142, the second insulating layer 143, the third insulating layer 144, the second buffer layer 145, the fifth insulating layer 146 and the fourth insulating layer 147.

For example, as illustrated in FIG. 12A, FIG. 12B, FIG. 13A and FIG. 13B, the second portion VDD12 of the bent portion VDD10 of the first power supply voltage VDD1 is connected to the seventh connection electrode TS7 through a fifteenth via VH15 and an eighteenth via VH18 to realize the connection between the first power supply voltage VDD1 and the first electrode T4s of the fourth transistor T4. In this case, the voltage drop during the transmission of the electrical signal is reduced by providing the seventh connection electrode TS7. For example, the orthographic projection of the fifteenth via hole VH15 on the base substrate 10 overlaps with the orthographic projection of the eighteenth via hole VH18 on the base substrate 10. The fifteenth via hole VH15 penetrates the passivation layer 148, and the eighteenth via hole VH18 penetrates the sixth insulating layer 149.

For example, in some embodiments, as illustrated in FIG. 2 and FIG. 14A, the orthographic projection of the first portion VDD11 on the base substrate 10 and the orthographic projection of the first gate electrode T3g1 of the third transistor T3 on the base substrate include a first overlapping region (a lower half of the first portion VDD11 in the figure), and the orthographic projection of the first portion VD11 on the base substrate 10 and the orthographic projection of the first gate electrode T6g1 of the sixth transistor T6 on the base substrate 10 include a second overlapping region (an upper half of the first portion VDD11 in the figure). A centerline X12 of the first overlapping region extending along the second direction X does not coincide with a centerline X11 of the second overlapping region extending along the second direction X. Thus, the first portion VDD11 shields the first gate electrode T3g1 of the third transistor T3 and the first gate electrode T6g1 of the sixth transistor T6.

For example, in some embodiments, as illustrated in FIG. 2 and FIG. 14A, the centerline X12 of the region (the lower half of the first portion VDD11 in the figure), where the orthographic projection of the first portion VDD11 on the base substrate 10 overlaps with the orthographic projections of the first gate electrode T3g1 and the second gate electrode T3g2 of the third transistor T3 on the base substrate, along the second direction X does not coincide with the centerline X11 of the region (the upper half of the first portion VDD11 in the figure), where the orthographic projection of the first portion VDD11 on the base substrate 10 overlaps with the orthographic projections of the first gate electrode T6g1 and the second gate electrode T6g2 of the sixth transistor T6 on the base substrate, along the second direction X. In this case, the first portion VDD11 does not extend straightly along the second direction X. Thus, the first portion VDD11 shields the first gate electrode T3g1 and the second gate electrode T3g2 of the third transistor T3 and the first gate electrode T6g1 and the second gate electrode T6g2 of the sixth transistor T6.

For example, in some embodiments, as illustrated in FIG. 14A, the line width W1 of the first portion VDD11 is larger than both the line width W3 of the second portion VDD12 and the line width W2 of the third portion VDD13. Accordingly, the width of a portion of the first power supply voltage line VDD1 that does not serve as a shielding electrode is appropriately reduced to reduce the wiring space.

For example, in some embodiments, as illustrated in FIG. 14A, the display substrate 1 further includes a plurality of data lines 11 extending along the second direction X, and each data line 11 is electrically connected to pixel driving circuits 105 of a plurality of sub-pixels located in a same column and configured to provide a data signal. A distance Y11 (corresponding to the upper part of the first portion VDD11) or Y12 (corresponding to the lower part of the first portion VDD11) between the orthographic projection of the first portion VDD11 of the bent portion VDD10 of the first power supply voltage line VDD1 on the base substrate 10 and the orthographic projection of the data line 11 (the first portion VDD11 and the data line 11 are electrically connected to the same pixel driving circuit 105) on the base substrate 10 along the first direction Y is greater than a distance Y13 between the orthographic projection of the second portion VDD12 on the base substrate 10 and the orthographic projection of the data line 11 on the base substrate 10 along the first direction Y, thereby reducing the wiring space of the first power supply voltage line VDD1.

For example, in some embodiments, as illustrated in FIG. 11A and FIG. 11B, the pixel driving circuit 105 further includes a first connection electrode TS1 located in the fifth metal layer SD1. The first connection electrode TS1 is bent and extended, and is substantially in an "L" shape. The first connection electrode TS1 connects the first reset signal line RL1 electrically connected to the pixel driving circuits 105 of the sub-pixels in the (M)th row to the pixel driving circuits 105 of the sub-pixels in the (M)th row.

For example, in some embodiments, as illustrated in FIG. 11A and FIG. 11B, at least a portion of the first connection electrode TS1 extends along the first direction Y. For example, the first connection electrode TS1 includes a portion extending along the second direction X and a portion extending along the first direction Y, and the two portions are connected to form a substantially "L" shape.

For example, in some embodiments, as illustrated in FIG. 4B, FIG. 9A, FIG. 9B, FIG. 11A, and FIG. 11B, a first end of the first connection electrode TS1 (e.g., an upper end of the first connection electrode TS1 in FIG. 11A) is connected to the first reset signal line RL1 through a first via hole VH1 (as illustrated in FIG. 9A and FIG. 9B). The first via hole VH1 is a via hole penetrating the third insulating layer 144, the fourth insulating layer 147, the second buffer layer 145 and the fifth insulating layer 146. For example, in some embodiments, as illustrated in FIG. 4B, FIG. 10A, FIG. 10B, FIG. 11A, and FIG. 11B, a second end of the first connection electrode TS1 (e.g., a lower end of the first connection electrode TS1 in FIG. 11A) is connected to the first electrode T6s (as illustrated in FIG. 7A) of the sixth transistor T6 of the pixel driving circuit 105 of the sub-pixel in (M)th row through a thirteenth via hole VH13 (as illustrated in FIG. 10A and FIG. 10B). For example, the thirteenth via hole VH13 is a via hole penetrating the fourth insulating layer 147 and the fifth insulating layer 146.

For example, in some embodiments, as illustrated in FIG. 2, FIG. 4B, FIG. 6A and FIG. 6B, the first reset signal line RL1 includes a portion PP1 protruding toward the first connection electrode TS1. The protruding portion PP1 of the first reset signal line RL1 is connected to the first connection electrode TS1 through the first via hole VH1. The first reset signal line RL1 is electrically connected to the first electrodes T6s (as illustrated in FIG. 7A) of the sixth transistors T6 of the pixel driving circuits 105 of the sub-pixels in (M)th row through the first connection electrodes TS1. The first reset signal provided by the first reset signal line RL1 is transmitted to the first electrodes T6s of the sixth transistors T6 of the pixel driving circuits 105 of the sub-pixels in (M)th row through the protruding portions PP1 of the first reset signal line RL1 and the first connection electrodes TS1.

For example, in some embodiments, as illustrated in FIG. 11A and FIG. 11B, the pixel driving circuit 105 further includes a second connection electrode TS2 located in the fifth metal layer SD1. The second connection electrode TS2 extends along the second direction X.

For example, as illustrated in FIG. 4A, FIG. 10A, FIG. 10B, FIG. 11A, and FIG. 11B, a first end of the second connection electrode TS2 (e.g., an upper end of the second connection electrode TS2 in FIG. 11A) is connected to the second reset signal line RL2 (located in the (M−1)th row) through a twelfth via hole VH12 (as illustrated in FIG. 10A and FIG. 10B). For example, the twelfth via hole VH12 is a via hole penetrating the fourth insulating layer 147.

For example, as illustrated in FIG. 4A, FIG. 9A, FIG. 9B, FIG. 11A, and FIG. 11B, a second end of the second connection electrode TS2 (e.g., a lower end of the second connection electrode TS2 in FIG. 11A) is connected to the first electrode T7s of the seventh transistor T7 of the pixel driving circuit 105 of the sub-pixel in the (M−1)th row through a second via hole VH2 (as illustrated in FIG. 9A and FIG. 9B). For example, the second via hole VH2 is a via hole penetrating the first insulating layer 142, the second insulating layer 143, the third insulating layer 144, the fourth insulating layer 147 and the fifth insulating layer 146.

For example, in some embodiments, as illustrated in FIG. 6A, FIG. 8A and FIG. 8B, the display substrate 1 further includes a first reset control signal line RCL1 extending along the first direction Y. The first reset control signal line RCL1 is configured to provide the first reset control signal Rst1 to the pixel driving circuits 105 of a plurality of sub-pixels in a row corresponding to the first reset control signal line RCL1. The first reset control signal line RCL1 includes a first sub-line RCL11 located in the second metal layer GAT2 (as illustrated in FIG. 6A) and a second sub-line RCL12 located in the third metal layer GAT3 (as illustrated in FIG. 8A). For example, the first reset control signal line RCL1 is a double-layered line, and both the first sub-line RCL11 and the second sub-line RCL12 transmit the first reset control signal Rst1. The orthographic projection of the first sub-line RCL11 on the base substrate 10 at least partially overlaps with the orthographic projection of the second sub-line RCL12 on the base substrate 10. The width of a portion of the first sub-line RCL11 overlapping with the second semiconductor layer PL2 is increased, and the portion also constitutes the first gate electrode T6g1 of the sixth transistor T6. The width of a portion of the second sub-line RCL12 overlapping with the second semiconductor layer PL2 is increased, and the portion also constitutes the second gate electrode T6g2 of the sixth transistor T6. That is, the portion of the first sub-line RCL11 overlapping with the second semiconductor layer PL2 in the direction perpendicular to the base substrate 10 serves as the first gate electrode T6g1 of the sixth transistor T6, and the portion of the second sub-line RCL12 overlapping with the second semiconductor layer PL2 in the direction perpendicular to the base substrate 10 serves as the second gate electrode T6g2 of the sixth transistor T6.

For example, as illustrated in FIG. 2, FIG. 5B and FIG. 5C, the display substrate 1 further includes a second reset control signal line RCL2 located in the first metal layer GAT1. The second reset control signal line RCL2 extends along the first direction Y, and is configured to provide the second reset control signal Rst2 to the pixel driving circuits 105 of a plurality of sub-pixels in a row corresponding to the second reset control signal line RCL2. A portion of the second reset control signal line RCL2 overlapping with the first semiconductor layer PL1 in the direction perpendicular to the base substrate 10 serves as the gate electrode T7g of the seventh transistor T7 to reduce wiring space.

For example, in other embodiments, as illustrated in FIG. 2, FIG. 5B, FIG. 5C, FIG. 6A and FIG. 8A, in the region where one sub-pixel of the sub-pixels in the (M−1)th row is located (for example, the region where the pixel driving circuit of the one sub-pixel is located, which is illustrated by a dotted box in the figure), the area of an overlapping region of the orthographic projection of the second reset signal line RL2, that is electrically connected to the pixel driving circuits of the sub-pixels in the (M−1)th row, on the base substrate 10 and the orthographic projection of the second reset control signal line RCL2, that is electrically connected to the pixel driving circuits of the sub-pixels in the (M−1)th row, on the base substrate 10 is less than 50% of the area of the orthographic projection of the second reset signal line RL2 on the base substrate 10. Therefore, the overlapping portion of the second reset signal line RL2 and the second reset control signal line RCL2 is small, and the load transmitted on the second reset signal line RL2 is less affected by other electrical signals. For example, in the region where one sub-pixel of the sub-pixels in the (M−1)th row is located (for example, the region where the pixel driving circuit of the one sub-pixel is located, which is illustrated by a dotted box in the figure), the area of an overlapping region of the orthographic projection of the first reset signal line RL1, that is electrically connected to the pixel driving circuits of the sub-pixels in the (M)th row, on the base substrate 10 and the orthographic projection of the second reset control signal line RCL2, that is electrically connected to the pixel driving circuits of the sub-pixels in the (M−1)th row, on the base substrate 10 is less than 50% of the area of the orthographic projection of the first reset signal line RL1 on the base substrate 10. Therefore, the overlapping portion of the first reset signal line RL1 and the second reset control signal line RCL2 is small, and the load transmitted on the first reset signal line RL1 is less affected by other electrical signals.

For example, as illustrated in FIG. 2, FIG. 5B and FIG. 5C, the display substrate 1 further includes a plurality of first scanning signal lines GL1 located in the first metal layer GAT1. Each of the first scanning signal lines GL1 extends along the first direction Y, and is configured to provide the first scanning signal Ga1 to pixel driving circuits 105 of a plurality of sub-pixels in a row corresponding thereto. In FIG. 5C, a portion of the first scanning signal line GL1 overlapping with the first semiconductor layer PL1 in the direction perpendicular to the base substrate 10 serves as the gate electrode T2g of the second transistor T2 to reduce wiring space.

For example, as illustrated in FIG. 2, FIG. 6A, FIG. 6B, FIG. 7A and FIG. 7B, the display substrate 1 further includes a plurality of second scanning signal lines GL2. Each of the second scanning signal lines GL2 extends along the first direction Y, and is configured to provide the second scanning signal Ga2 to pixel driving circuits 105 of a plurality of sub-pixels in a row corresponding thereto. Along the second direction X, in each pixel driving circuit 105, for example, in the pixel driving circuit 105 located at the upper left in FIG. 8B, the orthographic projection of the second scanning signal line GL2 on the base substrate 10 is located between the orthographic projection of the storage capacitor Cst on the base substrate 10 and the orthographic projection of the first scanning signal line GL1 on the base substrate 10. That is, along the second direction X, the second scanning signal line GL2 is located below the first scanning signal line GL1. For example, the second scanning signal line GL2 includes a third sub-line GL21 located in the second metal layer GAT2 (as illustrated in FIG. 6A) and a fourth sub-line GL22 located in the third metal layer GAT3 (as illustrated in FIG. 8A). The orthographic projection of the third sub-line GL21 on the base substrate 10 at least partially overlaps with the orthographic projection of the fourth sub-line GL22 on the base substrate 10. For example, the second scanning signal line GL2 is a double-layered line, and both the third sub-line GL21 and the fourth sub-line GL22 are used to transmit the second scanning signal Ga2. For example, a portion of the third sub-line GL21 overlapping with the second semiconductor layer PL2 in the direction perpendicular to the base substrate 10 (the line width of this portion increases) serves as the first gate electrode T3g1 of the third transistor T3, and a portion of the fourth sub-line GL22 overlapping with the second semiconductor layer PL2 in the direction perpendicular to the base substrate 10 (the line width of this portion increases) serves as the second gate electrode T3g2 of the third transistor T3. Thereby, the wiring space of the display substrate 1 is reduced.

For example, in some embodiments, as illustrated in FIG. 5A, FIG. 5B, FIG. 6A and FIG. 6B, the display substrate 1 further includes a first convex portion GL11 (as illustrated in FIG. 5A) located in the first metal layer GAT1 and a first electrode portion GA1 (as illustrated in FIG. 6A) located in the second metal layer. The first convex portion GL11 is connected to the first scanning signal line GL1, and the first convex portion GL11 and the first scanning signal line GL1 are integral with each other. That is, the first convex portion GL11 is a widened portion of the first scanning signal line GL1 in the second direction X. The orthographic projection of the first electrode portion GAT1 on the base substrate 10 is located between the data line 11 and the first power supply voltage line VDD1 along the first direction Y, and is located between the first reset control signal line RCL1 and the second scanning signal line GL2 along the second direction X. For example, the orthographic projection of the first electrode portion GA1 on the base substrate 10 at least partially overlaps with the orthographic projections of the first convex portion GL11 and the first scanning signal line GL1 on the base substrate 10, so that the second insulating layer 143 is provided between the first electrode portion GA1 and the first convex portion GL11 as well as the first scanning signal line GL1 to form an auxiliary capacitor. Thus, the first scanning signal Ga1 transmitted on the first scanning signal line GL1 can be prevented from jumping.

For example, as illustrated in FIG. 4C, FIG. 11A and FIG. 11B, the pixel driving circuit 105 further includes a third connection electrode TS3 located in the fifth metal layer SD1. The third connection electrode TS3 is substantially "L" shaped. For example, the orthographic projection of the third connection electrode TS3 on the base substrate 10 partially overlaps with the orthographic projections of the first scanning signal line GL1, the second scanning signal line GL2 and the second semiconductor layer PL2 on the base substrate 10 to form an auxiliary capacitor, thereby preventing the electrical signals transmitted on the first scanning signal line GL1 and the second scanning signal line GL2 from jumping. For example, a portion of the third connection electrode TS3 extending in the second direction X overlaps with the second scanning signal line GL2, and a portion of the third connection electrode TS3 extending in the first direction Y overlaps with the first scanning signal line GL1 and partially overlaps with the second semiconductor layer PL2.

For example, as illustrated in FIG. 4C, FIG. 6A, FIG. 11A and FIG. 11B, the second electrode plate Ca of the storage capacitor Cst includes a first opening K1. The first opening K1 is configured to expose the first electrode plate Cb of the storage capacitor Cst (as illustrated in FIG. 6A). The third connection electrode TS3 includes a first sub-connection electrode T31 extending in the second direction X and a second sub-connection electrode T32 extending in the first direction Y (as illustrated in FIG. 11A). A first end (a lower end in the figure) of the first sub-connection electrode T31 passes through the first opening K1 and is connected to the first electrode plate Cb through a seventh via hole VH7 (as illustrated in FIG. 9A and FIG. 9B). The seventh via hole VH7 is a via hole penetrating the second insulating layer 143, the third insulating layer 144, the second buffer layer 145, the fourth insulating layer 147 and the fifth insulating layer 146. A second end (e.g., an upper end) of the first sub-connection electrode T31 is connected to the first electrode portion GA1 through a ninth via hole VH9. For example, the ninth via hole VH9 is a via hole penetrating the third insulating layer 144, the second buffer layer 145, the fourth insulating layer 147 and the fifth insulating layer 146. For example, the second end of the first sub-connection electrode T31 is further connected to the second sub-connection electrode T32, and an end of the second sub-connection electrode T32 away from the first connection electrode T31 (e.g., an end on the right side of FIG. 11A) is connected to the second electrode T6d of the sixth transistor T6 and the first electrode T3s of the third transistor T3 (i.e., connected to the second semiconductor layer PL2) through a tenth via hole VH10. For example, the tenth via hole VH10 is a via hole penetrating the fourth insulating layer 147 and the fifth insulating layer 146.

For example, in some embodiments, as illustrated in FIG. 5B and FIG. 5C, the first metal layer GAT1 further includes a plurality of light-emitting control lines EML extending along the first direction Y, and each light-emitting control line EML is configured to provide the light-emitting control signal (the first light-emitting control signal EM1 or the second light-emitting control signal EM2) to pixel driving circuits 105 of a plurality of sub-pixels in a row corresponding thereto. A portion of the light-emitting control line EML overlapping with the first semiconductor layer PL1 in the direction perpendicular to the base substrate 10 serves as the gate electrode T4g of the fourth transistor T4 and the gate electrode T5g of the fifth transistor T5. Thereby, the wiring space of the display substrate 1 is reduced.

For example, in some embodiments, as illustrated in FIG. 2 and FIG. 14A, the data line 11 is located in the fourth metal layer SD2. As illustrated in FIG. 11A, the pixel driving circuit 105 further includes a fourth connection electrode TS4 located in the fifth metal layer SD1. The fourth connection electrode TS4 is connected to the first electrode T2s of the second transistor T2 through an eighth via hole VH8 (as illustrated in FIG. 9A and FIG. 9B). For example, the eighth via hole VH8 is a via hole penetrating the first insulating layer 142, the second insulating layer 143, the third insulating layer 144, the second buffer layer 145, the fourth insulating layer 147 and the fifth insulating layer 146. The fourth connection electrode TS4 is further connected to the data line 11 through a fourteenth via hole VH14 (as illustrated in FIG. 12A and FIG. 12B) and a seventeenth via hole VH17 (as illustrated in FIG. 13A and FIG. 13B) to receive the data signal. For example, the orthographic projection of the fourteenth via hole VH14 on the base substrate 10 overlaps with the orthographic projection of the seventeenth via hole VH17 on the base substrate 10. For example, the fourteenth via hole VH14 is a via hole penetrating the passivation layer 148. For example, the seventeenth via hole VH17 is a via hole penetrating the sixth insulating layer 149.

For example, as illustrated in FIG. 9A, FIG. 9B and FIG. 11A, the other end (e.g., an upper end) of the seventh connection electrode TS7 is connected to the second electrode plate Ca of the storage capacitor Cst through a fifth via hole VH5 illustrated in FIG. 9A. For example, the fifth via hole VH5 is a via hole penetrating the third insulating layer 144, the second buffer layer 145, the fifth insulating layer 146 and the fourth insulating layer 147.

For example, as illustrated in FIG. 9A, FIG. 9B and FIG. 11A, the fifth metal layer SD1 further includes a fifth connection electrode TS5. The fifth connection electrode TS5 extends along the second direction X. One end (e.g., a lower end) of the fifth connection electrode TS5 is connected to the second electrode T1d of the first transistor T1 through a sixth via hole VH6 illustrated in FIG. 9A. For example, the sixth via hole VH6 is a via hole penetrating the first insulating layer 142, the second insulating layer 143, the third insulating layer 144, the second buffer layer 145, the fifth insulating layer 146 and the fourth insulating layer 147. For example, the other end (e.g., an upper end) of the fifth connection electrode TS5 is connected to the second electrode T2d of the second transistor T2 through an eleventh via hole VH11 illustrated in FIG. 10A. For example, the eleventh via hole VH11 is a via hole penetrating the fifth insulating layer 146 and the fourth insulating layer 147.

For example, the fifth connection electrode TS5 is not parallel to the second direction X, for example, intersects the second direction X at a certain angle. For example, the intersection angle is less than or equal to 20°.

For example, as illustrated in FIG. 14A, the fourth metal layer SD2 further includes an eighth connection electrode TS8. For example, the eighth connection electrode TS8 extends along the second direction X. The eighth connection electrode TS8 is configured to connect the light-emitting element 120 and the pixel driving circuit 105.

For example, the eighth connection electrode TS8 is not parallel to the second direction X, for example, intersects the second direction X at a certain angle. For example, the intersection angle is less than or equal to 20°.

For example, as illustrated in FIG. 9A, FIG. 9B and FIG. 11A, the fifth metal layer SD1 further includes a sixth connection electrode TS6. The sixth connection electrode TS6 extends along the second direction X. One end (e.g., a lower end) of the sixth connection electrode TS6 is connected to the first electrode T5s of the fifth transistor T5 through a third via hole VH3 illustrated in FIG. 9A. For example, the third via hole VH3 is a via hole penetrating the first insulating layer 142, the second insulating layer 143, the third insulating layer 144, the second buffer layer 145, the fifth insulating layer 146 and the fourth insulating layer 147. For example, one end (e.g., a lower end) of the sixth connection electrode TS6 is connected to an eighth connection electrode TS8 located in the fourth metal layer through a sixteenth via hole VH16 illustrated in FIG. 12A and a nineteenth via hole VH19 illustrated in FIG. 13A. For example, the sixteenth via hole VH16 is a via hole penetrating the passivation layer 148. For example, the nineteenth via hole VH19 is a via hole penetrating the sixth insulating layer 149.

For example, as illustrated in FIG. 14B, the display substrate 1 further includes a seventh insulating layer 150 (e.g., a second planarization layer). The seventh insulating layer 150 is located on a side of the fourth metal layer SD2 away from the base substrate 10.

Figure 15A:
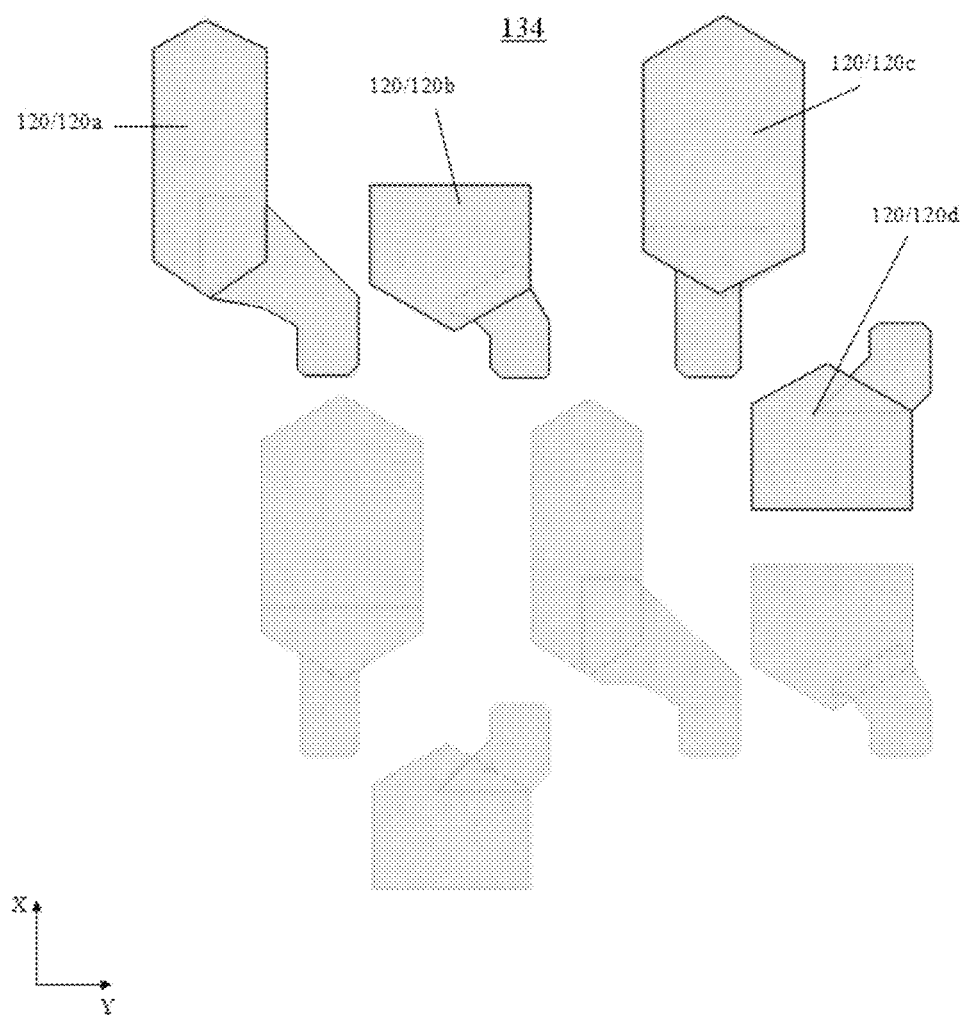
FIG. 15A is a schematic layout view of a pixel defining layer of the display substrate provided by at least one embodiment of the present disclosure.
Figure 15B:
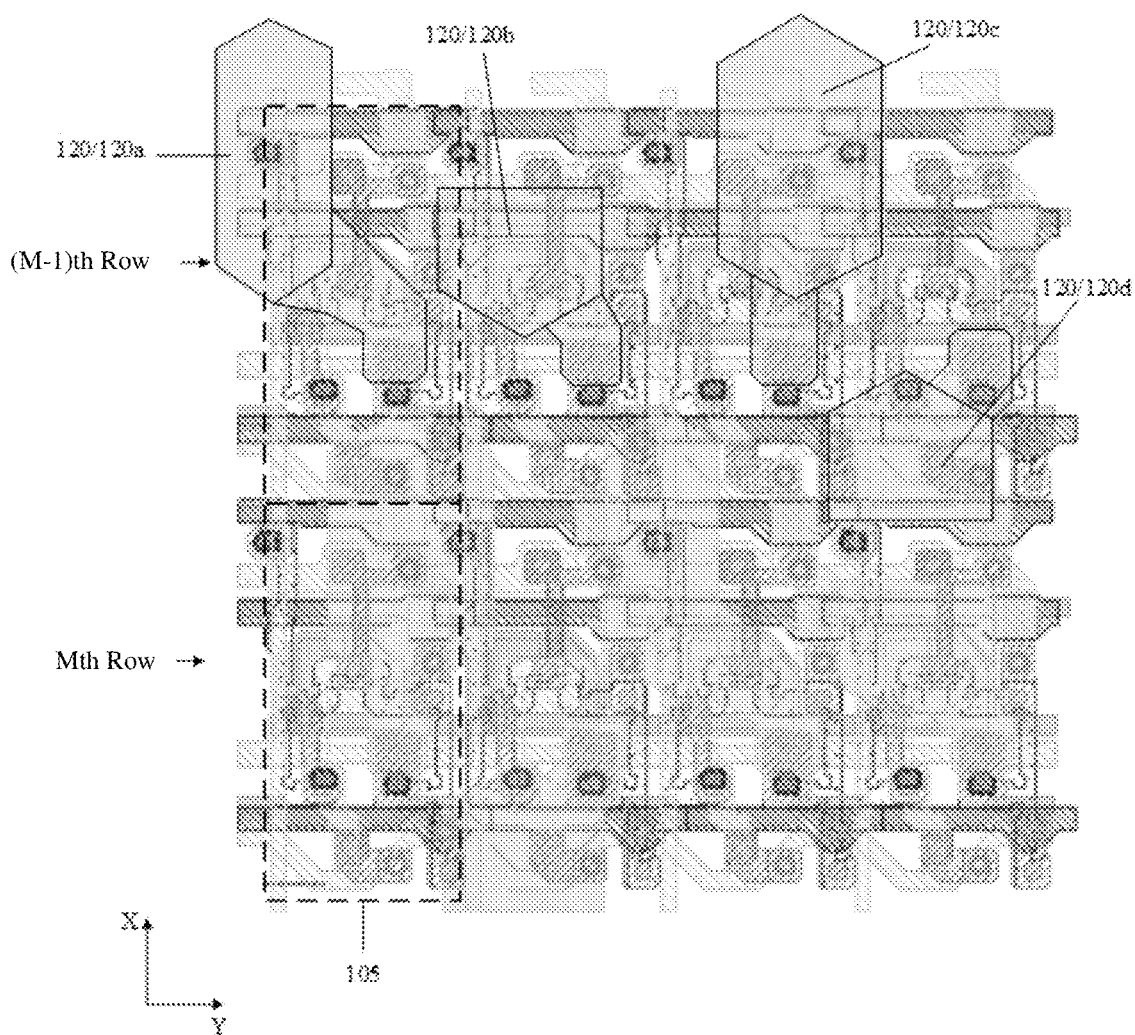
FIG. 15B is a schematic layout view obtained by stacking the layers of FIG. 5A, FIG. 5B, FIG. 6A, FIG. 7A, FIG. 8A, FIG. 9A, FIG. 10A, FIG. 11A, FIG. 12A, FIG. 13A, FIG. 14A, FIG. 14B and FIG. 15A.

FIG. 15A is a schematic layout view of a pixel defining layer of the display substrate provided by at least one embodiment of the present disclosure. FIG. 15B is a schematic layout view obtained by stacking the layers of FIG. 5A, FIG. 5B, FIG. 6A, FIG. 7A, FIG. 8A, FIG. 9A, FIG. 10A, FIG. 11A, FIG. 12A, FIG. 13A, FIG. 14A, FIG. 14B and FIG. 15A.

For example, as illustrated in FIG. 14B, FIG. 14C, FIG. 15A and FIG. 15B, the eighth connection electrode TS8 is connected to the first electrode 134 of the light-emitting element 120 through a twentieth via hole VH20 in the seventh insulating layer 150, for example, connected to the light-emitting element 120a.

For example, the material of the first electrode 134 includes at least one transparent conductive oxide material, including indium tin oxide (ITO), indium zinc oxide (IZO), zinc oxide (ZnO), and the like. In addition, the first electrode 134 for example includes a metal having high reflectivity, such as silver (Ag), as a reflective layer.

For example, in the embodiments of the present disclosure, a schematic plan view of the pixel defining layer of the display substrate 1, the second electrode 135 of the light-emitting element 120, the encapsulation layer, and the like is not illustrated.

For example, as illustrated in FIG. 15A, the light-emitting element 120 includes a red light-emitting element 120a, a green light-emitting element 120b, a blue light-emitting element 120c, and a green light-emitting element 120d. The above four kinds of light-emitting elements constitute a pixel unit.

For example, the materials of the third metal layer GAT3, the fourth metal layer SD2 and the fifth metal layer SD1 include metal materials or alloy materials, such as a metal single-layer or multi-layer structure formed by molybdenum, aluminum and titanium, for example, the multi-layer structure is a structure in which multiple metal layers are stacked (such as three-layer metal stack of titanium, aluminum and titanium (Ti/Al/Ti)).

For example, the materials of one or more of the fourth insulating layer 147 and the fifth insulating layer 146 include insulating materials such as silicon oxide, silicon nitride, silicon oxynitride, and the like.

For example, the materials of the sixth insulating layer 149 and the seventh insulating layer 150 include inorganic insulating materials such as silicon oxide, silicon nitride, silicon oxynitride, and the like, or include organic insulating materials such as polyimide, polyphthalimide, polyphthalamide, acrylic resin, benzocyclobutene, phenolic resin, and the like, which are not limited by the embodiments of the present disclosure.

It should be noted that, in the embodiments of the present disclosure, the size range of the first via hole VH1 to the ninth via hole VH9 illustrated in FIG. 9A is about 2-4 micrometers, for example, about 3 micrometers. The sizes of the first via hole VH1 to the ninth via hole VH9 are selected by the display substrate 1 in the actual manufacturing process.

Figure 16A:
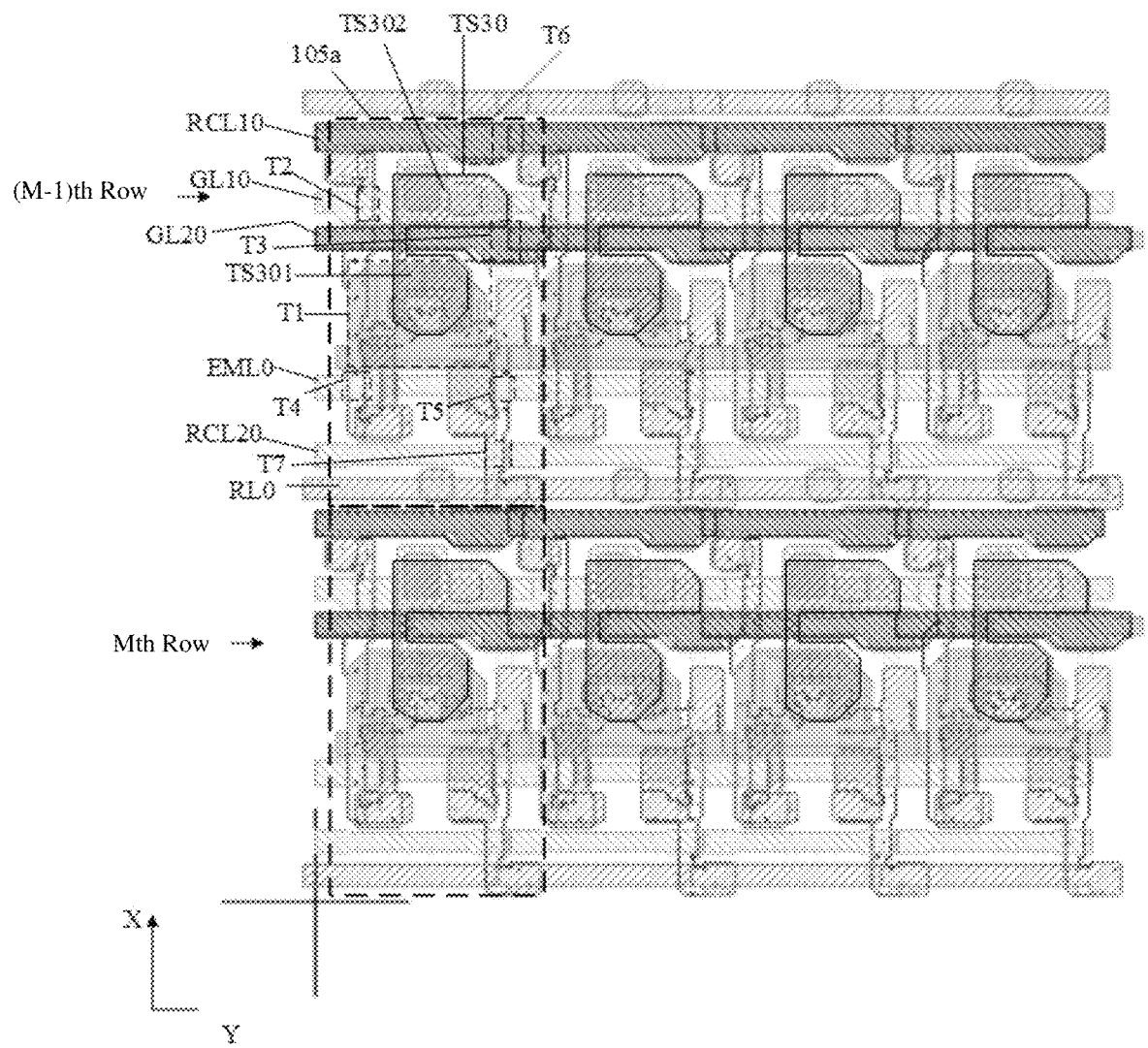
FIG. 16A is another schematic layout view of some layers of the display substrate provided by at least one embodiment of the present disclosure.
Figure 16B:
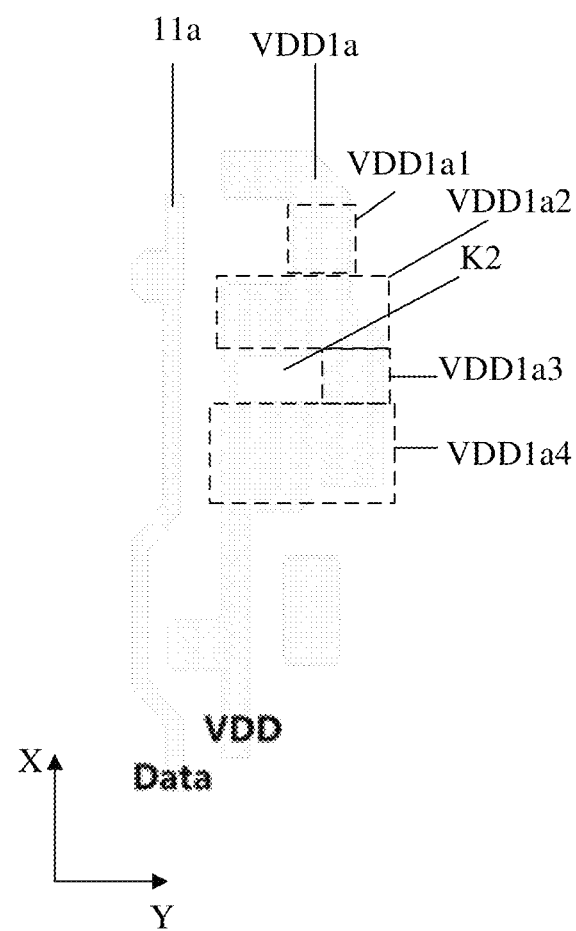
FIG. 16B is another schematic layout view of a metal layer of the display substrate provided by at least one embodiment of the present disclosure.
Figure 16C:
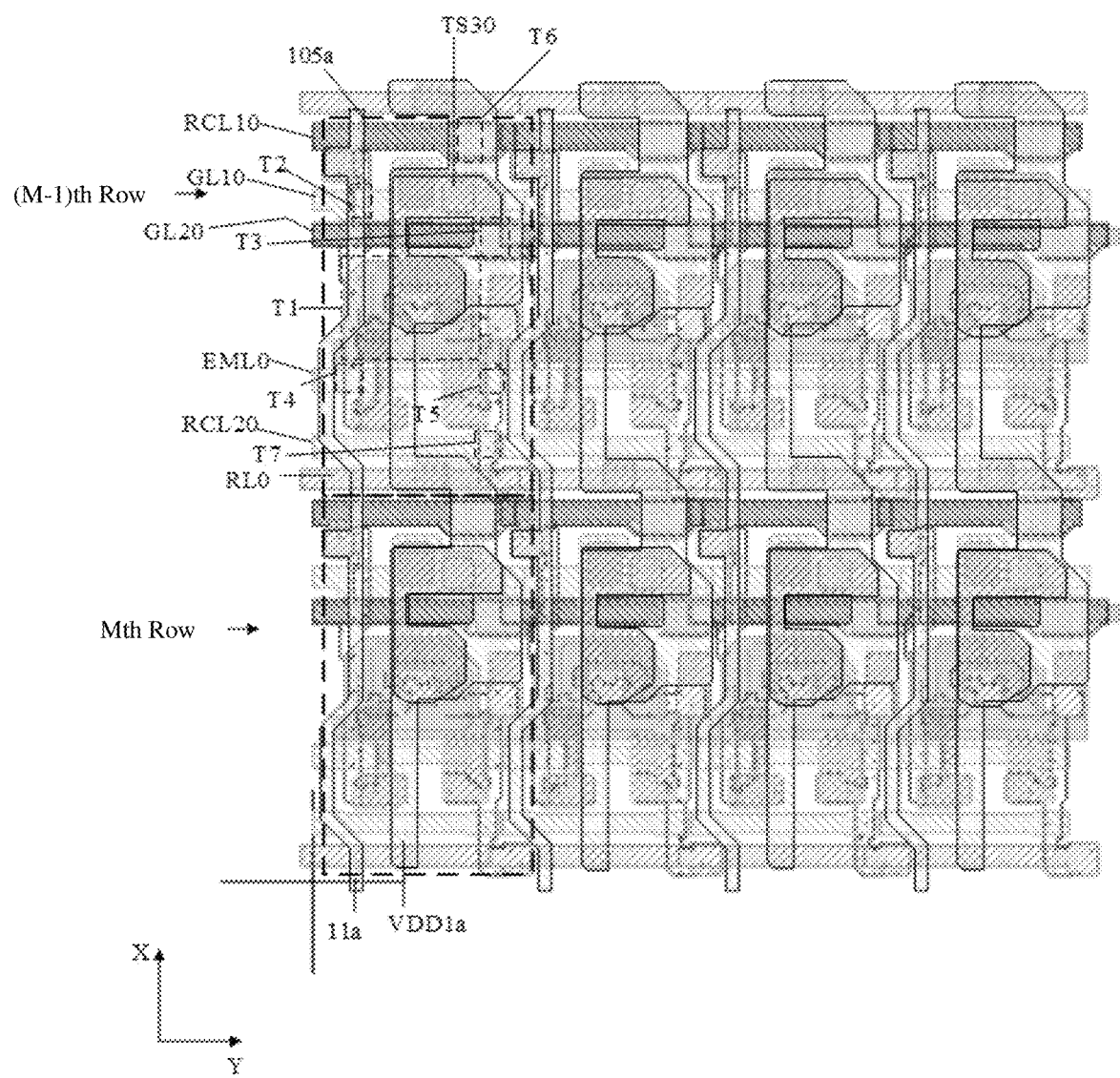
FIG. 16C is another schematic layout view of some layers of the display substrate provided by at least one embodiment of the present disclosure.

FIG. 16A is another schematic layout view of some layers of the display substrate provided by at least one embodiment of the present disclosure. FIG. 16B is another schematic layout view of one metal layer of the display substrate provided by at least one embodiment of the present disclosure. FIG. 16C is another schematic layout view of some layers of the display substrate provided by at least one embodiment of the present disclosure.

For example, in some embodiments, as illustrated in FIG. 16A, the sub-pixel of the display substrate includes a pixel driving circuit 105a. For example, the pixel driving circuit 105a is taken as an example of a 7T1C pixel driving circuit for description. For example, the circuit principle of the pixel driving circuit 105a is referred to FIG. 3A and FIG. 3B and is not described in detail here. The difference between the pixel driving circuit 105a and the pixel driving circuit 105 illustrated in FIG. 2 is that the pixel driving circuits 105a in each row are connected to one reset signal line. For example, the reset signal line RL0 in the middle position in FIG. 16A is connected to the seventh transistors T7 of the pixel driving circuits 105a in the (M−1)th row and the sixth transistors T6 of the pixel driving circuits 105a in the (M)th row. For example, the pixel driving circuit 105 further includes a first reset control signal line RCL10, a second reset control signal line RCL20, a first scanning signal line GL10, a second scanning signal line GL20, and an light-emitting control signal line EML0. In addition, for the detailed wiring structure of the pixel driving circuit 105a, reference may be made to the wiring structure of the pixel driving circuit 105, which will not be described in detail here.

For example, as illustrated in FIG. 16B, a first power supply voltage line VDD1a and a data line 11a electrically connected to the pixel driving circuit 105a have different structures from the first power supply voltage line VDD1 and the data line 11 illustrated in FIG. 14A. The first power supply voltage line VDD1a includes a first portion VDD1a1, a second portion VDD1a2, a third portion VDD1a3, and a fourth portion VDD1a4.

For example, as illustrated in FIG. 16B and FIG. 16C, the first portion VDD1a1 extends along the second direction X, and the orthographic projection of the first portion VDD1a1 on the base substrate 10 overlaps with the sixth transistor T6 (e.g., the gate electrode), so that the sixth transistor T6 is shielded to prevent leakage current of the sixth transistor T6. The width of the second portion VDD1a2 along the first direction Y is greater than the width of the first portion VDD1a1 along the first direction Y. The orthographic projection of the second portion VDD1a2 on the base substrate 10 at least overlaps with the orthographic projections of the third connection electrode TS3, the first scanning signal line GL10, the second electrode of the sixth transistor T6 and the first electrode of the second transistor T2 (a portion of the second semiconductor layer PL2) on the base substrate 10 to form an auxiliary capacitor, thereby preventing the electrical signal transmitted on the first scanning signal line GL10 from jumping. The third portion VDD1a3 crosses the second scanning signal line GL20, that is, the third portion VDD1a3 intersects and overlaps with the second scanning signal line GL20. The width of the third portion VDD1a3 along the first direction Y is smaller than the width of the second portion VDD1a2 along the first direction Y. The first power supply voltage line VDD1a has an opening K2, and the orthographic projection of the opening K2 on the base substrate 10 partially overlaps with the second scanning signal line GL20, that is, the opening K2 exposes the second scanning signal line GL20. The width of the fourth portion VDD1a4 along the first direction Y is greater than the width of the third portion VDD1a3 along the first direction Y. The orthographic projection of the fourth portion VDD1a4 on the base substrate 10 partially overlaps with the second electrode plate of the storage capacitor to form an auxiliary capacitor, thereby reducing the jumping of electrical signals and improving the display effect of the display substrate.

For example, as illustrated in FIG. 16B and FIG. 16C, the data line 11a is routed along the second direction X, and the data line 11a is bent at a portion close to the fourth transistor T4 to reduce the wiring space.

FIG. 16B illustrates another wiring manner of the first power supply voltage line, in which the first portion VDD1a1, the second portion VDD1a2, the third portion VDD1a3, and the fourth portion VDD1a4 of the first power supply voltage line VDD1a form a bent line. The embodiments of the present disclosure are not limited to a specific bending manner or wiring manner of the first power supply voltage line.

Figure 17:
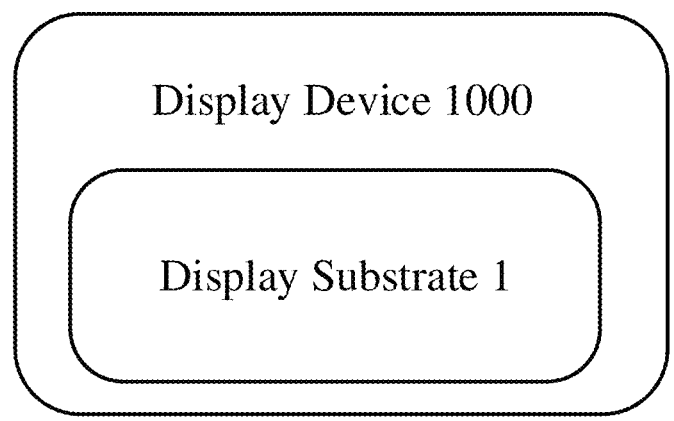
FIG. 17 is a schematic view of a display device provided by at least one embodiment of the present disclosure.

At least one embodiment of the present disclosure further provides a display device. FIG. 17 is a schematic view of the display device provided by at least one embodiment of the present disclosure. As illustrated in FIG. 17, the display device 1000 includes the display substrate 1 provided by any embodiment of the present disclosure, for example, the display substrate 1 illustrated in FIG. 2.

It should be noted that the display device 1000 may be any product or component with display function, such as an OLED panel, an OLED TV, a QLED panel, a QLED TV, a mobile phone, a tablet computer, a notebook computer, a digital photo frame, and a navigator. The display device 1000 may further include other components, such as a data driving circuit, a timing controller, etc., which are not limited in the embodiments of the present disclosure.

It should be noted that, for the sake of clarity and conciseness, the embodiments of the present disclosure do not provide all the constituent units of the display device. In order to realize the basic functions of the display device, those skilled in the art can provide or set other structures not illustrated according to specific needs, which are not limited by the embodiments of the present disclosure.

Regarding the technical effects of the display device 1000 provided by the embodiments described above, reference may be made to the technical effects of the display substrate 1 provided in the embodiments of the present disclosure, which will not be repeated here.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined to obtain new embodiments.

What have been described above are only specific implementations of the present disclosure, the protection scope of the present disclosure is not limited thereto. Any modifications or substitutions easily occur to those skilled in the art within the technical scope of the present disclosure should be within the protection scope of the present disclosure. Therefore, the protection scope of the present disclosure should be based on the protection scope of the claims.

What is claimed is:

1. A display substrate, comprising:
a base substrate, comprising a display region, wherein the display region comprises a plurality of sub-pixels arranged in array, each of the plurality of sub-pixels comprises a pixel driving circuit and a light-emitting element, and the pixel driving circuit is configured to drive the light-emitting element to emit light; and
a plurality of reset signal lines extending in a first direction, wherein the plurality of reset signal lines comprise a plurality of first reset signal lines for providing a first reset signal and a plurality of second reset signal lines for providing a second reset signal, and one of the plurality of first reset signal lines and one of the plurality of second reset signal lines are respectively connected to pixel driving circuits of a plurality of sub-pixels located in a same row, wherein
a layer where the plurality of first reset signal lines are located is different from layers where the plurality of second reset signal lines are located,
the plurality of sub-pixels are arranged in N rows;
one of the plurality of second reset signal lines is electrically connected to pixel driving circuits of sub-pixels in an (M−1)th row, and one of the plurality of first reset signal lines is electrically connected to pixel driving circuits of sub-pixels in an (M)th row; and
an orthographic projection of a second reset signal line, that is electrically connected to the pixel driving circuits of the sub-pixels in the (M−1)th row, on the base substrate at least partially overlaps with an orthographic projection of a first reset signal line, that is electrically connected to the pixel driving circuits of the sub-pixels in the (M)th row, on the base substrate, wherein 1<M≤N, and M and N are positive integers greater than or equal to 2.

2. The display substrate according to claim 1, wherein in a region where one sub-pixel of the sub-pixels in the (M−1)th row is located, an area of an overlapping region of the orthographic projection of the second reset signal line, that is electrically connected to the pixel driving circuits of the sub-pixels in the (M−1)th row, on the base substrate and the orthographic projection of the first reset signal line, that is electrically connected to the pixel driving circuits of the sub-pixels in the (M)th row, on the base substrate is greater than 50% of an area of the orthographic projection of the second reset signal line on the base substrate, or greater than 50% of an area of the orthographic projection of the first reset signal line on the base substrate.

3. The display substrate according to claim 1, further comprising a plurality of first power supply voltage lines, wherein
- each of the plurality of first power supply voltage lines extends in a second direction different from the first direction, and is electrically connected to pixel driving circuits of a plurality of sub-pixels in a same column and provides a first power supply voltage;
- along the second direction, the first power supply voltage line comprises a bent portion between orthographic projections of two adjacent first reset signal lines on the base substrate; and
- a partial line segment of the first power supply voltage line is routed along the first direction, and a line width of the partial line segment is smaller than a line width of at least a portion of the first power supply voltage line that is routed along the second direction.

4. The display substrate according to claim 3, wherein
- the pixel driving circuit comprises a driving sub-circuit, a data writing sub-circuit, a storage sub-circuit, a first reset sub-circuit and a second reset sub-circuit;
- the driving sub-circuit is electrically connected to a first node, a second node and a third node, and is configured to be controlled in response to a level of the first node;
- the data writing sub-circuit is electrically connected to the second node, and is configured to receive a first scanning signal, and write a data signal into the driving sub-circuit in response to the first scanning signal;
- the storage sub-circuit is electrically connected to the first node, and is configured to store the data signal;
- the first reset sub-circuit is electrically connected to the first node, and is configured to apply a first reset voltage to the first node in response to a first reset control signal;
- the second reset sub-circuit is electrically connected to a fourth node, and is configured to apply a second reset voltage to the fourth node in response to a second reset control signal; and
- the driving sub-circuit comprises a first transistor, and the data writing sub-circuit comprises a second transistor.

5. The display substrate according to claim 4, wherein
- the pixel driving circuit further comprises a compensation sub-circuit, a first light-emitting control sub-circuit, and a second light-emitting control sub-circuit;
- the compensation sub-circuit is electrically connected to the first node and the third node, and is configured to receive a second scanning signal, and perform threshold compensation on the driving sub-circuit in response to the second scanning signal;
- the first light-emitting control sub-circuit is electrically connected to the second node, and is configured to apply the first power supply voltage to the driving sub-circuit in response to a light-emitting control signal;
- the second light-emitting control sub-circuit is electrically connected to the third node and the fourth node, and is configured to enable a driving signal to be applied to the light-emitting element in response to the light-emitting control signal; and
- the compensation sub-circuit comprises a third transistor, the storage sub-circuit comprises a storage capacitor, the first light-emitting control sub-circuit comprises a fourth transistor, the second light-emitting control sub-circuit comprises a fifth transistor, the first reset sub-circuit comprises a sixth transistor, and the second reset sub-circuit comprises a seventh transistor.

6. The display substrate according to claim 5, further comprising a first semiconductor layer, a first insulating layer, a first metal layer, a second insulating layer and a second metal layer on the base substrate, wherein
- the first insulating layer is located between the first semiconductor layer and the first metal layer, and the second insulating layer is located between the first metal layer and the second metal layer; and
- the first semiconductor layer comprises active layers of the first transistor, the second transistor, the fourth transistor, the fifth transistor, and the seventh transistor, and the first metal layer comprises gate electrodes of the first transistor, the second transistor, the fourth transistor, the fifth transistor, and the seventh transistor.

7. The display substrate according to claim 6, further comprising a third insulating layer and a third metal layer, wherein
- the third insulating layer is located between the third metal layer and the second metal layer;
- a first electrode plate and a second electrode plate of the storage capacitor are respectively located in at least two of the first metal layer, the second metal layer and the third metal layer;
- the first reset signal line is located in the second metal layer and the second reset signal line is located in the third metal layer; or, the first reset signal line is located in the first metal layer and the second reset signal line is located in the third metal layer; or, the first reset signal line is located in the first metal layer and the second reset signal line is located in the second metal layer; and
- the display substrate further comprises a fourth insulating layer and a fourth metal layer, the fourth insulating layer is located between the third metal layer and the fourth metal layer, and the first power supply voltage line is located in the fourth metal layer.

8. The display substrate according to claim 7, further comprising a second semiconductor layer and a fifth insulating layer, wherein
- the second semiconductor layer is located between the third insulating layer and the third metal layer, and the fifth insulating layer is located between the second semiconductor layer and the third metal layer;
- the first metal layer comprises the first electrode plate of the storage capacitor, the second metal layer comprises the second electrode plate of the storage capacitor, a first gate electrode of the third transistor, and a first gate electrode of the sixth transistor, the second semiconductor layer comprises active layers of the third transistor and the sixth transistor, and the third metal layer comprises a second gate electrode of the third transistor and a second gate electrode of the sixth transistor;
- an orthographic projection of the first gate electrode of the third transistor on the base substrate at least partially overlaps with an orthographic projection of the second gate electrode of the third transistor on the base substrate; and
- an orthographic projection of the first gate electrode of the sixth transistor on the base substrate at least partially overlaps with an orthographic projection of the second gate electrode of the sixth transistor on the base substrate.

9. The display substrate according to claim 8, wherein
- the bent portion of the first power supply voltage line comprises a first portion and a second portion respectively extending along the second direction, and a third portion extending along the first direction, the third portion connects the first portion and the second portion;

an orthographic projection of the first portion on the base substrate overlaps with orthographic projections of the first gate electrode of the third transistor, the second gate electrode of the third transistor, the first gate electrode of the sixth transistor and the second gate electrode of the sixth transistor on the base substrate; and the second portion is electrically connected to a first electrode of the fourth transistor.

10. The display substrate according to claim 9, wherein the orthographic projection of the first portion on the base substrate and the orthographic projection of the first gate electrode of the third transistor on the base substrate comprise a first overlapping region, and the orthographic projection of the first portion on the base substrate and the orthographic projection of the first gate electrode of the sixth transistor on the base substrate comprise a second overlapping region;

a centerline of the first overlapping region extending along the second direction does not coincide with a centerline of the second overlapping region extending along the second direction; and a line width of the first portion is larger than both a line width of the second portion and a line width of the third portion.

11. The display substrate according to claim 9, further comprising a plurality of data lines extending along the second direction, wherein each of the plurality of data lines is electrically connected to pixel driving circuits of a plurality of sub-pixels located in a same column, and is configured to provide a data signal; and a distance between the orthographic projection of the first portion on the base substrate and an orthographic projection of one of the plurality of data lines on the base substrate along the first direction is greater than a distance between an orthographic projection of the second portion on the base substrate and the orthographic projection of the one of the plurality of data lines on the base substrate along the first direction.

12. The display substrate according to claim 11, further comprising a fifth metal layer and a sixth insulating layer, wherein the fifth metal layer is located between the fourth metal layer and the third metal layer, the sixth insulating layer is located between the fourth metal layer and the fifth metal layer;

the pixel driving circuit further comprises a first connection electrode located in the fifth metal layer;

the first connection electrode connects the first reset signal line electrically connected to the pixel driving circuits of the sub-pixels in the (M)th row to the pixel driving circuits of the sub-pixels in the (M)th row;

at least a portion of the first connection electrode extends along the first direction;

a first end of the first connection electrode is connected to the first reset signal line through a via hole penetrating the third insulating layer, the fourth insulating layer and the fifth insulating layer; and a second end of the first connection electrode is connected to a first electrode of the sixth transistor of the pixel driving circuit of the sub-pixel in the (M)th row through a via hole penetrating the fourth insulating layer and the fifth insulating layer.

13. The display substrate according to claim 12, wherein the pixel driving circuit further comprises a second connection electrode located in the fifth metal layer;

a first end of the second connection electrode is connected to the second reset signal line through a via hole penetrating the fourth insulating layer, and a second end of the second connection electrode is connected to a first electrode of the seventh transistor of the pixel driving circuit of the sub-pixel in the (M−1)th row through a via hole penetrating the first insulation layer, the second insulating layer, the third insulating layer, the fourth insulating layer and the fifth insulating layer.

14. The display substrate according to claim 12, further comprising a first reset control signal line extending along the first direction, wherein the first reset control signal line is configured to provide the first reset control signal to pixel driving circuits of a plurality of sub-pixels in a row corresponding to the first reset control signal line;

the first reset control signal line comprises a first sub-line located in the second metal layer and a second sub-line located in the third metal layer, and an orthographic projection of the first sub-line on the base substrate at least partially overlaps with an orthographic projection of the second sub-line on the base substrate;

the display substrate further comprises a second reset control signal line located in the first metal layer;

the second reset control signal line extends along the first direction, and is configured to provide the second reset control signal to pixel driving circuits of a plurality of sub-pixels in a row corresponding to the second reset control signal line; and a portion of the second reset control signal line overlapping with the first semiconductor layer in a direction perpendicular to the base substrate serves as a gate electrode of the seventh transistor.

15. The display substrate according to claim 14, further comprising a plurality of first scanning signal lines located in the first metal layer, wherein each of the plurality of first scanning signal lines extends along the first direction, and is configured to provide the first scanning signal to pixel driving circuits of a plurality of sub-pixels in a row corresponding thereto; and a portion of the first scanning signal line overlapping with the first semiconductor layer in a direction perpendicular to the base substrate serves as a gate electrode of the second transistor.

16. The display substrate according to claim 14, wherein in the region where one sub-pixel of the sub-pixels in the (M−1)th row is located, an area of an overlapping region of the orthographic projection of the second reset signal line, that is electrically connected to the pixel driving circuits of the sub-pixels in the (M−1)th row, on the base substrate and an orthographic projection of the second reset control signal line, that is electrically connected to the pixel driving circuits of the sub-pixels in the (M−1)th row, on the base substrate is less than 50% of an area of the orthographic projection of the second reset signal line on the base substrate; or in the region where one sub-pixel of the sub-pixels in the (M−1)th row is located, an area of an overlapping region of the orthographic projection of the first reset signal line, that is electrically connected to the pixel driving circuits of the sub-pixels in the (M)th row, on the base substrate and the orthographic projection of the second reset control signal line, that is electrically connected to the pixel driving circuits of the sub-pixels in the (M−1)th row, on the base substrate is less than 50% of an area of the orthographic projection of the first reset signal line on the base substrate.

17. The display substrate according to claim 15, further comprising a plurality of second scanning signal lines, wherein each of the plurality of second scanning signal lines extends along the first direction, and is configured to provide the second scanning signal to pixel driving circuits of a plurality of sub-pixels in a row corresponding thereto;

along the second direction, in each of the pixel driving circuits, an orthographic projection of one of the plurality of second scanning signal lines on the base substrate is located between an orthographic projection of the storage capacitor on the base substrate and an orthographic projection of one of the plurality of first scanning signal lines on the base substrate;

the display substrate further comprises a first convex portion located in the first metal layer and a first electrode portion located in the second metal layer, the first convex portion is connected to the first scanning signal line, the first convex portion and the first scanning signal line are integral with each other;

an orthographic projection of the first electrode portion on the base substrate is located between the data line and the first power supply voltage line along the first direction, and is located between the first reset control signal line and the second scanning signal line along the second direction; and the orthographic projection of the first electrode portion on the base substrate at least partially overlaps with an orthographic projection of the first convex portion and/or an orthographic projection of the first scanning signal line on the base substrate.

18. The display substrate according to claim 17, wherein the pixel driving circuit further comprises a third connection electrode located in the fifth metal layer; and an orthographic projection of the third connection electrode on the base substrate partially overlaps with orthographic projections of the first scanning signal line, the second scanning signal line and the second semiconductor layer on the base substrate.

19. The display substrate according to claim 12, wherein the first metal layer further comprises a plurality of light-emitting control lines extending along the first direction, each of the plurality of light-emitting control lines is configured to provide the light-emitting control signal to pixel driving circuits of a plurality of sub-pixels in a row corresponding thereto; and a portion of one of the plurality of light-emitting control lines overlapping with the first semiconductor layer in a direction perpendicular to the base substrate serves as a gate electrode of the fourth transistor and a gate electrode of the fifth transistor.

* * * * *